(12) United States Patent
Haruhana et al.

(10) Patent No.: US 6,861,878 B2
(45) Date of Patent: Mar. 1, 2005

(54) CHOPPER COMPARATOR

(75) Inventors: Hideyo Haruhana, Tokyo (JP); Yutaka Uneme, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/446,942

(22) Filed: May 29, 2003

(65) Prior Publication Data

US 2004/0080346 A1 Apr. 29, 2004

(30) Foreign Application Priority Data

Oct. 29, 2002 (JP) ........................................ 2002-314755

(51) Int. Cl.$^7$ ............................................... H03L 7/06
(52) U.S. Cl. ........................... 327/77; 327/88; 341/156; 341/159
(58) Field of Search ............................. 327/77, 78, 79, 327/81, 88; 341/156, 159

(56) References Cited

U.S. PATENT DOCUMENTS

| 5,835,045 | A | * | 11/1998 | Ogawa et al. | ............... | 341/155 |
| 5,952,951 | A | * | 9/1999 | Fujino | ........................ | 341/159 |
| 6,271,691 | B1 | | 8/2001 | Toyoda et al. | ................ | 327/77 |
| 6,480,134 | B1 | * | 11/2002 | Sasaki | ........................ | 341/159 |
| 2002/0041249 | A1 | * | 4/2002 | Ueno | | |

FOREIGN PATENT DOCUMENTS

| DE | 3604740 C2 | 9/1986 |
| JP | 4-014312 | 1/1992 |
| JP | 8-046495 | 2/1996 |

* cited by examiner

Primary Examiner—Tuan T. Lam
(74) Attorney, Agent, or Firm—Leydig, Voit & Mayer, Ltd.

(57) ABSTRACT

A chopper comparator has inverters in input and output stages including NMOS transistors to control connection and disconnection of an inverter circuit of each inverter. During a non-operation period of the chopper comparator, parts of the inverters are disconnected form the ground based on a signal supplied to gates of the NMOS transistors.

10 Claims, 36 Drawing Sheets

CHOPPER COMPARATOR

BACKGROUND OF THE INVENTION

1. Field of the Invention

The present invention relates to a chopper comparator made up of a plurality of logic gates for comparing an input voltage with a reference voltage and for outputting a comparison result.

2. Description of the Related Art

A conventional chopper comparator is made up of a switch, a first inverter amplifier, and a second inverter amplifier. The switch switches between an analogue input voltage and a reference voltage. The first inverter amplifier is connected to the switch through a capacitor. The second inverter amplifier directly receives the output of the first inverter amplifier. Like a conventional technique, for example, disclosed in the Japanese laid open publication number H4-14312 (pages 2–3 and FIG. 1 to FIG. 6), there is a conventional chopper comparator in which a NMOS transistor or a PMOS transistor is used as the second inverter amplifier, having a gate controlled by a clock signal, and the second inverter amplifier halts its operation during a short circuit between the input node and the output node of the first inverter amplifier that occurs based on a clock signal.

Next, a description will now be given of the operation of the conventional chopper comparator.

The first inverter amplifier controls the switch based on the clock signal in order to make a short circuit between the input node and the output node of the first inverter amplifier. While this switch is ON, an analogue input voltage is supplied to the capacitor connected to the input node of the first inverter amplifier. When this switch is OFF, namely, when no short circuit between the input node and the output node of the first inverter amplifier occurs, the capacitor maintains a voltage difference between the analogue input voltage and the threshold voltage of the first inverter amplifier.

Next, the reference voltage is applied to the capacitor, and the first inverter amplifier compares the analogue input voltage inputted through the capacitor with the reference voltage. The first inverter amplifier outputs a voltage according to the difference between the comparison result and the threshold voltage of the first inverter amplifier. For example, when the analogue input voltage is higher than the reference voltage, the first inverter amplifier outputs a voltage of a high level, and when the analogue input voltage is lower than the reference voltage the first inverter amplifier outputs a voltage of a low level.

In such a comparison operation, while the short circuit between the input node and the output node in the first inverter amplifier occurs, an NMOS transistor of the second inverter amplifier prevents a penetrate current from flowing through the second inverter amplifier. This NMOS transistor disconnects and connects the second inverter amplifier, in synchronization with the clock signal, to control the operation of the switch to make the short circuit between the input node and the output node of the first inverter amplifier.

In the conventional chopper amplifier having the configuration described above, because the path between the input node of the logic gate in the input stage and the capacitance becomes a floating node, where a penetrate current may flow through the logic gate in the input stage while no comparison operation between the input voltage and the reference voltage is performed. Further, the penetrate current flows through the inverter circuit in the logic gate in the output stage when the same voltage as the threshold voltage of the inverter circuit in the second inverter amplifier, namely, in the logic gate in the output stage, is applied to the input node of the logic gate in the output stage, in the no-operation condition when the inverter circuit in the logic circuit in the input stage is in the auto-zero state, or when no comparison operation between the input voltage and the reference voltage is performed. Thus, the conventional technique has a drawback that this penetrate current increases the amount of useless current consumption.

SUMMARY OF THE INVENTION

The present invention has been made to solve the above conventional drawback of the chopper comparator.

It is therefore an object of the present invention to provide a chopper comparator capable of suppressing the amount of a current consumption by preventing any penetrate current flowing through a logic gate formed in the chopper comparator while no comparison operation between an input voltage and a reference voltage is performed.

Furthermore, another object of the present invention is to provide a chopper comparator capable of efficiently suppressing the amount of a current consumption by preventing any penetrate current flowing through the inverter circuit formed in a logic circuit in an output stage while an inverter circuit formed in the input stage is in an auto-zero state.

To accomplish the above objects, according to an aspect of the present invention, there is provided a chopper comparator having one or more logic gates in input and output stages. Each logic gate in the input and output stages has an inverter circuit and a transistor for connecting and disconnecting this inverter circuit. The chopper comparator inputs an operation signal so as to control the operation of the logic gates in the input and output stages. During no-operation period, the inverter circuit in each logic gate in the input and output stages is disconnected based on the operation signal.

According to another aspect of the present invention, there is provided a chopper comparator having one or more logic gates in input and output stages. Each logic gate in the input and output stages has an inverter circuit and a transistor for connecting and disconnecting this inverter circuit. In the chopper comparator, an operation signal is supplied to the transistor in the logic gate in the input stage and a control signal is supplied to the transistor in the logic gate in the output stage. During a no-operation period of the chopper comparator, the inverter circuit in the logic gate in the input stage is disconnected based on the operation signal. Further, during an operation period of the chopper comparator and when a short circuit between the input and output sections of the logic gate in the input stage occurs by turning a switch ON in the input stage, the inverter circuit formed in the logic gate in the output stages is disconnected based on the control signal.

BRIEF DESCRIPTION OF THE DRAWINGS

Other objects, features and advantages of the present invention will become apparent from the following description taken in conjunction with the accompanying drawings, in which.

DETAILED DESCRIPTION OF THE PREFERRED EMBODIMENTS

A detailed description will be given, with reference to the accompanying drawings, of the preferred embodiments of the present invention.

First Embodiment

FIGS. 1 to 4 are diagrams showing circuit configurations of a chopper comparator according to a first embodiment of the present invention.

Figure 1:
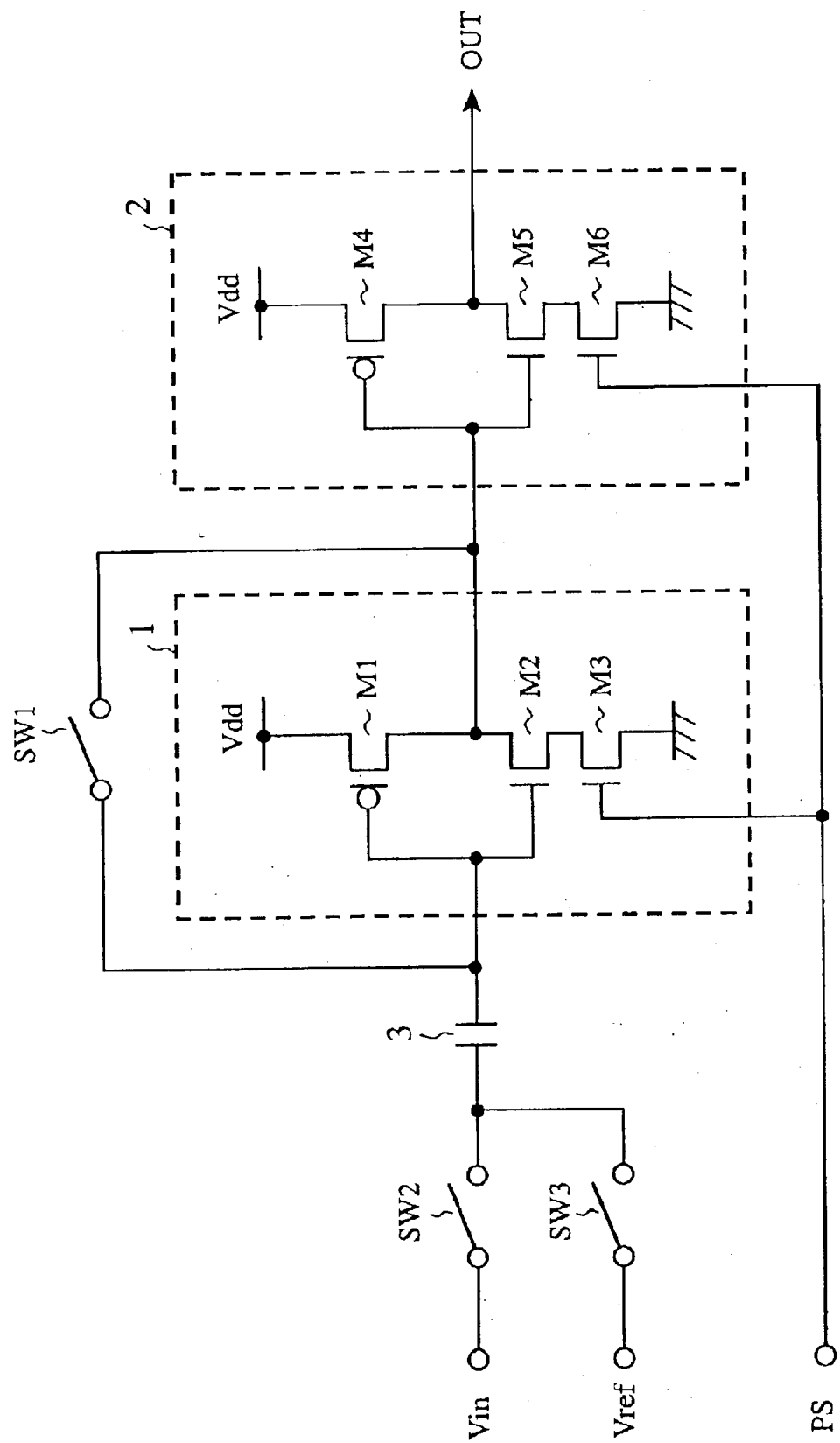
FIG. 1 is a diagram showing a circuit configuration of a chopper comparator according to a first embodiment of the present invention.
Figure 2:
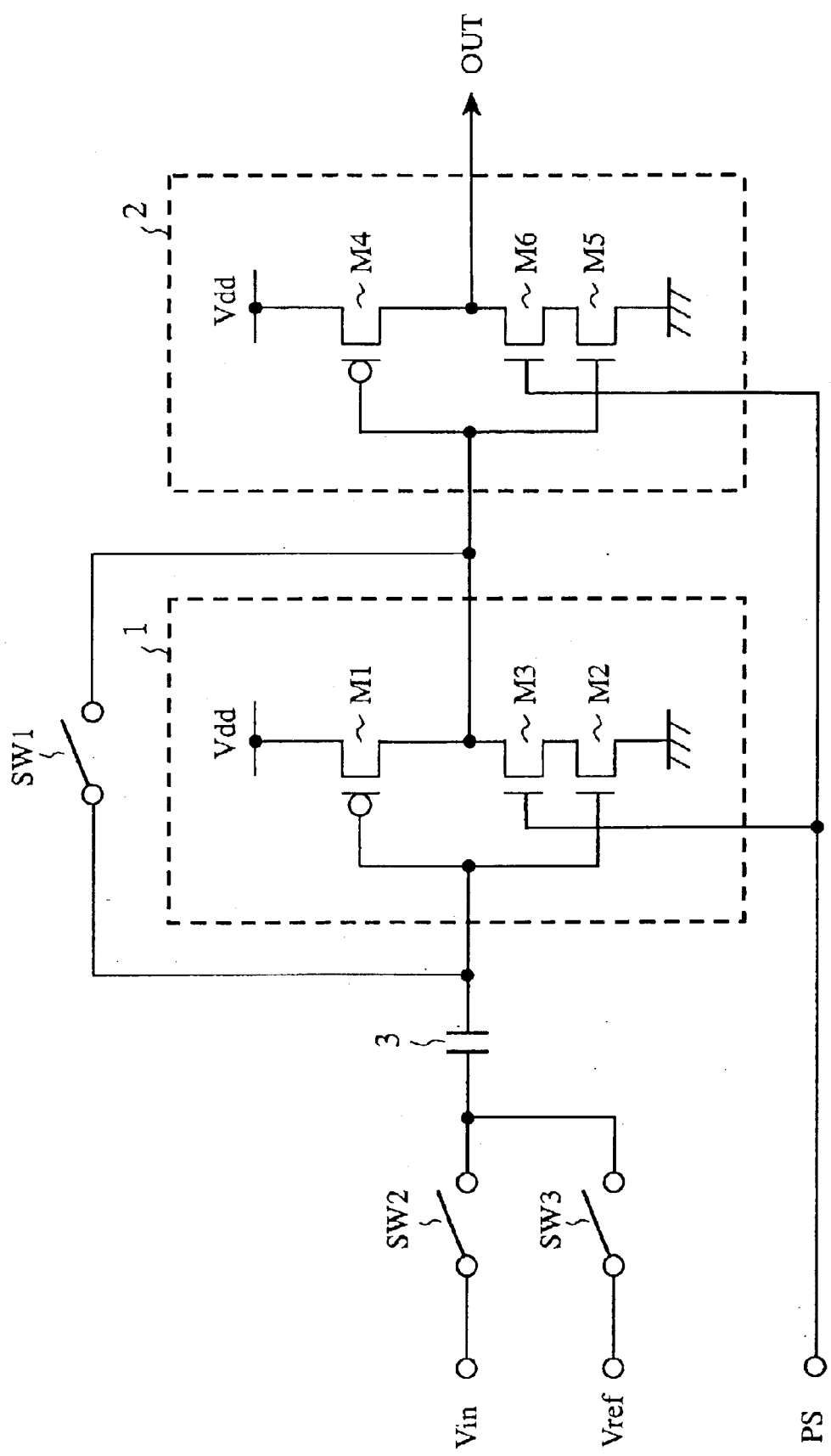
FIG. 2 is a diagram showing another circuit configuration of the chopper comparator according to the first embodiment of the present invention.

The chopper comparator shown in each of FIG. 1 and FIG. 2 has a plurality of logic gates, for example, an inverter 1 in an input stage and an inverter 2 in an output stage. The inverter 1 in the input stage has a P channel MOS (hereinafter, referred to as "PMOS") transistor M1, a N channel MOS (hereinafter, referred to as "NMOS") transistor N1, and a NMOS transistor M3 connected in series. For example, a power source voltage Vdd is supplied to the source of the PMOS transistor M1 which outputs a driving voltage of a high level. The NMOS transistor M2 outputs a voltage of a low level. The PMOS transistor M1 and the NMOS transistor M2 form an inverter circuit. The source of the NMOS transistor M3 is grounded. The source or drain of the NMOS transistor M2 is grounded by ON/OFF operation of the NMOS transistor M3.

The input section of the inverter 1 is connected to a switch SW2 and a switch SW3 through a capacitor 3. The switch SW2 controls the connection and disconnection of the input voltage Vin. The switch SW3 controls the connection and disconnection of a reference voltage Vref. The inverter 1 connected to the capacitor 3, which becomes a floating node, is also connected to a switch SW1. Through the switch SW1 a short circuit of the input section and the output section of the inverter 1 occurs. The output section of the inverter 1 is connected to the input section of the inverter 2.

The inverter 2 in the output stage has a PMOS transistor M4, a NMOS transistor M5, and a NMOS transistor M6 connected in series. The PMOS transistor M4 and the NMOS transistor M5 form an inverter circuit. The power source voltage Vdd is supplied to the source of the PMOS transistor M4. The source of the NMOS transistor M5 is grounded by ON/OFF operation of the NMOS transistor M6.

Figure 3:
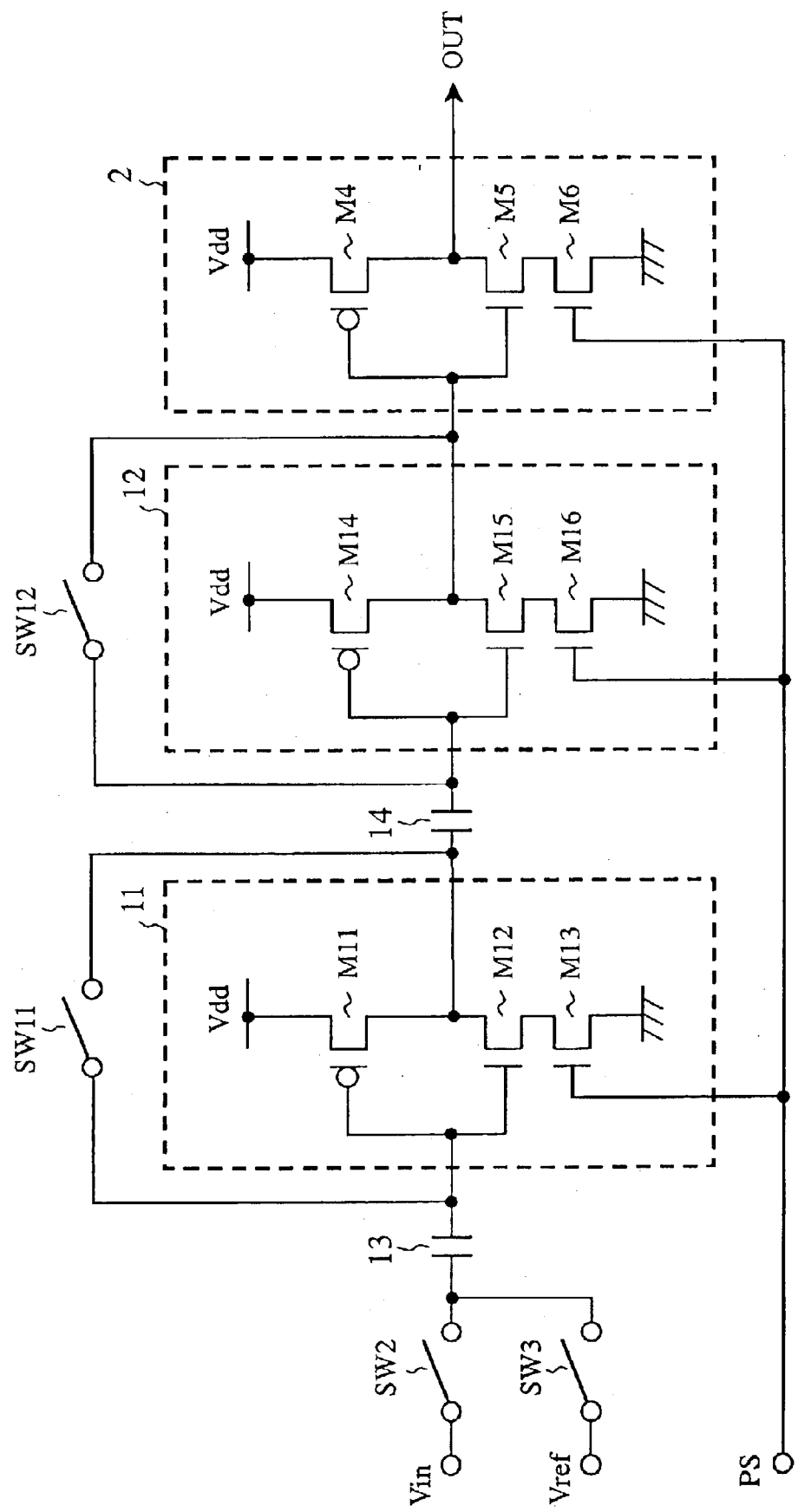
FIG. 3 is a diagram showing another circuit configuration of the chopper comparator according to the first embodiment of the present invention.
Figure 4:
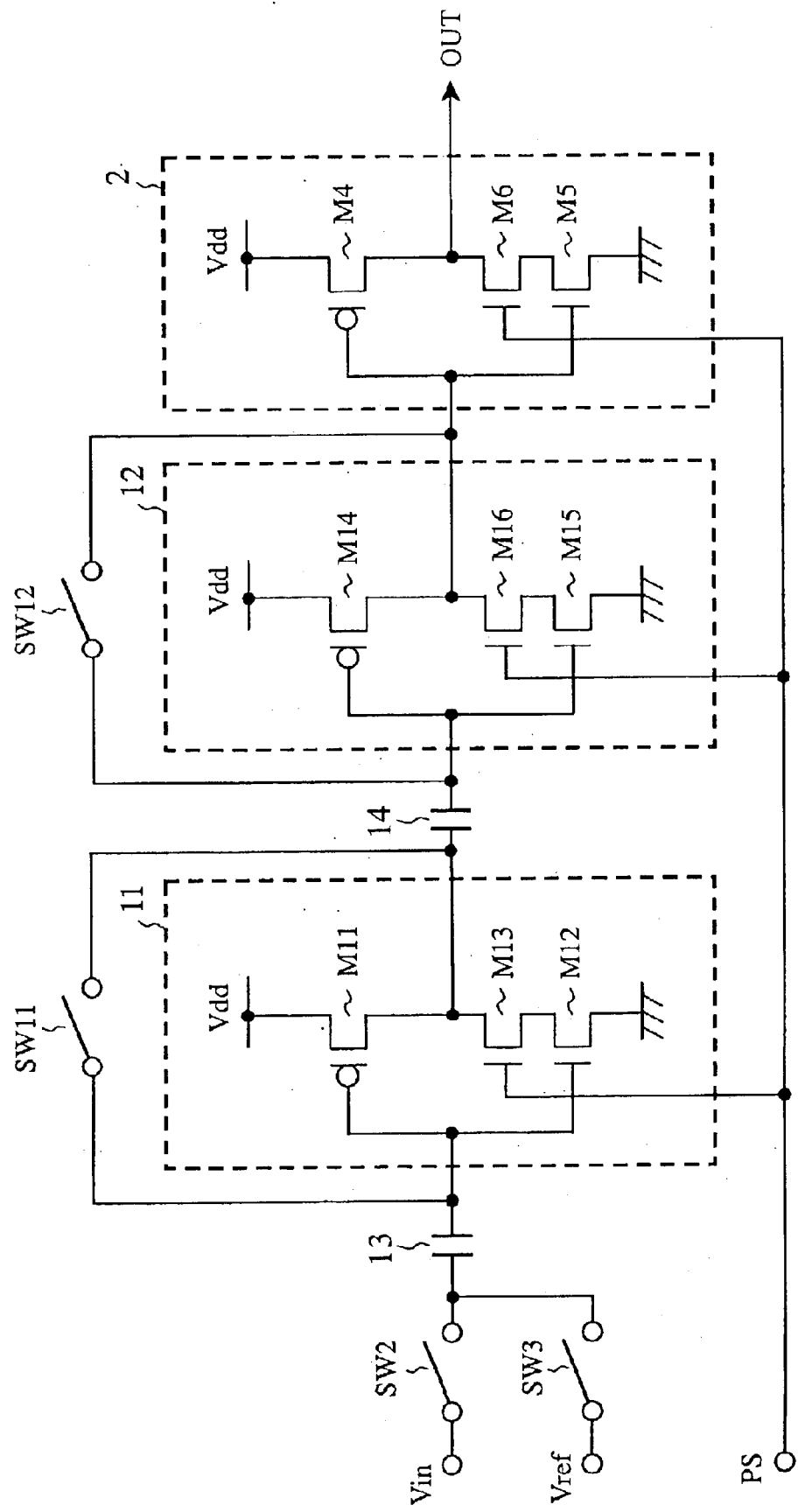
FIG. 4 is a diagram showing another circuit configuration of the chopper comparator according to the first embodiment of the present invention.

The chopper comparator of the first embodiment shown in FIG. 3 and FIG. 4 is made up of three inverters, an inverter 11 in front input stage, an inverter 12 in rear input stage, and the inverter 2 in the output stage. In FIG. 3 and FIG. 4, the inverter 11 in the front input stage has a PMOS transistor M11, a NMOS transistor M12, and a NMOS transistor M13. The power source voltage Vdd is supplied to the source of the PMOS transistor M11 which outputs a driving voltage of a high level. The NMOS transistor M12, whose source is grounded, outputs a voltage of a low level.

The PMOS transistor M11 and the NMOS transistor M12 form an inverter circuit. The source or drain of the NMOS transistor M12 is grounded by ON/OFF operation of the NMOS transistor M13.

The input section of the inverter 11 in the front input stage, like the configurations shown in FIG. 1 and FIG. 2 is connected to the switch SW2 and the switch SW3 through a capacitor 13. The switch SW2 controls the connection and disconnection of the input voltage Vin. The switch SW3 controls the connection and disconnection of the reference voltage Vref. The inverter 11 connected to the capacitor 13, which becomes a floating node, is also connected to a switch SW11. Through the switch SW11 a short circuit of the input section and the output section of the inverter 11 occurs. The output section of the inverter 11 in the front input stage is connected to the input section of the inverter 12 in the rear input stage. The output section of the inverter 11 in the front input stage is connected to the input section of the inverter 12 in the rear input stage through a capacitor 14.

The inverter 12 in the rear input stage has a PMOS transistor M14, a NMOS transistor M15, and a NMOS transistor M16 connected in series. The PMOS transistor M14 and the NMOS transistor M15 form an inverter circuit. The power source voltage Vdd is supplied to the source of the PMOS transistor M14 which outputs a voltage of a high level. The NMSO transistor M15 outputs a voltage of a low level, whose source is grounded. The NMOS transistor M15 is grounded by ON/OFF operation of the NMOS transistor M16.

Through a switch SW12, a short circuit of the input section of the inverter 12 and the output section of the NMOS transistor M16 occurs. The capacitor 14 connected to the input section of the inverter 12 becomes a floating node.

As can be understood by the explanation described above, the output section of the inverter 12 is connected to the input section of the inverter 2. The inverter 2 shown in FIG. 3 has the same configuration of that shown in FIG. 1, the explanation thereof is omitted here.

Both the inverters 1 and 2 in the input and output stages have the same size and layout and a same threshold voltage. Similarly, both the inverters 12 in the rear input stage and the inverter 2 in the output stage have the same size and layout and a same threshold voltage.

In the inverter 1 in the input stage shown in FIG. 1, the source of the NMOS transistor M2 is grounded through the NMOS transistor M3. In the inverter 2 in the output stage, the source of the NMOS transistor M5 is grounded through the NMOS transistor M6. PS signal (as an operation signal) is provided to the gate of each of the NMOS transistors M3 and M6 in order to control of the inverters 1 and 2.

In the inverter 1 in the input stage shown in FIG. 2, the NMOS transistor M3 is placed between the PMOS transistor M1 and the NMOS transistor M2. The drain of the NMOS transistor M2 is connected to the output section of the inverter 1 through the NMOS transistor M3. In the inverter 2 in the output section, the NMOS transistor M6 is placed between the PMOS transistor M4 and the NMOS transistor M5. The drain of the NMOS transistor M5 is connected to the output section of the inverter 2 through the NMOS transistor M6. The PS signal is provided to both the gates of the NMOS transistors M3 and M6 in order to control the operation of the inverters 1 and 2.

In the inverter 11 in the front input section shown in FIG. 3, the source of the NMOS transistor M12 is grounded through the NMOS transistor M13. In the inverter 12 in the rear input stage, the source of the NMOS transistor M15 is grounded through the NMOS transistor M16. The inverter 2 in the output stage shown in FIG. 3 has the same circuit configuration of that of the inverter 2 shown in FIG. 1 and has the same size and layout of that of the inverter 12 shown in FIG. 3. Accordingly, the explanation of the inverter 2 in the output stage is omitted here. The PS signal is provided to the gate of each of the NMOS transistors M13, M16, and M6 in order to control the inverters 11, 12, and 2.

In the inverter 11 in the front input section shown in FIG. 4, the NMOS transistor M13 is placed between the PMOS transistor M11 and the NMOS transistor M12, the drain of the NMOS transistor M12 is connected to the output section of the inverter 11 through the NMOS transistor M13.

In the inverter 12 in the rear input stage, the NMOS transistor M16 is placed between the PMOS transistor M14 and the NMOS transistor M15. The drain of the NMOS transistor M15 is connected to the output section of the inverter 12 through the NMOS transistor M16. The inverter 2 in the output stage shown in FIG. 4 has the same circuit configuration of that of the inverter 2 shown in FIG. 2 and has the same size and layout of that of the inverter 12 shown in FIG. 4. Accordingly, the explanation of the inverter 2 in the output stage is omitted here. The PS signal is sent to the gate of each of the NMOS transistors M13, M16, and M6 in order to control of the inverters 11, 12, and 2.

Next, a description will be given of the operation of the chopper comparator of the first embodiment.

Figure 5:
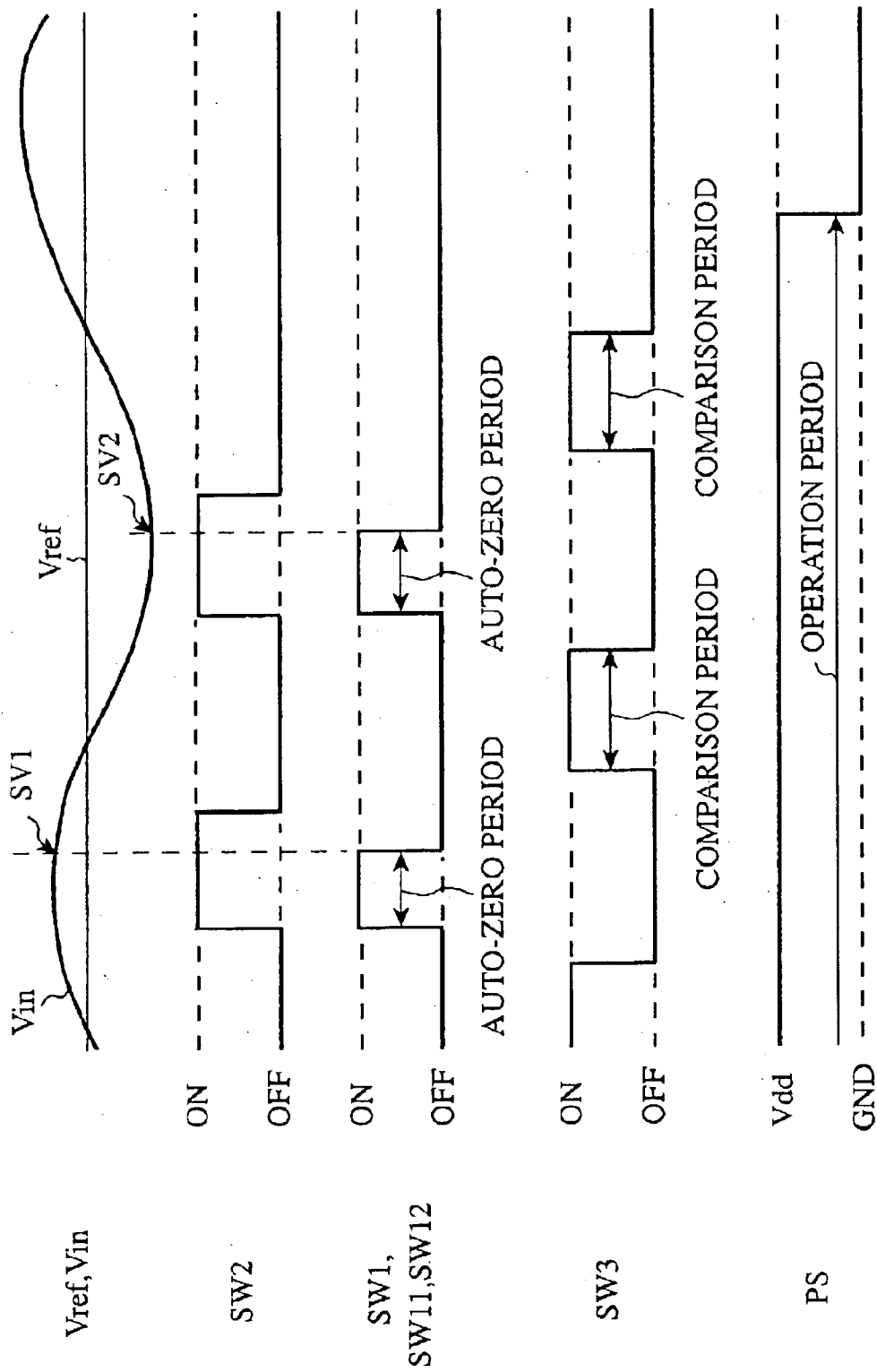
FIG. 5 is a timing chart showing the operation of the chopper comparator according to the first embodiment of the present invention.

FIG. 5 is a timing chart showing the operation of the chopper comparator of the first embodiment.

The operation of the chopper comparators shown in FIG. 1 to FIG. 4 of the first embodiment will now be explained with reference to FIG. 5. Because the chopper comparators shown in FIG. 1 and FIG. 2 perform the same operation, the operation of the chopper comparator shown in FIG. 1 will firstly be explained.

During the high level (which means the operation state) of the PS signal supplied to both the gates of the NMOS transistors M3 and M6, the NMOS transistors M3 and M6 enter ON where the source and drain thereof are electrically connected, so that the source of each of the NMOS transistors M2 and M5 is grounded and the inverter 1 in the input stage and the inverter 2 in the output stage become active.

In the case of the chopper comparator shown in FIG. 2, when the gates of the NMOS transistors M3 and M6 receive the PS signal of the high level (indicating the operation state), the source and drain thereof are electrically connected, so that the drain of the NMOS transistor M2 is electrically connected to the drain of the PMOS transistor M1, and the drain of the NMOS transistor M5 is electrically connected to the PMOS transistor M4. Thereby, both the inverters 1 and 2 shown in FIG. 2 enter the active state.

When both the switches SW1 and SW2 become ON, the input voltage Vin is supplied to the capacitance 3 and the short circuit of the input section and the output section of the inverter 1 occurs (entering the auto zero state).

The auto-zero state of the inverter 1 is maintained during the ON state of the switch SW1, namely, the auto-zero period shown in FIG. 5. In this auto-zero period, the input voltage Vin is supplied to the capacitor 3.

When the switch SW1 enters OFF during the ON state of the switch SW2 in order to stop the auto-zero state of the inverter 1, the difference between the input voltage Vin (supplied to the capacitance 3 when the switch SW1 becomes OFF) and the voltage at the input section of the inverter 1 in the auto-zero state is kept in the capacitance 3.

At the completion of the auto-zero term, the input voltage Vin supplied to the capacitance 3 is used as a sampling voltage SV1 or sampling voltage SV2. The switch SW1 enters OFF and the difference between the sampling voltage SV1 and the threshold voltage of the inverter 1 is kept in the capacitance 3, and then the switch SW2 enters OFF in order to stop the supply of the input voltage Vin, and the switch SW3 enters ON in order to supply the reference voltage Vref to the capacitance 3. The comparison period shown in FIG. 5 is initiated by this.

For example, in a case where the sampling voltage SV1 is higher than the reference voltage Vref, the voltage supplied to the electrode of the capacitance 3 connected to the switch SW3 becomes reduced and the electrode of the capacitance 3 connected to the input section of the inverter 1 is also reduced as shown in FIG. 5. The voltage, which is lower than the threshold voltage, is thereby supplied to the input section of the inverter 1. The inverter 1 outputs the voltage of the low level when the voltage, which is lower than the threshold voltage, is supplied to the gates of the PMOS transistor M1 and the NMOS transistor M2. When receiving the voltage of the low level from the inverter 1, the inverter 2 outputs the voltage of the high level.

For example, when the sampling voltage SV2 is lower than the reference voltage Vref shown in FIG. 5, because the voltage supplied to the electrode of the capacitor 3 connected to the switch SW3 becomes increased, the voltage at the electrode of the capacitor 3 connected to the input section of the inverter 1 is increased. The voltage which is higher than the threshold voltage is thereby supplied to the input section of the inverter 1. The voltage, which is higher than the threshold voltage, is supplied to the gates of the PMOS transistor M1 and the NMOS transistor M2 forming the inverter 1, the inverter 1 then outputs the voltage of the high level. When receiving the voltage of the high level, the inverter 2 outputs the voltage of the low level.

In the inverters 1 and 2, the auto-zero period and the comparison period are repeated every predetermined time interval by the switches SW1, SW2, and SW3 which enter ON/OFF during the same voltage level (hereinafter referred to as the high level) of the power source voltage Vdd, for example. The input voltage Vin at the moment of the completion of the auto-zero period is sampled and then compared with the reference voltage Vref. The chopper comparator outputs a desired voltage as the comparison result. The non-operation period other than the operation period, for example, the PS signal of the ground voltage level (hereinafter referred to as the low level) is supplied to the chopper comparator. This causes both the inverters 1 and 2 entering OFF because the source and drain of the NMOS transistors M3 and M6 is electrically disconnected. Further, in the inverter 1, no penetrate current flows from the PMOS transistor M1 to the ground through the NMOS transistors M2 and M3. Similarly, in the inverter 2, no penetrate current also flows from the PMOS transistor M4 to the ground through the NMOS transistors M5 and M6.

Because the inverters 1 and 2 shown in FIG. 1 and FIG. 2 have the same size and layout, even if the voltage is directly supplied from the inverter 1 to the inverter 2, the inverter 2 can output the voltage of the high level or the low level based on the threshold voltage with high accuracy.

Further, because the inverters 1 and 2 have the same size and layout, it is possible to control the operation of each of the inverters 1 and 2 using the same PS signal.

Next, a description will now be given of the operation of the chopper comparators shown in FIG. 3 and FIG. 4. Because the chopper comparators shown in FIG. 3 and FIG. 4 perform the same operation basically, the chopper comparator shown in FIG. 3 will be firstly explained with reference to the timing chart of FIG. 5. The inverter 11 and the capacitance 13 shown in FIG. 3 and FIG. 4 can perform the same operation and obtain the same operation and effect of the inverter 1 and the capacitor 3 shown in FIG. 1 and FIG. 2, therefore the explanation for them is omitted here. In the following description, only the feature of the chopper comparators shown in FIG. 3 and FIG. 4 will be explained.

The switch Sw2 enters ON and the switches SW11 and SW12 enter ON in order to set the auto-zero state of the inverters 11 and 12 in the front and rear input stages. In the auto-zero period shown in FIG. 5, the threshold voltage of the inverter 11 (generated at the input section thereof because the switch SW11 is ON) and the threshold voltage of the inverter 12 (generated at the output section thereof because the switch SW12 is ON) are applied to the capacitance 14. When both the switches SW11 and SW12 then enter OFF in order to stop the auto-zero state, the capacitance 13 keeps the voltage difference between the sampled voltage SV1 or the sampled voltage SV2 and the threshold voltage of the inverter 11, and the capacitance 14 keeps the voltage difference between the threshold voltage of the inverter 11 and the threshold voltage of the inverter 12.

When the switch SW2 enters OFF and the switch SW3 enters ON, the reference voltage Vref is applied to the capacitor 13, the inverter 11 outputs the voltage of the high level or the low level. When the inverter 11 outputs the voltage of the high level, the voltage, which is higher than the threshold voltage of the inverter 12, is supplied to the input section of the inverter 12 through the capacitor 14. When the inverter 11 outputs the voltage of the low level, the voltage, which is lower than the threshold voltage of the inverter 12, is supplied to the input section of the inverter 12 through the capacitor 14.

When receiving the voltage which is higher than the threshold voltage of the inverter 12, the inverter 12 outputs the voltage of the low level. On the contrary, when receiving the voltage which is lower than the threshold voltage thereof, the inverter 12 outputs the voltage of the high level.

As previously described, the inverter 2 in the output stage, which is formed with a same size and layout of the inverter 12 in the rear input stage, inputs the voltage directly supplied from the inverter 12. Because both the inverter 12 and the inverter 2 have the same threshold voltage, the inverter 2 reverse the voltage of the high level or the low level supplied from the inverter 12, and then outputs the reversed one.

In the chopper comparators shown in FIG. 3 and FIG. 4, during the high level of the PS signal indicating the operation period, the path between the source and drain of each of the NMOS transistors M13, M16, and M6 enters a conductive state, so that the inverters 11, 12, and 2 become active. The PS signal becomes the low level, the path between the source and drain of each of the NMOS transistors M13, M16, and M6 enters a nonconductive state, so that the inverters 11, 12, and 2 enters the inactive state. Further, in the inverter 11 no penetrate current flows from the PMOS transistor M11 to the ground through the NMOS transistors M12 and M13. In the inverter 12 no penetrate current flows from the PMOS transistor M14, to which the power source voltage Vdd is supplied, to the ground through the NMOS transistors M15 and M16.

Similar to the operation of the inverter 2 shown in FIG. 1, when receiving the PS signal of the high level or the low level, the inverter 2 shown in FIG. 3 and FIG. 4 enters the active state or inactive state and no penetrate current flows from the PMOS transistor, to which the power source voltage Vdd is supplied, to the ground through the NMOS transistors M5 and M6.

It is possible to obtain the same effect of the above configuration if the chopper comparator having the following configuration. For example, the input section of each of the inverter 11 and 12 is grounded through the NMOS transistor and the PS signal of the low level is supplied to this NMOS transistor during the operation period, and the PS signal of the high level is supplied to the gate of this NMOS transistor during the non-operation period other than the operation period. Moreover, the following configuration is also acceptable. The power source voltage Vdd is supplied to the input section of the inverter 1 or the inverters 11 and 12, and during the operation period the PS signal of the high level is supplied to the gate of the PMOS transistor, the PS signal of the low level is supplied to the gate of this PMOS transistor during the non-operation period other than the operation period. This configuration can obtain the same effect. On the contrary, the chopper comparators having the configurations shown in FIG. 1 to FIG. 4 can increase the comparison accuracy because the increasing of the amount of a parasitic capacitance generated at the input section of each of the inverters 1, 11, and 12 can be suppressed.

In addition, because the NMOS transistors of a relatively large driving power are connected in series in each chopper comparator shown in FIG. 1 to FIG. 4, it is possible to increase a response speed. In particular, when the layout of the transistors in the chopper comparators shown in FIG. 1 to FIG. 3 is adjusted properly, it is possible to obtain the minimum delay value of the input/output operation occurred at the inverters 1 and 2, or the inverters 11, 12, and 2. This configuration is suitable for a higher response application.

As described above, according to the first embodiment, all of the inverter circuits forming the chopper comparator is controlled using the PS signal and all of the inverter circuits become OFF in the non-operation period other than the operation period, it is possible to suppress the current consumption of the chopper comparator by preventing any penetrate current flowing through the inverter circuits when the voltage, which is the same of the threshold voltage, is supplied to the input section of the inverter.

In addition, in the first embodiment, no penetrate current flows through the inverter 1 and inverter 2 directly connected to the inverter 1 shown in FIG. 1 and FIG. 2, or through the inverter 12 and inverter 2 directly connected to the inverter 12 shown in FIG. 3 and FIG. 4 during the non-operation period other than the operation period controlled by the PS signal. The inverters 1 and 2 in the input and output stages or the inverters 12 and 2 in the rear input stage and the output stage have the same size and layout, so that the occurrence of the penetrate current can be prevented during the non-operation period other than the operation period even if the threshold voltages of those inverters are set to the same value. This embodiment has the effect that it is thereby possible to suppress the current consumption while increasing the comparison accuracy of the input voltage Vin and the reference voltage Vref supplied to the chopper comparator.

Second Embodiment

FIG. 6 to FIG. 9 are diagrams showing circuit configurations of a chopper comparator according to a second embodiment of the present invention. In the second embodiment, the same components used in the first embodiment shown FIG. 1 to FIG. 4 will be referred to with the same reference numbers, and the explanation of the same components is omitted here.

Figure 6:
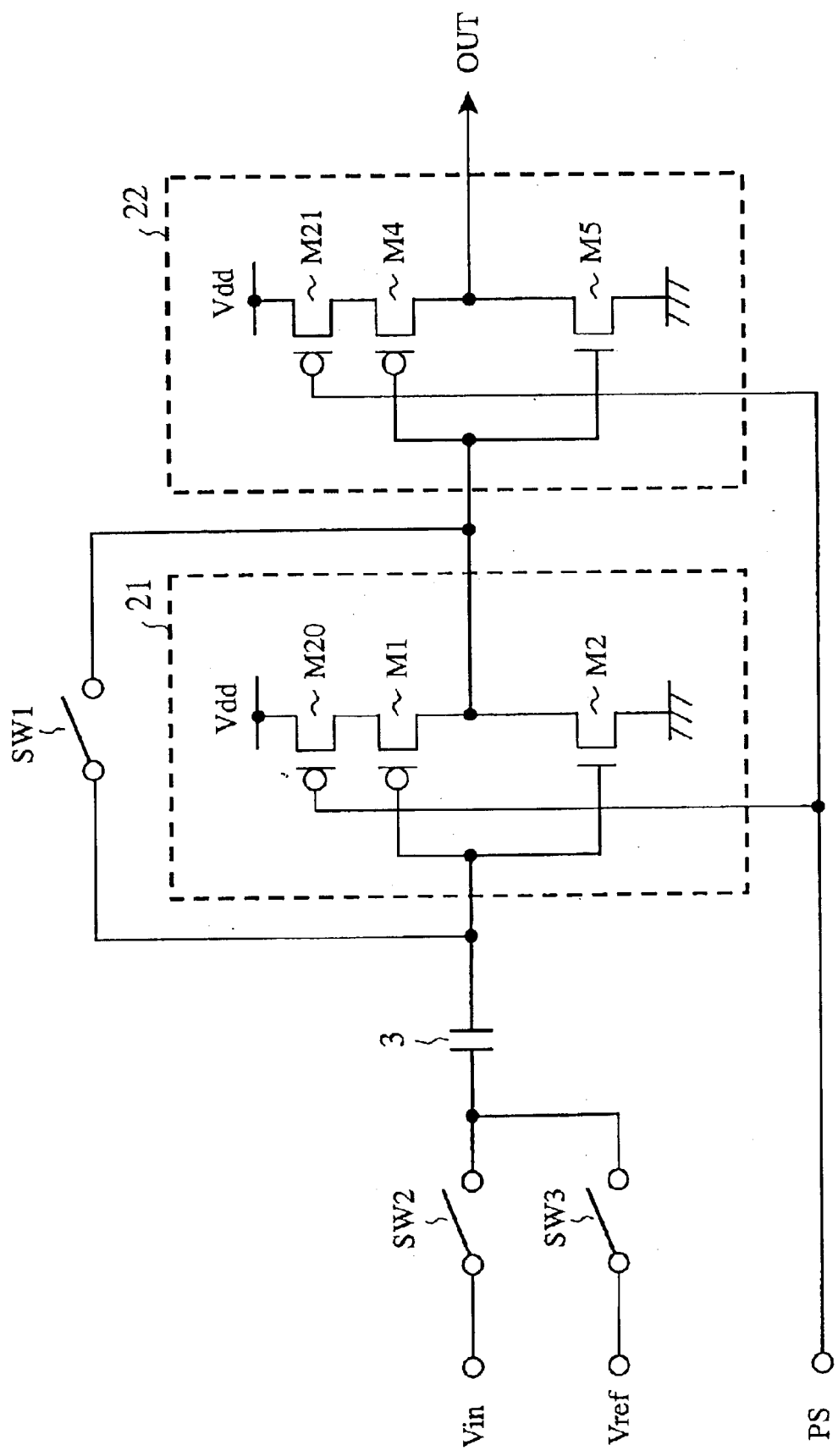
FIG. 6 is a diagram showing a circuit configuration of a chopper comparator according to a second embodiment of the present invention.
Figure 7:
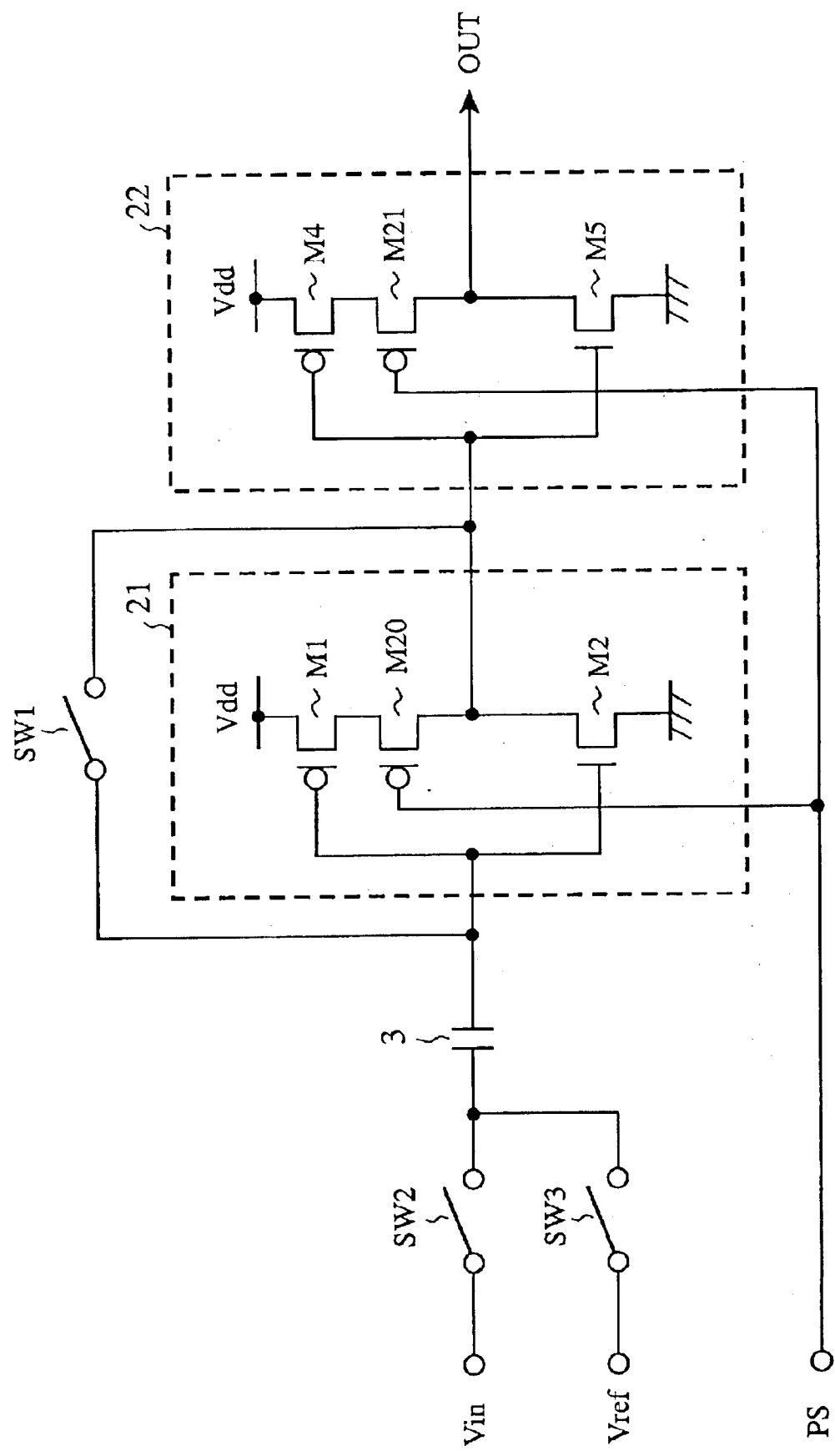
FIG. 7 is a diagram showing another circuit configuration of the chopper comparator according to the second embodiment of the present invention.

The chopper comparators of the second embodiment shown in FIG. 6 and FIG. 7 is made up of a plurality of logic gates, for example, the inverter 21 in the input stage and the inverter 22 in the output stage. In FIG. 6 and FIG. 7, the inverter 21 in the input stage has the PMOS transistor M20, instead of the NMOS transistor M3 in the inverter 1 in the input stage shown in FIG. 1 and FIG. 2. This PMOS transistor M20 connects and disconnects the source or drain of the PMOS transistor M1 to/from the power source voltage Vdd. The switches SW2 and SW3 are connected to the input section of the inverter 21 through the capacitance 3 and the switch SW1 is equipped to the inverter 21. The switch SW1 is connects and disconnects the input section to/from the output section of the inverter 21.

Instead of the NMOS transistor M6 in the inverter 2 shown in FIG. 1 and FIG. 2, the PMOS transistor M21 in the inverter 22 in the output stage is directly connected to the inverter circuit made up of the PMOS transistor M4 and the NMOS transistor M5. The PMOS transistor M21 connects and disconnects the source and drain of the PMOS transistor M4 to/from the power source voltage Vdd.

Figure 8:
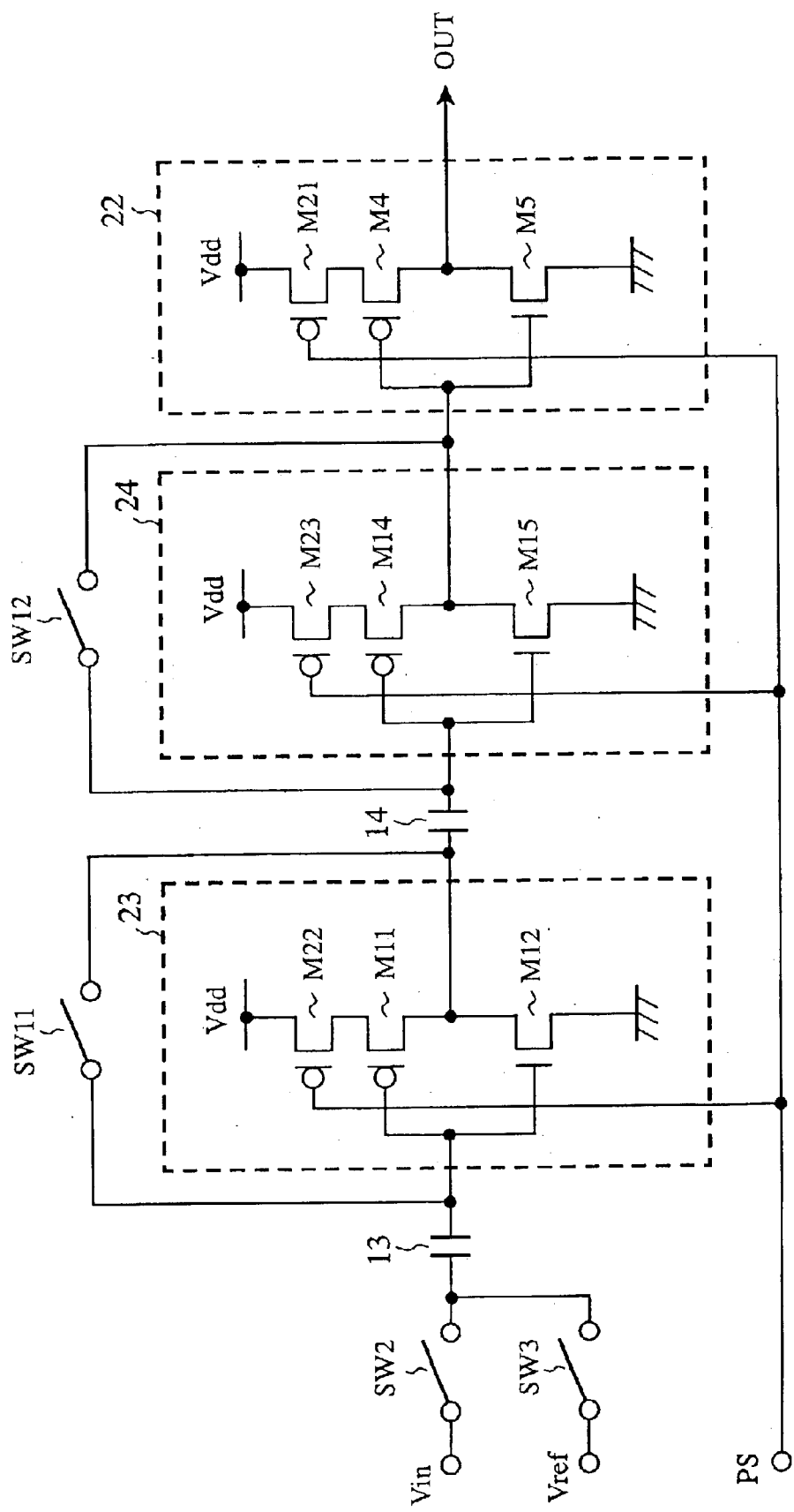
FIG. 8 is a diagram showing another circuit configuration of the chopper comparator according to the second embodiment of the present invention.
Figure 9:
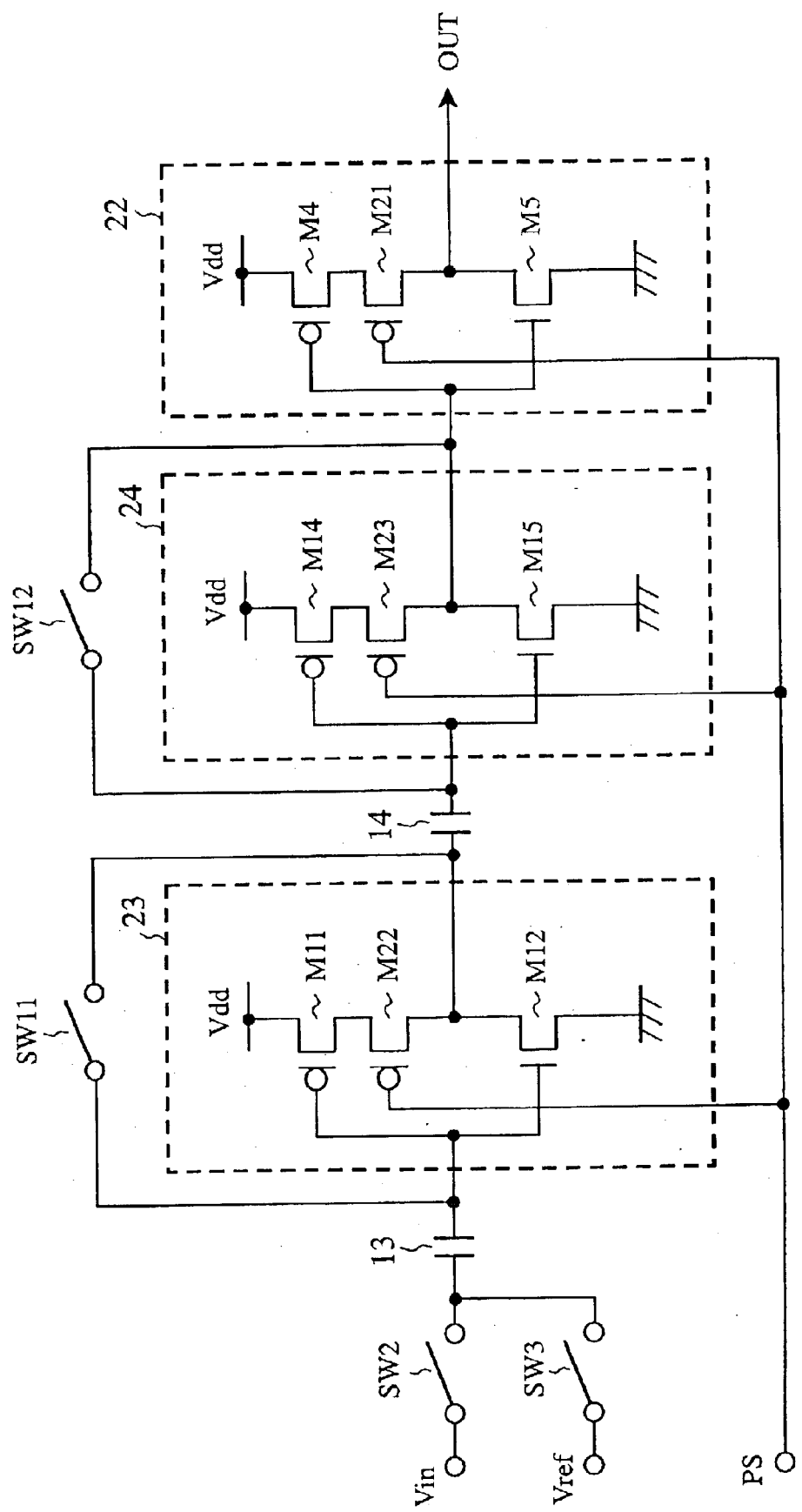
FIG. 9 is a diagram showing another circuit configuration of the chopper comparator according to the second embodiment of the present invention.

The chopper comparator of the second embodiment shown in each of FIG. 8 and FIG. 9 comprises three inverters, the inverter 23 in the front input stage, the inverter 24 in the rear input stage, and the inverter 22 in the output stage.

In FIG. 8 and FIG. 9, instead of the NMOS transistor M13 in the inverter 11 shown in FIG. 3 and FIG. 4, the PMOS transistor M22 in the inverter 23 in the front input stage is directly connected to the inverter circuit made up of the PMOS transistor M11 and the NMOS transistor M12. The PMOS transistor M22 connects and disconnects the source and drain of the PMOS transistor M11 to/from the power source voltage Vdd. Like the configuration of the inverter 11 shown in FIG. 3 and FIG. 4, the switches SW2 and SW3 are connected to the input section of the inverter 23 through the capacitance 13 and the switch SW11 is equipped to the inverter 23. The switch SW1 makes a short circuit between the input section and the output section of the inverter 23.

Instead of the NMOS transistor M16 in the inverter 12 shown in FIG. 3 and FIG. 4, the PMOS transistor M23 in the inverter 24 in the rear input stage is directly connected to the inverter circuit made up of the PMOS transistor M14 and the NMOS transistor M15. The PMOS transistor M23 connects and disconnects the source or drain of the PMOS transistor M14 to/from the power source voltage Vdd. Like the configuration of the inverter 12 shown in FIG. 3 and FIG. 4, the input section of the inverter 24 is connected to the output section of the inverter 23 through the capacitor 14, and the switch SW12 makes a short circuit of the input section and the output section of the inverter 24.

As apparently understood by the previous explanation, the output section of the inverter 24 in the rear input section is connected to the input section of the inverter 22 in the output section. The inverter 22 shown in FIG. 8 has the same configuration of that shown in FIG. 6 and the inverter 22 shown in FIG. 9 also has the same configuration of that shown in FIG. 7. The explanation for them is therefore omitted here.

Both the inverters 21 and 22 in the input and output stages shown in FIG. 6 and FIG. 7 have the same size and layout and the same threshold voltage. Similarly, both the inverters 24 and 22 in the rear input and output stages shown in FIG. 8 and FIG. 9 have the same size and layout and the same threshold voltage.

The inverter 21 in the input stage shown in FIG. 6 has the configuration where the power source voltage Vdd is supplied to the source of the PMOS transistor M1 through the PMOS transistor M20. The inverter 22 in the output stage has the configuration where the power source voltage Vdd is supplied to the source of the PMOS transistor M4 through the PMOS transistor M21. The PS signal is supplied to both the gates of the PMOS transistors M20 and M21 in order to control the operation of the inverters 21 and 22.

The inverter 21 in the input stage shown in FIG. 7, has the configuration where the PMOS transistor M20 is placed between the PMOS transistor M1 and the NMOS transistor M2 and the drain of the PMOS transistor M1 is connected to the output section of the inverter 21 through the PMOS transistor M20.

The inverter 22 in the output stage has the configuration where the PMOS transistor M21 is placed between the PMOS transistor M4 and the NMOS transistor M5 and the drain of the PMOS transistor M4 is connected to the output section of the inverter 22 through the PMOS transistor M21. The PS signal is supplied to both the gates of the PMOS transistors M20 and M21 in order to control the operation of the inverters 21 and 22.

The inverter 23 in the front input stage shown in FIG. 8 has the configuration where the power source voltage Vdd is supplied to the source of the PMOS transistor M11 through the PMOS transistor M22. The inverter 24 in the rear input stage has the configuration where the power source voltage Vdd is supplied to the source of the PMOS transistor M14 through the PMOS transistor M23. The inverter 22 in the output stage shown in FIG. 8 has the same circuit configuration of that shown in FIG. 6 and also has the same size and layout of the inverter 24 shown in FIG. 8. The explanation of the inverter 22 is therefore omitted here. The PS signal is supplied to both the gates of the PMOS transistors M22, M23, and M21 in order to control the operation of the inverters 23, 24, and 22.

The inverter 23 in the front input stage shown in FIG. 9 has the configuration where the PMOS transistor M22 is placed between the PMOS transistor M11 and the NMOS transistor M12 and the drain of the PMOS transistor M11 is connected to the output section of the inverter 23 through the PMOS transistor M22.

The inverter 24 in the rear input stage has the configuration where the PMOS transistor M23 is placed between the PMOS transistor M14 and the NMOS transistor M15 and the drain of the PMOS transistor M14 is connected to the output section of the inverter 24 through the PMOS transistor M23. The inverter 22 in the output stage shown in FIG. 9 has the same circuit configuration of that shown in FIG. 7 and also has the same size and layout of the inverter 24 shown in FIG. 9. The explanation of the inverter 22 is therefore omitted here. The PS signal is supplied to both the gates of the PMOS transistors M22, M23, and M21 in order to control the operation of the inverters 23, 24, and 22.

Next, a description will now be described of the operation of the chopper comparator of the second embodiment.

Figure 10:
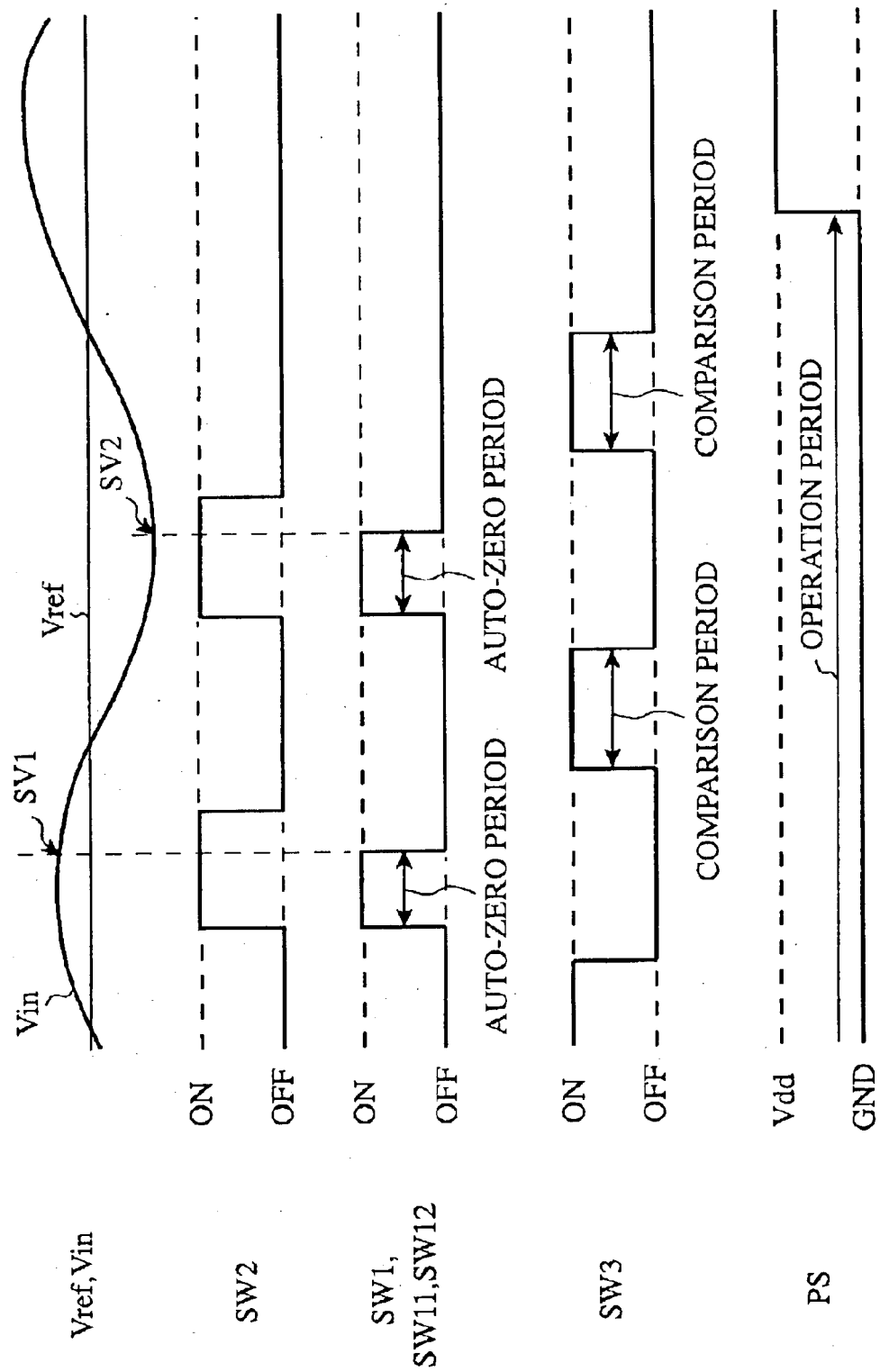
FIG. 10 is a timing chart showing the operation of the chopper comparator according to the second embodiment of the present invention.

FIG. 10 is a timing chart showing the operation of the chopper comparators shown in FIG. 6 to FIG. 9. In the timing chart shown in FIG. 5, the PS signal of the high level indicates the operation period. On the contrary, in the second embodiment in the timing chart shown in FIG. 10 the PS signal of the low level indicates the operation period. That is, the chopper comparators of the second embodiment shown in FIG. 6 to FIG. 9 can be operable while the PS signal of the low level is supplied. The auto-zero period and the comparison period in this operation period are the same of those of the chopper comparators shown in FIG. 1 to FIG. 4. In the following explanation, the same operation of the chopper comparators shown in FIG. 1 to FIG. 4 is omitted, and the operation regarding only the feature of the chopper comparator of the second embodiment will now be explained.

When the PS signal of the low level is supplied to the gate of each of the PMOS transistors M20 and M21 shown in FIG. 6, the path of the source and drain thereof enters the conductive state. The PMOS transistor M20 supplies the power source voltage Vdd to the PMOS transistor M1 and the PMOS transistor M21 supplies the power source voltage Vdd to the PMOS transistor M4. After the operation period is completed and the PS signal is switched from the low level to the high level, when this PS signal is supplied to the gate of the PMOS transistors M20 and M21, the PMOS transistors M20 and M21 enter the inactive state where no current flows through the source and drain thereof.

When the PS signal of the low level is supplied to the gate, the PMOS transistors M22, M23, and M21 shown in FIG. 8 enter the active state where the current flows through the source and drain. The power source voltage Vdd is supplied to the PMOS transistor M11 through the PMOS transistor M22, to the PMOS transistor M14 through the PMOS transistor M23, and to the PMOS transistor M4 through the PMOS transistor M21. When the PS signal is switched from the low level to the high level, the PMOS transistors M22, M23, and M21 enter the inactive state where no current flows through the source and drain. That is, the inverter 23, 24, and 22 enter the inactive state.

When the PS signal of the low level is supplied to the gate of each of the PMOS transistors M20 and M21 shown in FIG. 7, the path of the source and drain thereof enters the conductive state. For example, in the inverter circuit 21 made up of the PMOS transistor M1 and the NMOS transistor M2 connected in series, the PMOS transistor M1 is electrically connected to the output section of the inverter 21 through the PMOS transistor M20. In the inverter 22 made up of the PMOS transistor M4 and the NMOS transistor M5 connected in series, the PMOS transistor M4 is electrically connected to the output section of the inverter 22 through the PMOS transistor M21. When the PS signal is switched from the low level to the high level, the PMOS transistors M20 and M21 enter the inactive state where no current flows through the source and drain thereof. That is, the inverters 21 and 22 enter the inactive state.

When the PS signal of the low level is supplied to the gate, the PMOS transistors M22, M23, and M21 shown in FIG. 9 enter the active state where the current flows through the source and drain thereof. Thereby, the PMOS transistor M11 is connected to the output section of the inverter 23 through the PMOS transistor M22, the PMOS transistor M14 is connected to the output section of the inverter 24 through the PMOS transistor M23, and the PMOS transistor M4 is connected to the output section of the inverter 22 through the PMOS transistor M21. When the PS signal is switched from the low level to the high level, the PMOS transistors M22, M23, and M21 enter the inactive state where no current flows through the source and drain thereof. That is, the inverter 23, 24, and 22 enter the inactive state.

When both the inverters 21 and 22 in the input and output stages shown in FIG. 6 and FIG. 7 and both the inverters 24 and 22 in the rear input stage and output stage shown in FIG. 8 and FIG. 9 have the same size and layout, both the inverters 21 and 22 shown in FIG. 6 and FIG. 7 can have the same threshold voltage, and both the inverters 24 and 22 shown in FIG. 8 and FIG. 9 can also have the same threshold voltage. It is thereby possible to output the correct comparison result and to control the operation period of a plurality of the inverters using the same PS signal.

Because the chopper comparators shown in FIG. 6 to FIG. 9 have the PMOS transistors whose driving power is a relatively small value, it is possible to reduce the current consumption during the operation. In particular, when the chopper comparators shown in FIG. 6 and FIG. 8 are formed with an optimum circuit configuration, it is possible to reduce the delay time of the input/output operation in each of the inverters 23, 24 and 22, and to apply those chopper comparators to a high response application while suppressing the current consumption.

As described above, according to the second embodiment, because all of the inverters forming the chopper comparator are halted in operation while the PS signal indicates the non-operation period other than the operation period, it is possible to prevent any penetrate current flowing through those inverters when the voltage equal to the threshold voltage is inputted to the input section of the inverter during the non-operation period other than the comparison operation. This can obtain the effect to suppress the current consumption in the chopper comparator.

In addition, in the non-operation period other than the operation period, no penetrate current flows through the inverter 21 directly connected to the inverter 21 shown in FIG. 6 and FIG. 7 or through the inverter 22 directly connected to the inverter 24 shown in FIG. 8 and FIG. 9 according to the control of the PS signal. It is therefore possible to prevent the generation of any penetrate current during the non-operation period other than the operation period even if the inverter 21 in the input stage and the inverter 22 in the output stage or the inverter 24 in the rear input stage and the inverter 22 in the output stage are formed with the same size and layout and with the same threshold voltage. It is thereby possible to increase the comparison accuracy between the input voltage Vin and the reference voltage Vref in the chopper comparator and to suppress the current consumption.

Furthermore, the PMOS transistors M1, M4, M11, and M14 enter the active and inactive states where the path between the source and drain thereof is connected or disconnected by the operation of the PMOS transistors M20 and M21 shown in FIG. 6 and FIG. 7 and the PMOS transistors M22, M23, and M21 shown in FIG. 8 and FIG. 9. It is thereby possible to set the threshold voltage of each inverter 21, 22, 23, and 24 to a low value. Furthermore, the setting of the auto-zero state of the inverters 21, 23, and 24, for example, the ON/OFF operation of the switches SW1, SW11, and SW12 (which is made up of a NMOS transistor or a PMOS transistor) can be performed within a small voltage range where a resistance is small. There is the effect that it is possible to reduce the size and layout of those switches SW1, SW11, and SW12.

Third Embodiment

FIG. 11 to FIG. 14 are diagrams showing circuit configurations of a chopper comparator according to a third embodiment of the present invention. In the third embodiment, the same components of the chopper comparators shown FIG. 1 to FIG. 4 and FIG. 6 to FIG. 9 will be referred to with the same reference numbers, and the explanation of the same components is omitted here.

Figure 11:
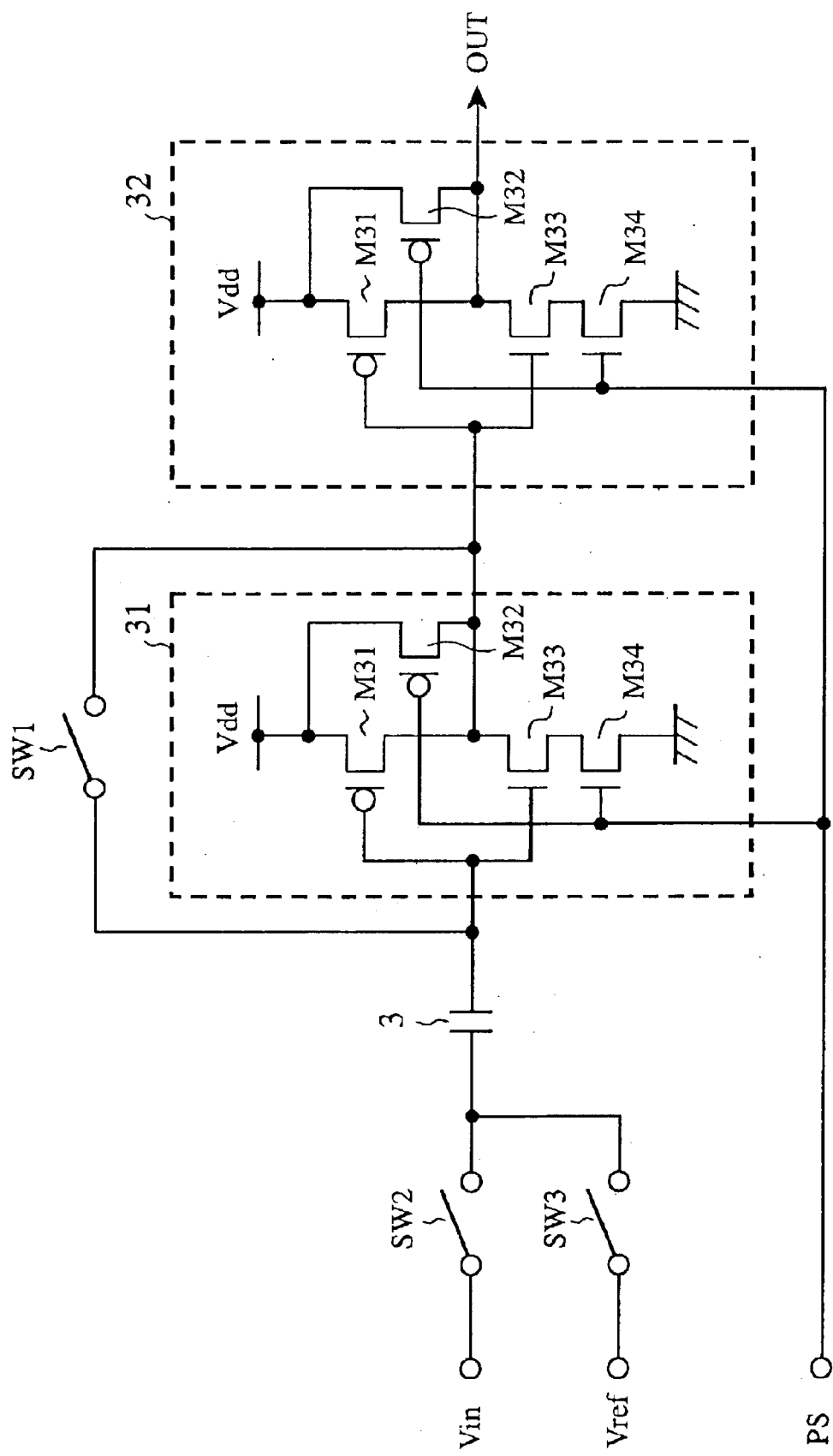
FIG. 11 is a diagram showing a circuit configuration of a chopper comparator according to a third embodiment of the present invention.
Figure 12:
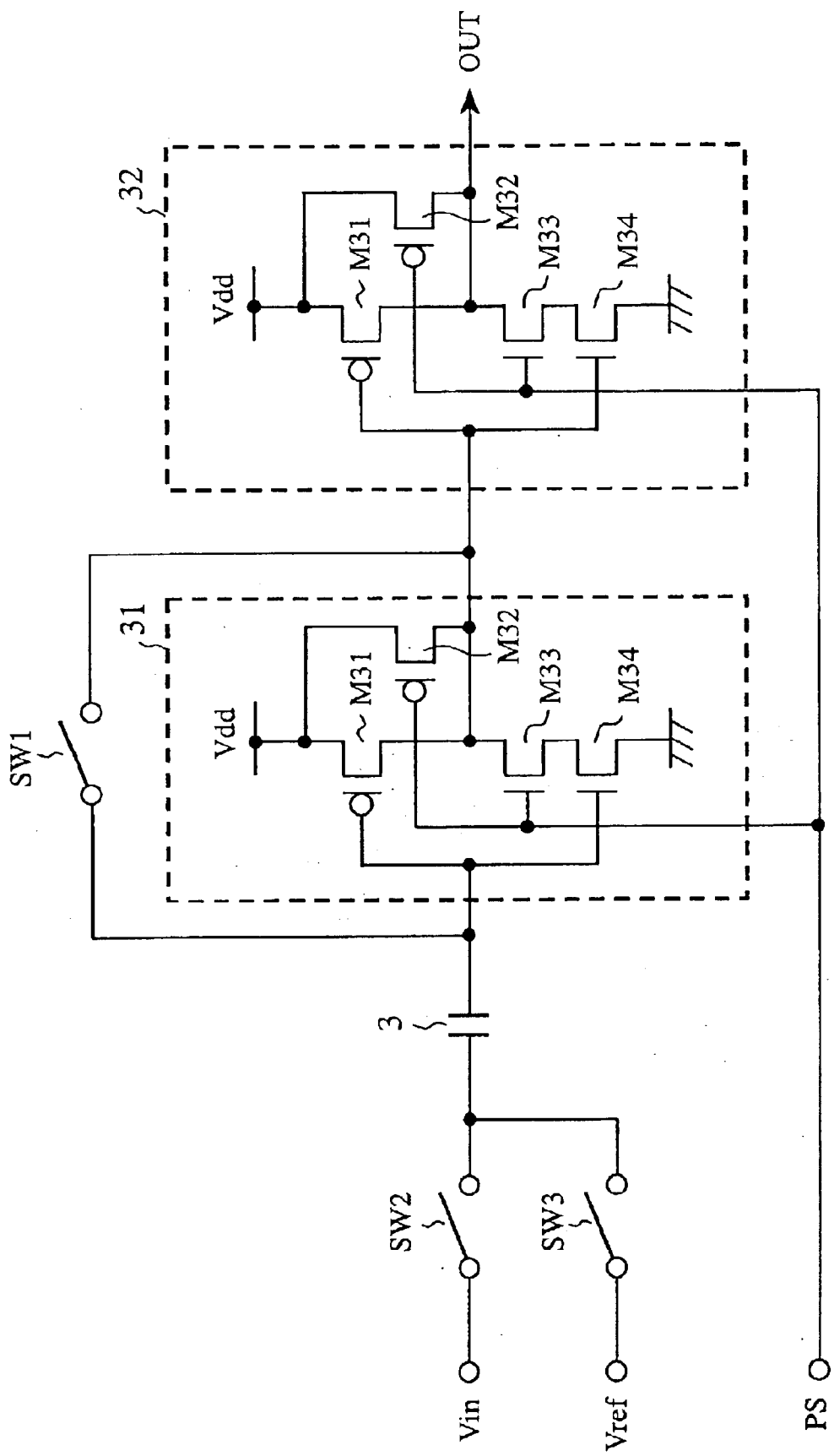
FIG. 12 is a diagram showing another circuit configuration of the chopper comparator according to the third embodiment of the present invention.
Figure 13:
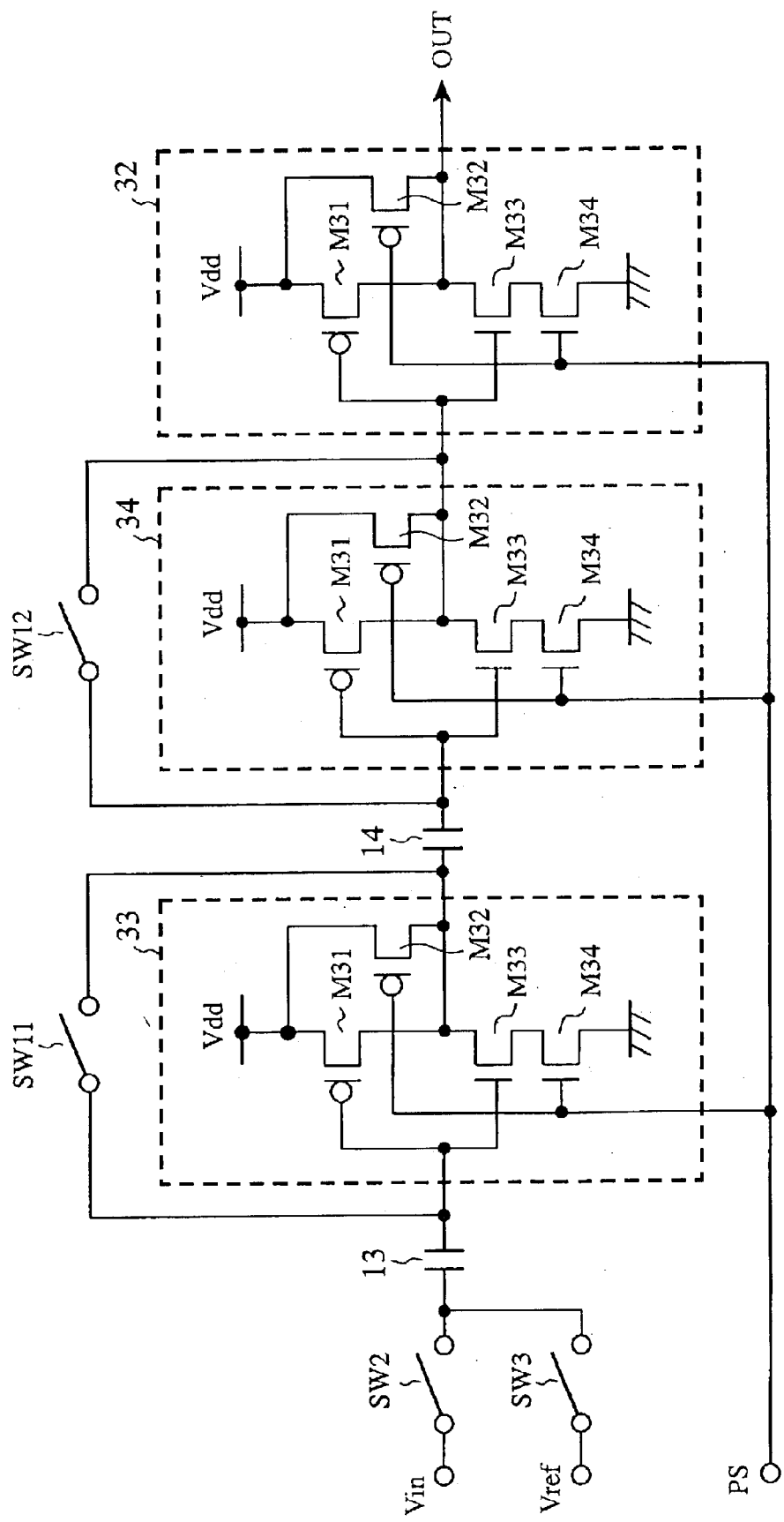
FIG. 13 is a diagram showing another circuit configuration of the chopper comparator according to the third embodiment of the present invention.
Figure 14:
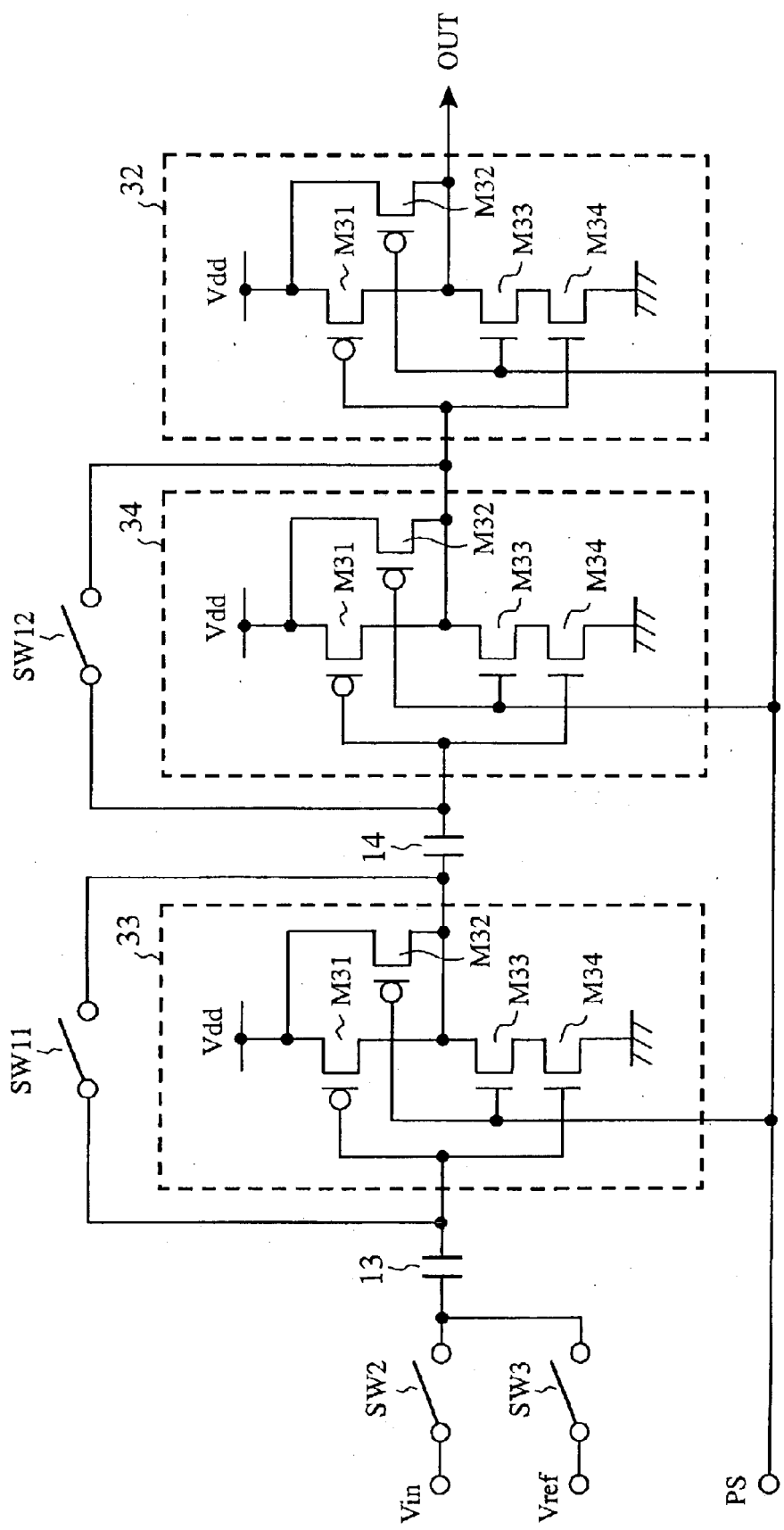
FIG. 14 is a diagram showing another circuit configuration of the chopper comparator according to the third embodiment of the present invention.

In the chopper comparator of the third embodiment, NAND gate are used as the logic gates forming the chopper comparator. In FIG. 11 and FIG. 12, the NAND gate 31 corresponds to the inverter 1 and the NAND gate 32 corresponds to the inverter 2 shown in FIG. 1 and FIG. 2. In FIG. 13 and FIG. 14, the NAND gate 33 corresponds to the inverter 11 and the NAND gate 34 corresponds to the inverter 12 shown in FIG. 3 and FIG. 4.

Each of the NAND gates 31 to 34 shown in FIG. 11 to FIG. 14 is made up of a pair of PMOS transistors M31 and M32 connected in parallel and a pair of NMOS transistors M33 and M34 connected in series. The power source voltage Vdd is supplied to a pair of the PMOS transistors M31 and M32 connected in parallel. The NMOS transistor M34 connected in series to the NMOS transistor M33 is grounded. The connection node of the PMOS transistors M31 and M32 and the NMOS transistor M33 is the output section of each of the NAND gates 31 to 34.

In the NAND gate 31 shown in FIG. 11, the gate of the PMOS transistor M31 and the gate of the NMOS transistor M33 are connected to one terminal of the capacitance 3 and the PMOS transistor M31 and the NMOS transistor M33 connected in series form the inverter circuit and the PS signal is supplied to both the gates of the PMOS transistor M32 and the NMOS transistor M34.

In the NAND gate 32 shown in FIG. 11, the input section of this NAND gate 32 connected to both the gate of the PMOS transistor M31 and the gate of the NMOS transistor M33 is connected to the output section of the NAND gate 31, and the PMOS transistor M31 and the NMOS transistor M33 connected in series form the inverter circuit and the PS signal is supplied to both the gates of the PMOS transistor M32 and the NMOS transistor M34.

In the NAND gate 31 shown in FIG. 12, the gate of the PMOS transistor M31 and the gate of the NMOS transistor M34 are connected to one terminal of the capacitance 3 and the PMOS transistor M31 and the NMOS transistor M34 connected in series form the inverter circuit, and the PS signal is supplied to both the gates of the PMOS transistor M32 and the NMOS transistor M33.

In the NAND gate 32 shown in FIG. 12, the input section of this NAND gate 32 connected to both the gate of the PMOS transistor M31 and the gate of the NMOS transistor M34 is connected to the output section of the NAND gate 31, and the PMOS transistor M31 and the NMOS transistor M34 connected in series form the inverter circuit, and the PS signal is supplied to both the gates of the PMOS transistor M32 and the NMOS transistor M33.

In the NAND gate 33 shown in FIG. 13, the gate of the PMOS transistor M31 and the gate of the NMOS transistor M33 are connected to one terminal of the capacitance 13, and the PMOS transistor M31 and the NMOS transistor M33 connected in series form the inverter circuit, and the PS signal is supplied to both the gates of the PMOS transistor M32 and the NMOS transistor M34.

In the NAND gate 34 shown in FIG. 13, the gate of the PMOS transistor M31 and the gate of the NMOS transistor M33 are connected to one terminal of the capacitance 14, and the configuration of the other components is the same of those in the NAND gate 33 shown in FIG. 13.

In the NAND gate 32 shown in FIG. 13, the gate of the PMOS transistor M31 and the gate of the NMOS transistor M33 are connected to the output section of the NAND gate 34 in the rear input section, and the configuration of the other components is the same of those in the NAND gate 32 shown in FIG. 13.

In the NAND gate 34 shown in FIG. 14, the gate of the PMOS transistor M31 and the gate of the NMOS transistor M34 are connected to one terminal of the capacitance 13, and the PMOS transistor M31 and the NMOS transistor M34 connected in series form the inverter circuit, and the PS signal is supplied to both the gates of the PMOS transistor M32 and the NMOS transistor M33.

In the NAND gate 34 shown in FIG. 14, the gate of the PMOS transistor M31 and the gate of the NMOS transistor M34 are connected to one terminal of the capacitance 14, and the configuration of the other components is the same of those in the NAND gate 33 shown in FIG. 14. In the NAND gate 32 shown in FIG. 14, the gate of the PMOS transistor M31 and the gate of the NMOS transistor M34 are connected to the output section of the NAND gate 34 in the rear input stage, and the configuration of the other components is the same of those in the NAND gate 32 shown in FIG. 12.

In addition, the NAND gate 31 in the input stage and the NAND gate 32 in the output stage shown in FIG. 11 and FIG. 12 are formed with the same size and layout in order to set the threshold voltage of the inverter circuit in each of the NAND gates 31 and 32 to a same value. Similarly, the NAND gate 34 in the rear input stage and the NAND gate 32 in the output stage shown in FIG. 13 and FIG. 14 are formed with the same size and layout in order to set the threshold voltage of the inverter circuit in each of the NAND gates 34 and 32 to a same value.

Next, a description will now be given of the operation of the chopper comparators according to the third embodiment.

The chopper comparators shown in FIG. 11 and FIG. 12 can perform the same operation of the chopper comparators shown in FIG. 1 and FIG. 2. The chopper comparators shown in FIG. 13 and FIG. 15 can perform the same operation of the chopper comparators shown in FIG. 3 and FIG. 4. That is, the chopper comparators shown in FIG. 11 to FIG. 14 can perform the same operation of the chopper comparators of the first embodiment in the auto-zero period and in the comparison period. Here, the explanation for the same operation of the chopper comparators, having the configurations shown in FIG. 1 to FIG. 4, using the timing chart shown in FIG. 5 is omitted. The explanation for only the feature of the chopper comparators shown in FIG. 11 to FIG. 14 will now be explained.

When receiving the PS signal of the high level indicating the operation period, the PMOS transistor M32 in each of the NAND gates 31 to 34 enters the inactive state and the NMOS transistor M34 enters the active state in the chopper comparators shown in FIG. 11 and FIG. 13.

When receiving the PS signal of the high level, the PMOS transistor M32 in each of the NAND gates 31 to 34 shown in FIG. 11 to FIG. 14 enters the inactive state and the NMOS transistor M33 enters the active state in the chopper comparators shown in FIG. 12 and FIG. 14. Thereby, in each of the NAND gates 31 to 34 shown in FIG. 11 and FIG. 13, the inverter circuit is made up of the PMOS transistor M31 and the NMOS transistor M33 connected in series enters the active state, and in each of the NAND gates 31 to 34 shown in FIG. 12 and FIG. 14, the inverter circuit is made up of the PMOS transistor M31 and the NMOS transistor M34 connected in series enters the active state.

Thus, the inverter circuit formed in each of the NAND gates 31 to 34 can perform the same operation of each of the inverters 1, 2, 11, and 12, and outputs the voltage of the high level or low level according to the threshold voltage set in each inverter circuit.

When receiving the PS signal of the low level indicating the non-operation period, the PMOS transistor M32 enters the active state and the NMOS transistor M34 enters the inactive state in the chopper comparators shown in FIG. 11 and FIG. 13, and the PMOS transistor M32 enters the active state and the NMOS transistor M33 enters the inactive state in the chopper comparators shown in FIG. 12 and FIG. 14. The inverter circuit enters the inactive state because the path to the ground is electrically disconnected and the PMOS transistor M32 disconnects the path between the source and drain of the PMOS transistor M31 forming the inverter circuit. That is, the power source voltage Vdd is supplied to the output section of the NAND gates 31 to 34 through the PMOS transistor M32 in the active state.

When receiving the PS signal of the low level, each of the NAND gates 31 to 34 shown in FIG. 11 to FIG. 14 outputs the voltage of the high level which is equal to the power source voltage Vdd. That is, in the chopper comparators of the third embodiment, the output section is clamped with the voltage of the high level during the non-operation period other than the operation period.

When receiving the PS signal of the low level, the NMOS transistor M33 is disconnected from the ground in each of the chopper comparators shown in FIG. 11 and FIG. 13, and the NMOS transistor 34 is disconnected from the PMOS transistor M31 in each chopper comparator shown in FIG. 12 and FIG. 14 it is possible to prevent any penetrate current flowing from the part, to which the power source voltage Vdd is supplied, to the ground in the inverter circuit formed in each of the NAND gates 31 to 34.

The chopper comparators shown in FIG. 11 to FIG. 14 use the NAND gates as all of the logic gates. However, the present invention is not limited by this configuration. For example, it is possible to combine the logic gates and the NAND gates shown in FIG. 11 to FIG. 14, where, the inverter circuit in each logic gate having the same action and effect of the third embodiment is formed. That is, it is not necessary to use the NAND gates as all of the logic gates. In particular, if each transistor in the chopper comparators shown in FIG. 11 and FIG. 13 is formed with an optimum circuit layout, it is possible to reduce the delay time occurred in each of the inverters 33, 34, and 32 and it is thereby possible to apply the chopper comparator having the transistors of the optimum circuit layout to a high response application.

As described above, according to the third embodiment, the inverter is made up of a pair of the PMOS transistor M31 and the NMOS transistor M33 or a pair of the PMOS transistor M31 and the NMOS transistor M34, which form each of the NAND gates 31 to 34. Further, the inverter circuit is active (operable) during the operation period and inactive (not operable) during the period other then the operation period under the control of the NMOS transistor or the NMOS transistor M33 in the NAND gates. During the non-operation period other then the operation period, the inverter circuit is disconnected from the power source voltage Vdd or the ground and the output voltage of the inverter circuit is clamped at the voltage of the high level. Accordingly, it is possible to prevent any penetrate current flowing through the inverter circuit during the non-operation period of the chopper comparator. This suppresses the current consumption.

In addition, when the inverter 31 in the input stage and the inverter 32 in the output stage shown in FIG. 11 and FIG. 12 have the same size and layout in order to set the same threshold voltage, it is possible to prevent any penetrate current flowing through the inverter 31 and the inverter 32 directly connected to the inverter 31 in the non-operation period according to the control of the PS signal. Furthermore, when the inverter 34 in the rear input stage and the inverter 32 in the output stage shown in FIG. 13 and FIG. 14 have the same size and layout in order to set the same threshold voltage, it is possible to prevent any penetrate current flowing through the inverter 34 and the inverter 32 directly connected to the inverter 34 in the non-operation period according to the control of the PS signal. It is therefore possible to increase the comparison accuracy between the input voltage Vin and the reference voltage Vref of the chopper comparator while suppressing the current consumption.

Still furthermore, the inverter circuit is formed in the NAND gate 31 shown in FIG. 11 and FIG. 12 and the inverter circuit is also formed in the NAND gate 34 shown in FIG. 13 and FIG. 14, the output section of the NAND gate 34 is clamped at the voltage of the high level during the non-operation period indicated by the PS signal.

It is thereby possible to stabilize the output of the inverter in the output stage in the chopper comparator because the voltage of the high level can be supplied to the inverter in the output stage during the non-operation period even if the inverter made up of a pair of the PMOS transistor and the NMOS transistor connected in series is used instead of the NAND gate 32 shown in FIG. 11 to FIG. 14. Moreover, it is possible to prevent any penetrate current flowing through the inverter in the output stage.

Moreover, because the NAND gate is used as the logic gate and because the PMOS transistors of a relatively small driving ability are connected in parallel and the NMOS transistors of a relatively large driving ability are connected in series, it is thereby possible to reduce the delay time between the input and output of the chopper comparator and to obtain the high response speed of the chopper comparator.

Fourth Embodiment

FIG. 15 to FIG. 18 are diagrams showing circuit configurations of a chopper comparator according to a fourth embodiment of the present invention. In the fourth embodiment, the same components of the chopper comparators shown FIG. 1 to FIG. 4, FIG. 6 to FIG. 9, and FIG. 11 to FIG. 14 will be referred to with the same reference numbers, and the explanation of the same components is omitted here.

In the chopper comparator of the fourth embodiment, a NOR gate is used as the logic gate forming the chopper comparator.

The NOR gate 41 in the input stage corresponds to the inverter 21, and the NOR gate 42 in the output stage corresponds to the inverter 22 shown in FIG. 6 and FIG. 7. The NOR gate 43 in the front input stage corresponds to the inverter 23, and the NOR gate 44 in the rear input stage corresponds to the inverter 24 shown in FIG. 8 and FIG. 9.

Each of the NOR gates 41 to 44 shown in FIG. 15 to FIG. 18 is made up of a pair of the PMOS transistors M41 and M42 connected in series and a pair of the NMOS transistors M43 and M44 connected in parallel. The power source voltage Vdd is supplied to the PMOS transistors M42 and M41 connected in series. The NMOS transistors M43 and M44 connected in parallel are grounded. The connection node of the PMOS transistor M42 and the NMOS transistors M43 and M44 is the output section of each of the NOR gates 41 to 44 shown in FIG. 15 to FIG. 18.

Figure 15:
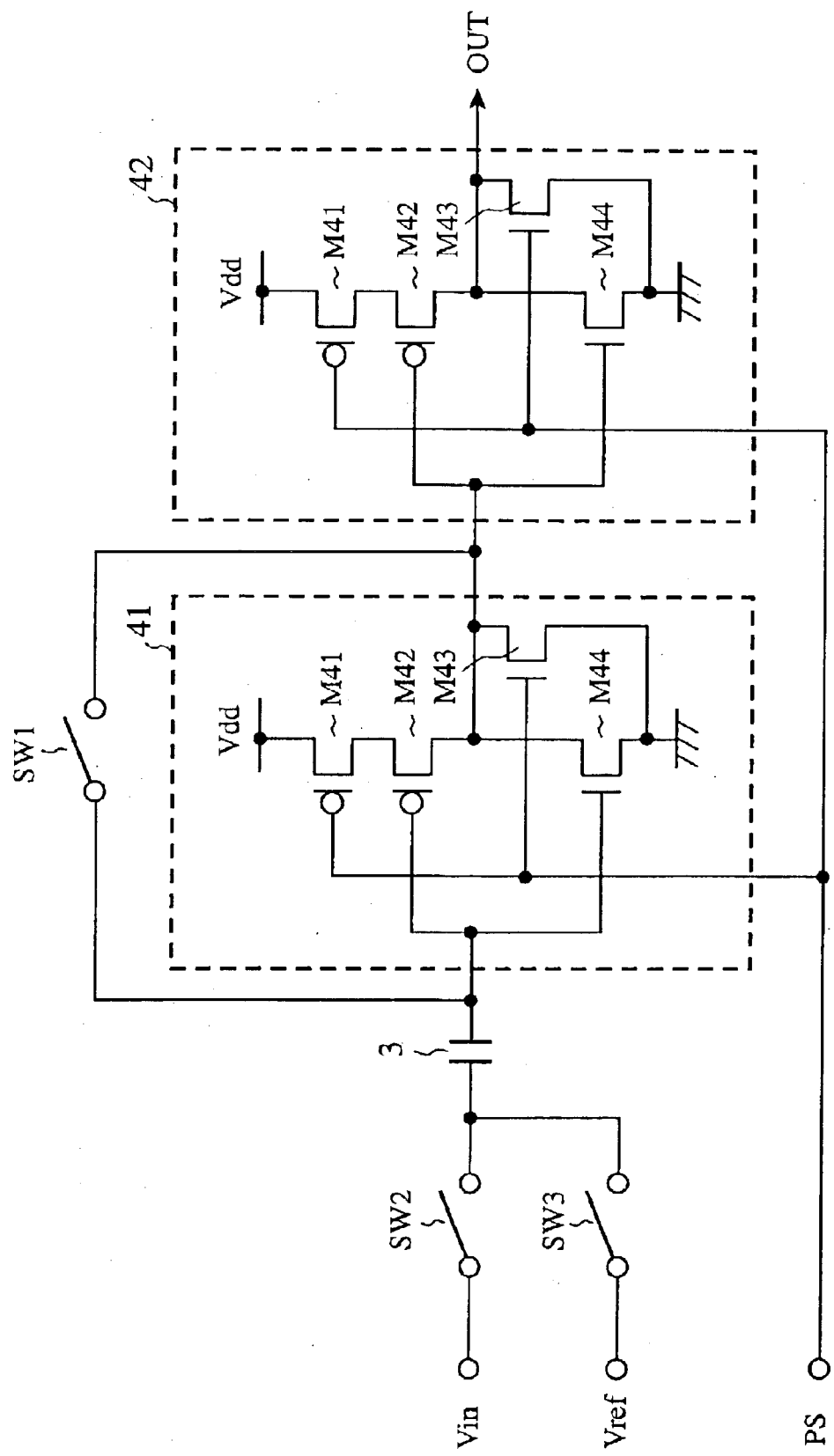
FIG. 15 is a diagram showing a circuit configuration of a chopper comparator according to a fourth embodiment of the present invention.

In the NOR gate 41 shown in FIG. 15, the gate of the PMOS transistor M42 and the gate of the NMOS transistor M44 are connected to one terminal of the capacitance 3 and the PS signal is supplied to the gate of the PMOS transistor M41 and the gate of the NMOS transistor M43. In the NOR gate 42, the gate of the PMOS transistor M41 and the gate of the NMOS transistor M42 are connected to the output section of the NOR gate 41, and the PS signal is supplied to both the gate of the PMOS transistor M41 and the gate of the NMOS transistor M43.

Figure 16:
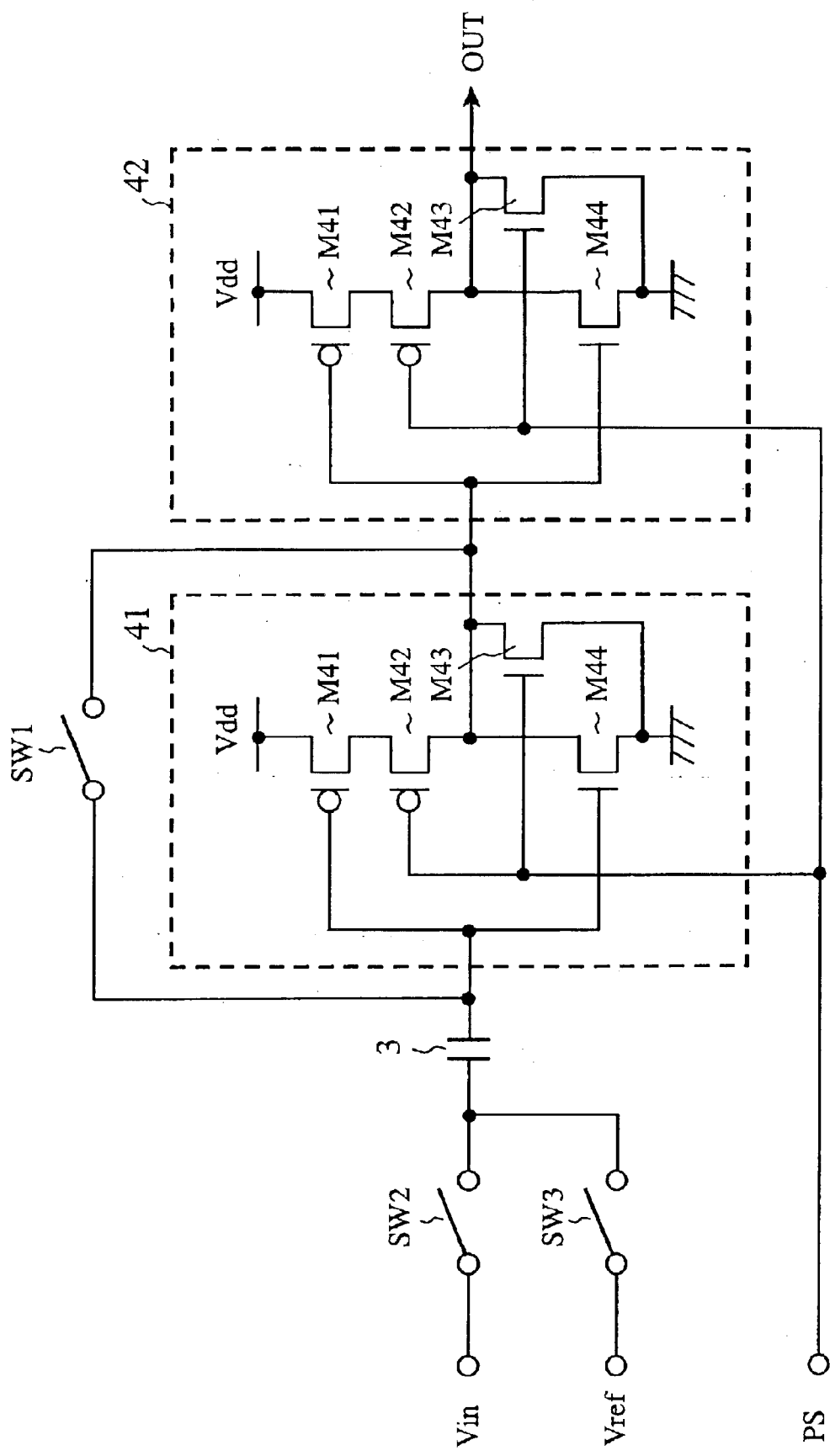
FIG. 16 is a diagram showing another circuit configuration of the chopper comparator according to the fourth embodiment of the present invention.

In the NOR gate 41 shown in FIG. 16, the gate of the PMOS transistor M41 and the gate of the NMOS transistor M44 are connected to one terminal of the capacitance 3, and the PS signal is supplied to both the gate of the PMOS transistor M42 and the gate of the NMOS transistor M43. In the NOR gate 42, the gate of the PMOS transistor M41 and the gate of the NMOS transistor M44 are connected to the output section of the NOR gate 41, and the PS signal is supplied to both the gate of the PMOS transistor M42 and the gate of the NMOS transistor M43.

Figure 17:
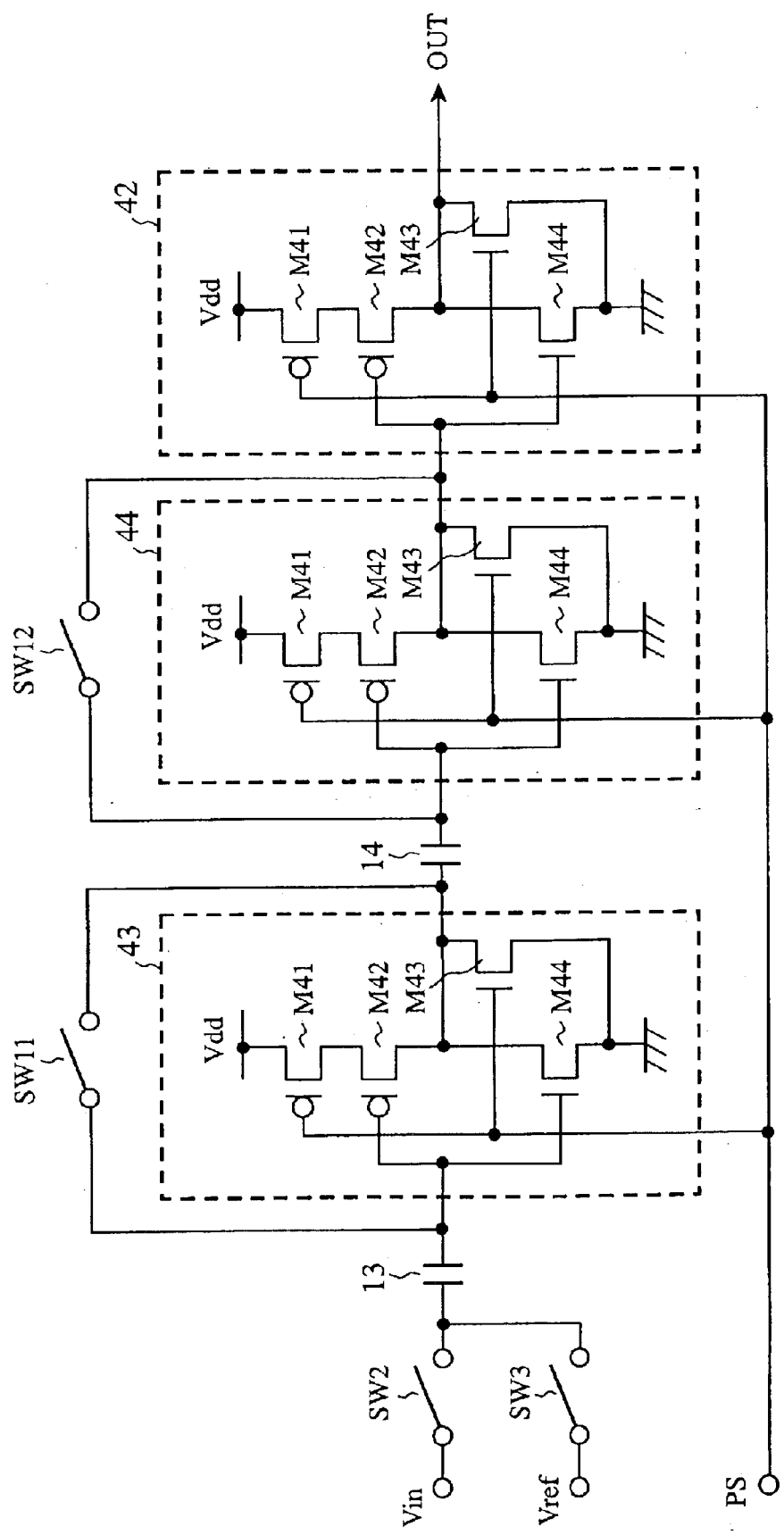
FIG. 17 is a diagram showing another circuit configuration of the chopper comparator according to the fourth embodiment of the present invention.

In the NOR gate 43 shown in FIG. 17, the gate of the PMOS transistor M42 and the gate of the NMOS transistor M44 are connected to one terminal of the capacitance 3, and the PS signal is supplied to both the gate of the PMOS transistor M41 and the gate of the NMOS transistor M43. In the NOR gate 44, the gate of the PMOS transistor M42 and the gate of the NMOS transistor M44 are connected to one terminal of the capacitance 14. Other components are the same of those in the NOR gate 43. In the NOR gate 42 shown in FIG. 17, the gate of the PMOS transistor M42 and the gate of the NMOS transistor M44 are connected to the output section of the NOR gate 44 in the rear input stage. Other components are the same of those in the NOR gate 41 shown in FIG. 15.

Figure 18:
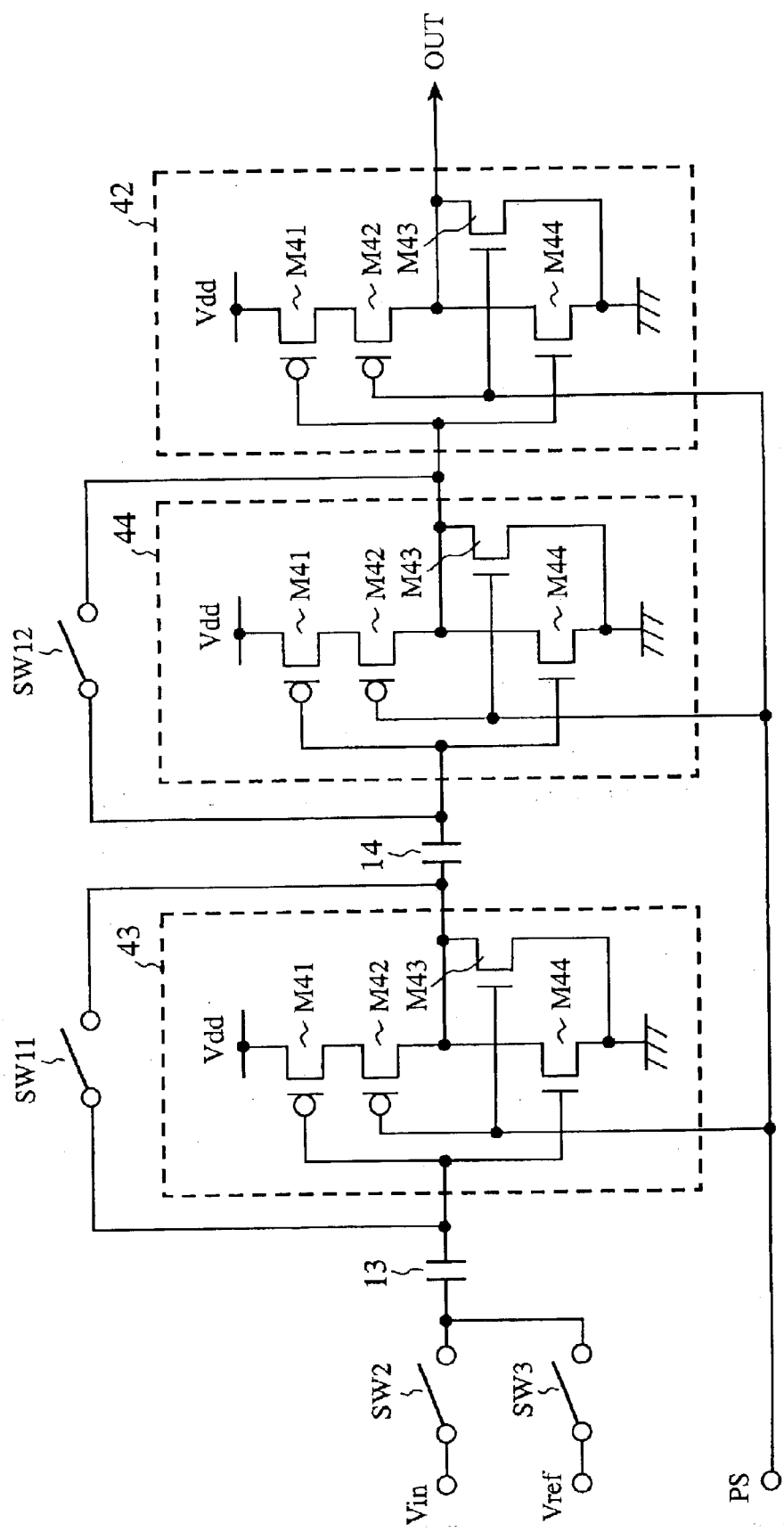
FIG. 18 is a diagram showing another circuit configuration of the chopper comparator according to the fourth embodiment of the present invention.

In the NOR gate 43 shown in FIG. 18, the gate of the PMOS transistor M41 and the gate of the NMOS transistor M44 are connected to one terminal of the capacitance 13, and the PS signal is supplied to both the gate of the PMOS transistor M42 and the gate of the NMOS transistor M43. In the NOR gate 44, the gate of the PMOS transistor M41 and the gate of the NMOS transistor M44 are connected to one terminal of the capacitance 14. Other components are the same of those in the NOR gate 43. In the NOR gate 42 shown in FIG. 18, the gate of the PMOS transistor M41 and the gate of the NMOS transistor M44 are connected to the output section of the NOR gate 44 in the rear input stage. Other components are the same of those in the NOR gate 42 shown in FIG. 16.

In addition, it is so formed that the NOR gate 41 in the input stage and the NOR gate 42 in the output stage shown in FIG. 15 and FIG. 16 have the same size and layout in order to have the same threshold voltage of the inverter circuit formed in each of the NOR gates 41 and 42. Similarly, it is so formed that the NOR gate 44 in the rear input stage and the NOR gate 42 in the output stage shown in FIG. 17 and FIG. 18 have the same size and layout in order to have the same threshold voltage of the inverter circuit formed in each of the NOR gates 41 and 42.

Next, a description will now be given of the operation of the chopper comparator of the fourth embodiment.

The chopper comparators shown in FIG. 15 and FIG. 16 can perform the same operation of the chopper comparators shown in FIG. 6 and FIG. 7. The chopper comparators shown in FIG. 17 and FIG. 18 can perform the same operation of the chopper comparators shown in FIG. 8 and FIG. 9.

That is, the chopper comparators shown in FIG. 15 to FIG. 18 can perform the same operation of the chopper comparators of the second embodiment, where the ON/OFF operation of the switches SW1, SW11, SW12, SW2, and SW3 are controlled in the auto-zero period and comparison period shown in the timing chart of FIG. 10. Here, the explanation for the same operation of the chopper comparators, having the configurations shown in FIG. 6 to FIG. 9 is omitted. The explanation for only the feature of the chopper comparators shown in FIG. 15 to FIG. 18 will now be explained.

When receiving the PS signal of the low level indicating the operation period, each of the NOR gates 41 to 44 shown in FIG. 15 to FIG. 18, the PMOS transistor M41 enters the active state and the NMOS transistor M43 enters the inactive state in the chopper comparators shown in FIG. 15 and FIG. 17. When receiving the PS signal of the low level, the PMOS transistor M42 enters the active state and the NMOS transistor M43 enters the inactive state shown in FIG. 16 and FIG. 18.

In each of the NOR gates 41 to 44 shown in FIG. 15 and FIG. 17, the PMOS transistor M42 and the NMOS transistor M44 connected in series form the inverter circuit. In each of the NOR gates 41 to 44 shown in FIG. 16 and FIG. 18, the PMOS transistor M41 and the NMOS transistor M44 connected in series form the inverter circuit. The inverter circuit formed in each of the NOR gates 41 to 44 can perform the same operation of each of the inverters 21 to 24 of the second embodiment, and outputs the voltage of the high level or low level according to the threshold voltage set in each inverter circuit.

When receiving the PS signal of the high level indicating the non-operation period other than the operation period, each of the NOR gates 41 to 44 shown in FIG. 15 to FIG. 18, the PMOS transistor M41 enters the inactive state and the NMOS transistor M43 enters the active state in the chopper comparators shown in FIG. 15 and FIG. 17. When receiving the PS signal of the high level, the PMOS transistor M42 enters the inactive state and the NMOS transistor M43 enters the active state in the chopper comparators shown in FIG. 16 and FIG. 18.

Thereby, the inverter circuit formed in each of the NOR gates 41 to 44 shown in FIG. 15 and FIG. 17 enters the inactive state, so that the supply of the power source voltage Vdd to the PMOS transistor M42 is stopped and the NMOS transistor M43 makes a short circuit of the source and drain of the NMOS transistor 44 forming the inverter circuit. That is, the output section of each of the NOR gates 41 to 44 is grounded through the NMOS transistor M43 which has entered the active state. In addition, the inverter circuit formed in each of the NOR gates 41 to 44 shown in FIG. 16 and FIG. 18 enters the inactive state because the PMOS transistor M41 is disconnected from the NMOS transistor M44, so that the NMOS transistor M43 makes a short circuit of the source and drain of the NMOS transistor 44 and the output section of each of the NOR gates 41 to 44 is grounded.

When receiving the PS signal of the high level indicating the non-operation period, each of the NOR gates shown in FIG. 15 to FIG. 18 outputs the voltage of the low level which is equal to the ground voltage. That is, the chopper comparator of the fourth embodiment is clamped with the voltage of the low level during the non-operation period other than the operation period. In addition, during the non-operation period, as previously described, the supply of the power supply voltage Vdd to the PMOS transistor M42 shown in FIG. 15 and FIG. 17 is stopped, and the PMOS transistor M41 is disconnected from the output section of the NOR gate shown in FIG. 16 and FIG. 18. It is thereby possible to prevent any penetrate current flowing through the inverter circuit formed in each of the NOR gates 41 to 44.

Because the chopper comparators shown in FIG. 15 to FIG. 18 are formed using the NOR gates in which the PMOS transistors whose driving power is relatively small are connected in series, it is possible to reduce the current consumption during the operation period. In particular, when the chopper comparators shown in FIG. 15 and FIG. 17 are formed with an optimum circuit configuration, it is possible to reduce the delay time of the input/output operation in each of the inverters 43, 44 and 42, and to apply those chopper comparators to a higher response application while suppressing the current consumption.

The chopper comparators shown in FIG. 15 to FIG. 18 use the NOR gates as the logic gates. The fourth embodiment of the present invention is not limited by those configuration where the NOR gates are used as all of the logic gates.

As described above, according to the fourth embodiment, the inverter circuit is made up of a pair of the PMOS transistor M42 and the NMOS transistor M44 or a pair of the PMOS transistor M41 and the NMOS transistor M44, which form each of the NOR gates 41 to 44. Further, during the operation period, the power source voltage Vdd is supplied to the inverter circuit using the PMOS transistor M41 or M42, which does not form the inverter circuit, but forms the NOR gate. Furthermore, during the non-operation period, the output of the inverter circuit is clamped at the voltage of the low level using the NMOS transistor M43, which does not form the inverter circuit, but forms the NOR gate, when the supply of the power source voltage Vdd to the inverter circuit is stopped. Accordingly, it is possible to prevent any penetrate current flowing through the inverter circuit formed in each of the NOR gates 41 to 44 during the non-operation period of the chopper comparator. This suppresses the current consumption of the chopper comparator.

In addition, it is so formed that the NOR gate 41 in the input stage and the NOR gate 42 in the output stage shown in FIG. 15 and FIG. 16 have the same size and layout in order to have the same threshold voltage of the inverter circuit formed in each of the NOR gates 41 and 42. Similarly, it is so formed that the NOR gate 44 in the rear input stage and the NOR gate 42 in the output stage shown in FIG. 17 and FIG. 18 have the same size and layout in order to have the same threshold voltage of the inverter circuit formed in each of the NOR gates 41 and 42. It is thereby possible to prevent any penetrate current flowing through the inverter circuit in the NOR gate 42 directly connected to the NOR gate 41, or the inverter circuit in the NOR gate 42 directly connected to the NOR gate 44, during the non-operation period by the control of the PS signal. It is therefore possible to increase the comparison accuracy between the input voltage Vin and the reference voltage Vref of the chopper comparator while suppressing the current consumption.

Furthermore, the inverter circuit is made up of the NOR gate 41 in the input stage shown in FIG. 15 and FIG. 16 and the NOR gate 44 in the rear input stage shown in FIG. 17 and FIG. 18, and when receiving the PS signal indicating the non-operation period other than the operation period, the output of each of the NOR gates 41 and 44 is clamped at the voltage of the low level. Therefore even if the inverter made up of a pair of the PMOS transistor and the NMOS transistor connected in series is used as the output stage instead of the NOR gate 42 shown in FIG. 15 to FIG. 18, the voltage of the low level can be supplied to the inverter in the output stage during the non-operation period, so that it is possible to stabilize the output of the inverter in the output stage and to prevent any penetrate current flowing through the inverter in the output stage.

Still furthermore, because the NOR gate in which the PMOS transistor M41 and the PMOS transistor M42 connected in series is used as the logic gate, it is possible to form the chopper comparator in which the supply of the power source voltage Vdd to the PMOS transistor M42 forming the inverter circuit is controlled by using the PMOS transistor M41 shown in FIG. 15 to FIG. 18. Accordingly, the fourth embodiment has the following effect. It is thereby possible to set the threshold voltage of the inverter circuit formed in each NOR gate to a low voltage value. For example, it is thereby possible to control the ON/OFF operation of the switches SW1, SW11, and SW12 formed only with the NMOS transistor and the PMOS transistor or only with the NMOS transistor within a small voltage range, and to form the switches SW1, SW11, and SW12 with a small size and layout.

Fifth Embodiment

FIG. 19 to FIG. 22 are diagrams showing circuit configurations of a chopper comparator according to a fifth embodiment of the present invention. In the fifth embodiment, the same components of the chopper comparators shown FIG. 1 to FIG. 4 will be referred to with the same reference numbers, and the explanation of the same components is omitted here.

In the chopper comparator of the fifth embodiment, the logic gate in the output stage is controlled using a CNT signal, and the inverter 2 is used as the logic gate in the output stage.

Here, the explanation for the same operation of the chopper comparators, having the configurations-shown in FIG. 1 to FIG. 4 is omitted. The explanation for only the feature of the chopper comparators of the fifth embodiment will now be explained.

Figure 19:
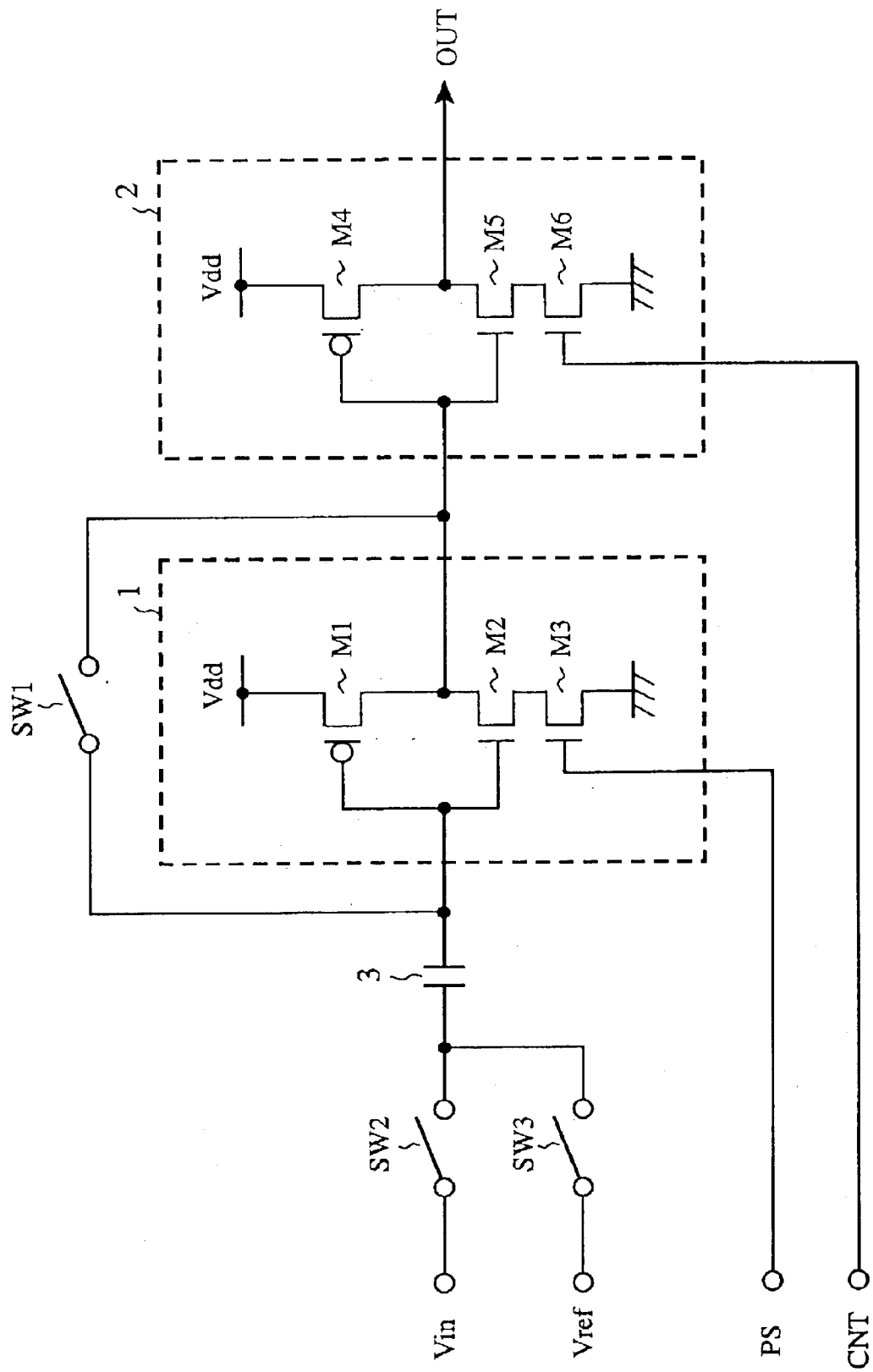
FIG. 19 is a diagram showing a circuit configuration of a chopper comparator according to a fifth embodiment of the present invention.

The inverter 2 shown in FIG. 19 uses a CNT signal which is supplied to the gate of the NMOS transistor M6 therein instead of the PS signal. The inverter 2 shown in FIG. 20 uses a CNT signal which is supplied to the gate of the NMOS transistor M6 therein instead of the PS signal. Similarly, the inverter 2 shown in FIG. 21 uses a CNT signal which is supplied to the gate of the NMOS transistor M6 in the inverter shown in FIG. 3 instead of the PS signal. The inverter 2 shown in FIG. 22 uses a CNT signal which is supplied to the gate of the NMOS transistor M6 in the inverter shown in FIG. 4 instead of the PS signal.

Figure 21:
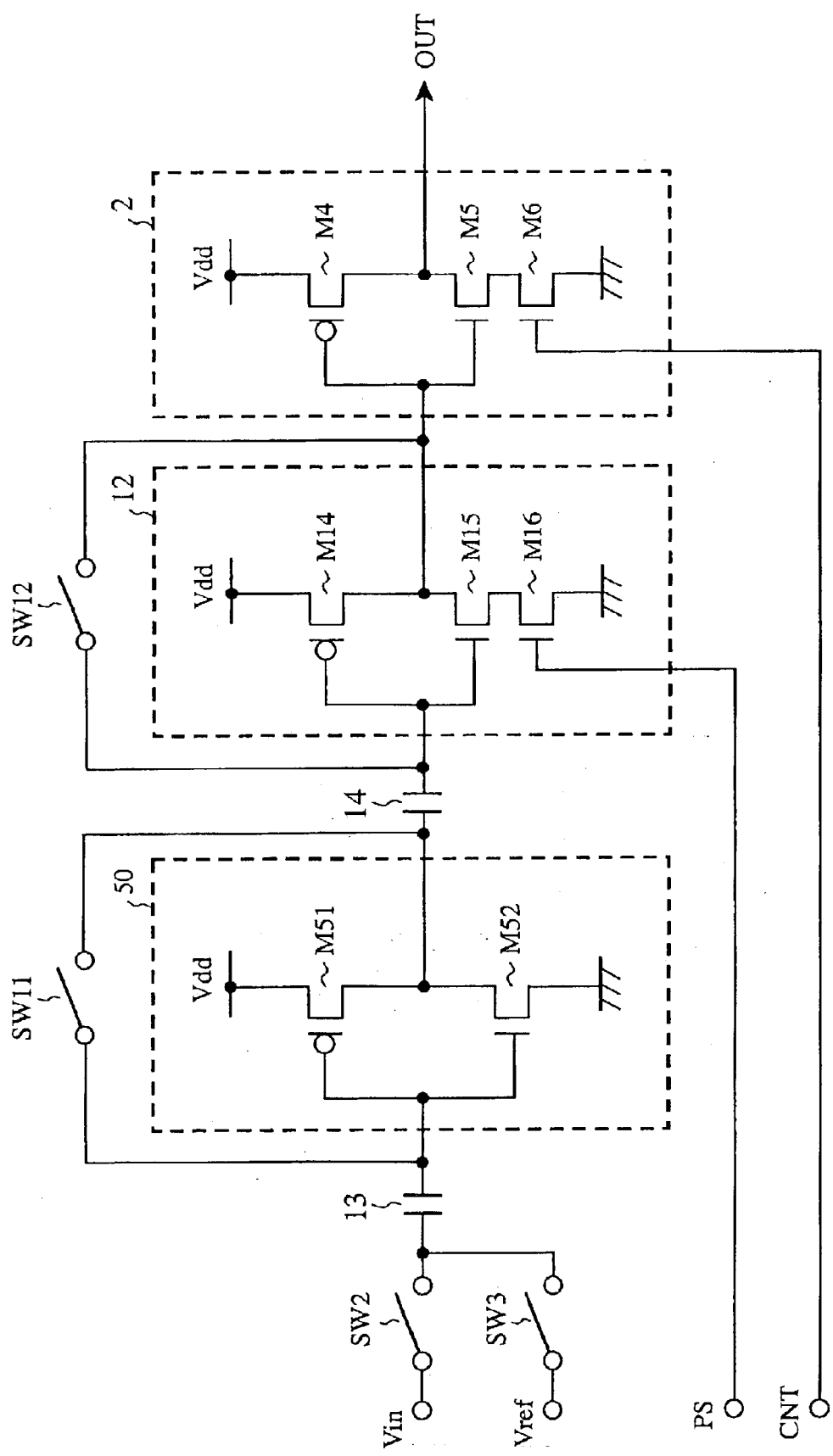
FIG. 21 is a diagram showing another circuit configuration of the chopper comparator according to the fifth embodiment of the present invention.
Figure 22:
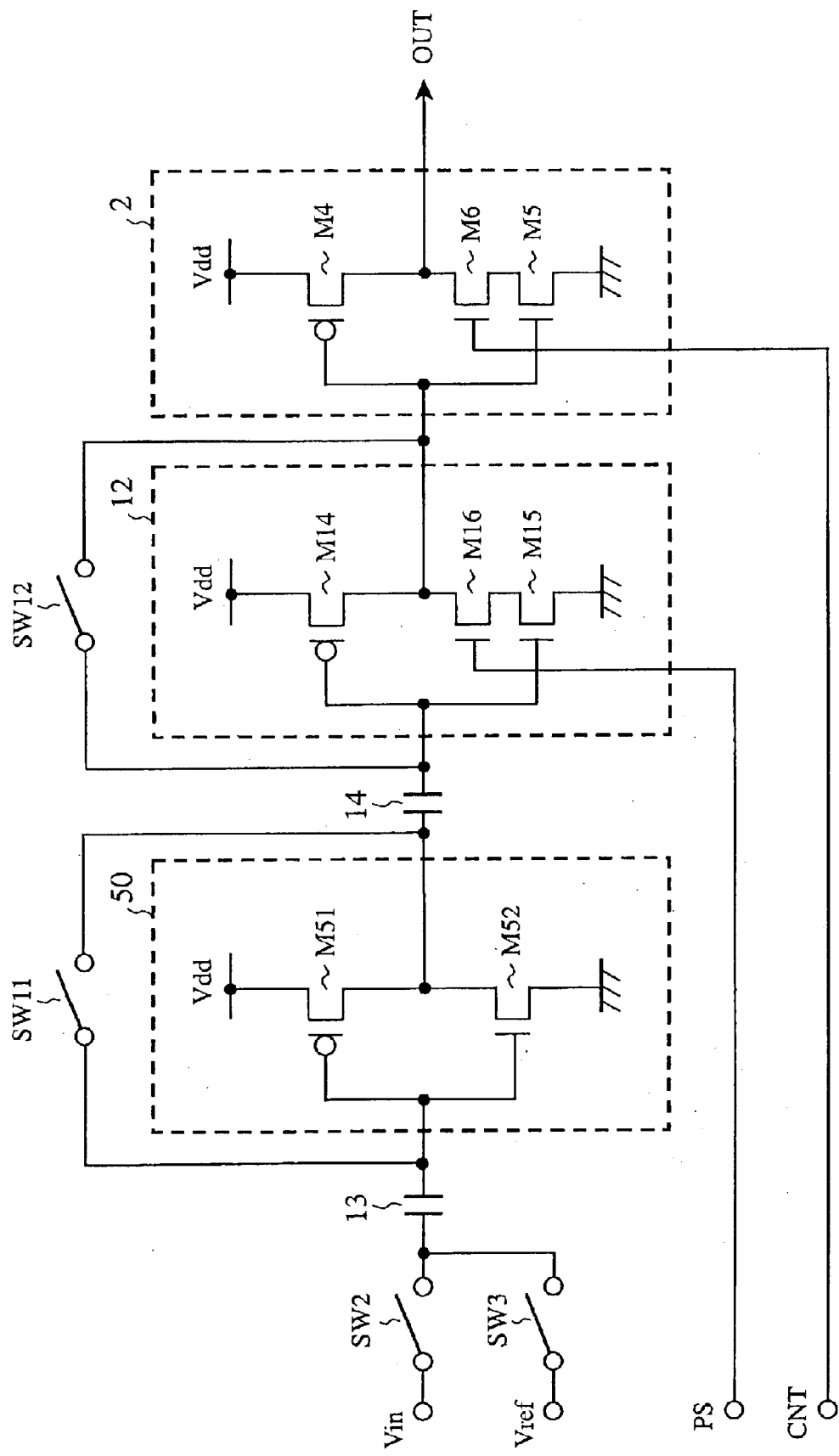
FIG. 22 is a diagram showing another circuit configuration of the chopper comparator according to the fifth embodiment of the present invention.

In FIG. 21 and FIG. 22, the inverter 50 is made up of the PMOS transistor M51 and the NMOS transistor M52 connected in series. The gates of the PMOS transistor M51 and the NMOS transistor M52 are connected to one terminal of the capacitance 13 and one terminal of the switch SW11. This connection node becomes the input section of the inverter 50. Both the drains of the PMOS transistor M51 and the NMOS transistor M52 are connected to the other terminal of the switch SW11. This connection node becomes the output section of the inverter 50. The power source supply Vdd is supplied to the source of the PMOS transistor M51 and the source of the NMOS transistor M52 is grounded. The inverter circuit is made up of the PMOS transistor M51 and the NMOS transistor M52.

The inverters 1 and 2 in the input and output stages have the same size and layout so that the threshold voltages of those inverters 1 and 2 are set to the same value. The inverter 12 in the rear input stage and the inverter 2 in the output stages have the same size and layout so that the threshold voltages of those inverters 12 and 2 are set to the same value.

Next, a description will now be given of the operation of the chopper comparator of the fifth embodiment.

Figure 23:
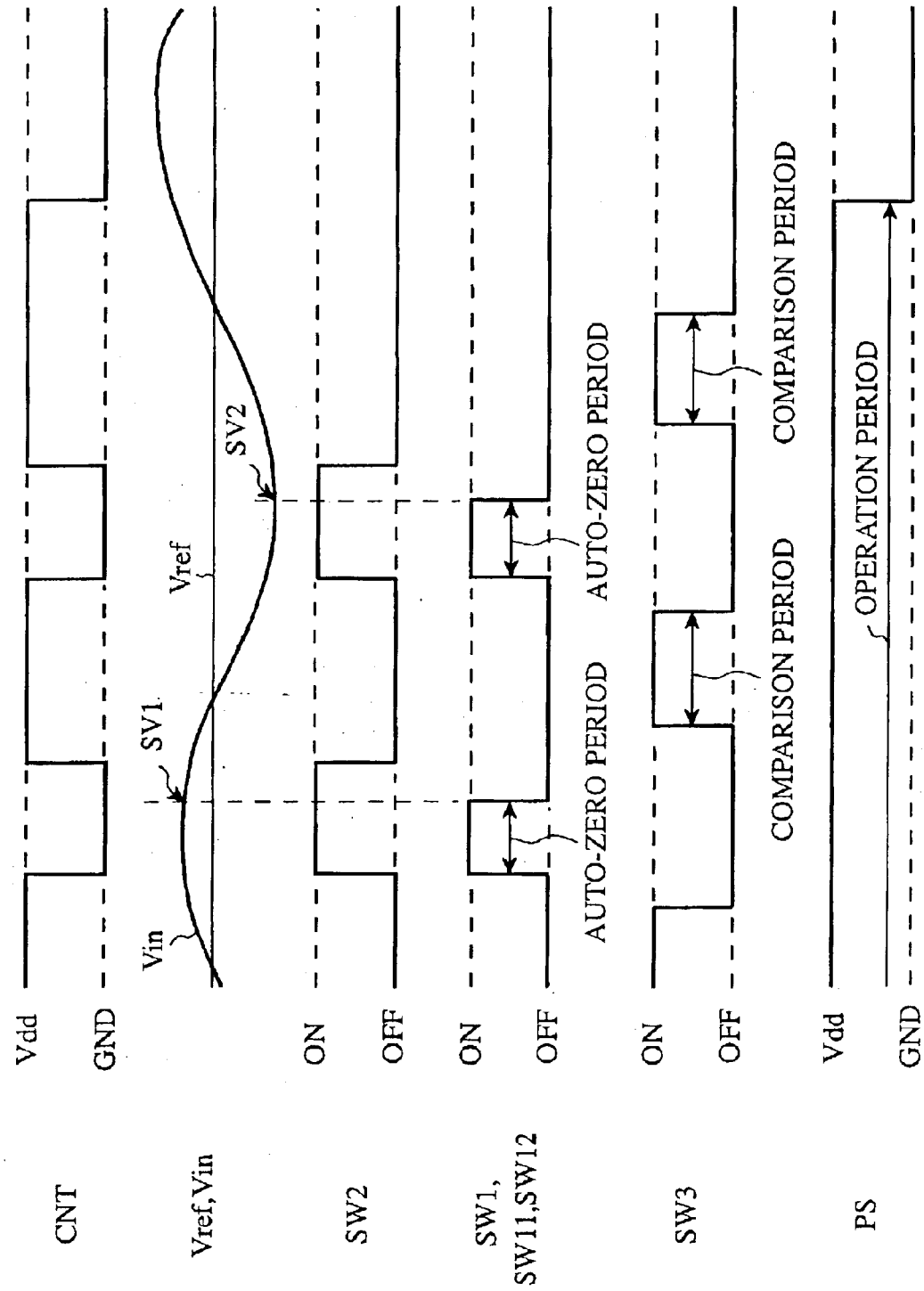
FIG. 23 is a timing chart showing the operation of the chopper comparator according to the fifth embodiment of the present invention.

FIG. 23 is a timing chart showing the operation of the chopper comparator of the fifth embodiment. The chopper comparators shown in FIG. 19 and FIG. 20 can perform the same operation of the chopper comparators shown in FIG. 1 and FIG. 2. The chopper comparators shown in FIG. 21 and FIG. 22 can perform the same operation of the chopper comparators shown in FIG. 3 and FIG. 4. That is, in the chopper comparators shown in FIG. 19 to FIG. 22, each of the switches SW1, SW11, SW12, SW2, and SW3 enters ON and OFF during the auto-zero period and the comparison period shown in the timing chart shown in FIG. 23, like the operation of the chopper comparator of the first embodiment.

Here, the explanation for the same operation of the chopper comparators shown in FIG. 1 to FIG. 4 is omitted. In the following description, only the feature of the chopper comparators shown in FIG. 19 and FIG. 22 will be explained referring to the timing chart shown in FIG. 23.

In the chopper comparators shown in FIG. 19 to FIG. 22, a penetrate current generated in the inverter 2 in the output stage is prevented based on the control of the CNT signal during the ON state of the switch SW2. That is, the inverter 2 prevents any penetrate current flowing through the power source voltage Vdd to the ground even if the voltage which is equal to the threshold voltage is supplied from the inverter 1 in the input stage or the inverter 12 in the rear input stage to the inverter 2 in the output stage while the input voltage Vin is supplied to the capacitance 3 or the capacitance 13 including the auto-zero period where the switch SW1 or the switches SW11 and SW12 are ON.

The CNT signal shown in FIG. 23 can enter the inverter 2 in the output stage into OFF state during the auto-zero period and into ON state during the comparison period.

In the chopper comparator shown in FIG. 19, the PS signal is supplied to the gate of the NMSO transistor M3 forming the inverter 1 in the input stage and the CNT signal is supplied to the gate of the NMOS transistor M6 forming the inverter 2 in the output stage.

The CNT signal shown in FIG. 23 is switched between the high level and the low level during the operation period during the PS signal of the high level. For example, the CNT signal becomes the low level during ON state of the switch SW2, and the high level during OFF state thereof. The CNT signal keeps the low level during the non-operation period other than the operation period, for example.

In the chopper comparator shown in FIG. 19, the switch SW2 enters ON and the input voltage Vin is thereby supplied to the capacitance 3 during the operation period where the PS signal of the high level is supplied to the gate of the NMOS transistor M3 in the inverter 1 in the input stage.

The CNT signal of the low level is supplied to the gate of the NMOS transistor M6 in the inverter 2 at the start of the auto-zero period when the switch SW1 enters ON so that the inverter 1 enters the auto-zero state, so that the NMOS transistor M6 falls into OFF where the path between the source and drain thereof is electrically disconnected. That is, NMOS transistor M5 is disconnected from the ground, so that the inverter 2 becomes OFF.

After the completion of the auto-zero period by entering the switch SW1 OFF, the switch SW2 enters ON, and the CNT signal of the high level is supplied to the gate of the NMOS transistor M6. The NMOS transistor M6 enters thereby ON and the NMOS transistor M5 is connected to the ground through the NMOS transistor M6. The inverter 2 becomes active. In this situation, the comparison period starts by entering the switch SW3 ON.

Figure 20:
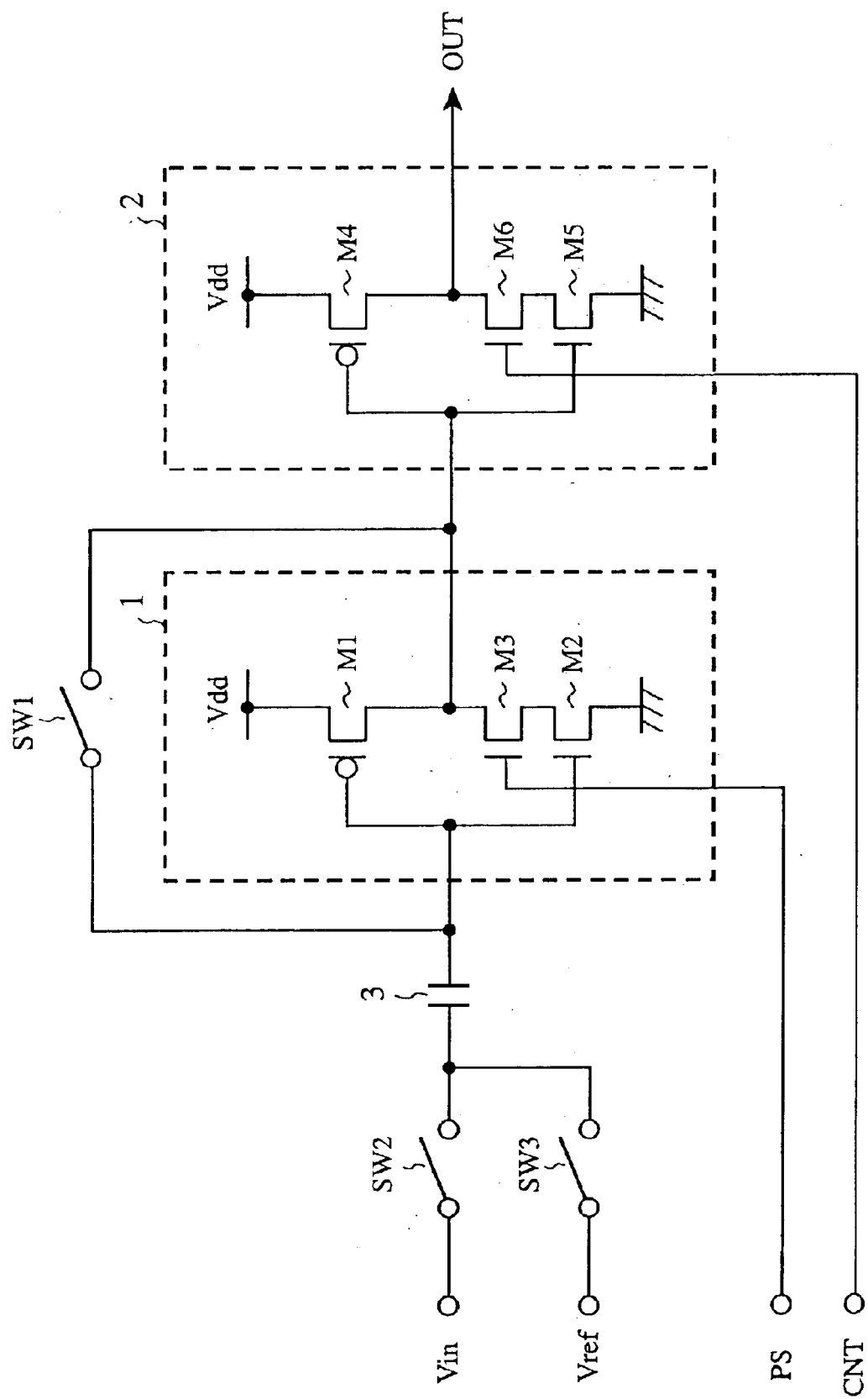
FIG. 20 is a diagram showing another circuit configuration of the chopper comparator according to the fifth embodiment of the present invention.

In the chopper comparator shown in FIG. 20, during the operation period where the PS signal of the high level is supplied to the gate of the NMOS transistor M3 in the inverter 1 in the input stage, the CNT signal of the low level is supplied to the gate of the NMOS transistor M6 in the inverter 2 at the start of the auto-zero period by supplying the input voltage Vin to the capacitance 3 by entering the switch SW2 ON and by entering the switch SW1 ON so that the inverter 1 enters the auto-zero state. The NMSO transistor M6 thereby enters OFF where the path between the source and drain thereof is electrically disconnected. That is, the output section of the inverter 2 is electrically disconnected form the NMOS transistor M5 and the inverter 2 thereby enters OFF.

After the completion of the auto-zero period by entering the switch SW1 OFF, the switch SW2 also enters OFF, and the CNT signal of the high level is supplied to the gate of the NMOS transistor M6. Thereby, the NMOS transistor M6 enters ON, and the output section of the inverter 2 is connected to the NMOS transistor M5, so that this inverter 2 enters ON. After the inverter 2 enters ON and the switch SW3 enters ON, the comparison period is initiated.

In the chopper comparator shown in FIG. 21, during the operation period where the PS signal of the high level is supplied to the gate of the NMOS transistor M16 in the inverter 12 in the rear input stage, the CNT signal of the low level is supplied to the gate of the NMOS transistor M6 in the inverter 2 at the start of the auto-zero period by supplying the input voltage Vin to the capacitance 3 by entering the switch SW2 ON and by entering the switches SW11 and SW12 ON so that the inverter 50 in the front input stage and the inverter 12 in the rear input stage enter the auto-zero state. The NMSO transistor M6 in the inverter 2 thereby enters OFF where the path between the source and drain thereof is electrically disconnected. That is, the NMOS transistor M5 is electrically disconnected form the ground, and the inverter 2 thereby enters OFF.

After the completion of the auto-zero period by entering the switches SW11 and SW12 OFF, the switch SW2 also enters OFF, and the CNT signal of the high level is supplied to the gate of the NMOS transistor M6. Thereby, the NMOS transistor M6 enters ON, and the NMOS transistor M5 is connected to the ground, so that this inverter 2 enters ON. In the state where the inverter 2 enters ON, the switch SW3 enters ON, the comparison period is initiated.

In the chopper comparator shown in FIG. 22, during the operation period where the PS signal of the high level is supplied to the gate of the NMOS transistor M16 in the inverter 12 in the rear input stage, the CNT signal of the low level is supplied to the gate of the NMOS transistor M6 in the inverter 2 at the start of the auto-zero period by supplying the input voltage Vin to the capacitance 13 by entering the switch SW2 ON and by entering the switches SW11 and SW12 ON so that the inverter 50 in the front input stage and the inverter 12 in the rear input stage enter the auto-zero state. The NMSO transistor M6 thereby enters OFF where the path between the source and drain thereof is electrically disconnected. That is, the NMOS transistor M5 is electrically disconnected form the output section n of the inverter 2. The inverter 2 thereby enters OFF.

After the completion of the auto-zero period by entering the switches SW11 and SW12 OFF, the switch SW2 also enters OFF, and the CNT signal of the high level is supplied to the gate of the NMOS transistor M6. Thereby, the NMOS transistor M6 enters ON, and the NMOS transistor M5 is connected to the output section of the inverter 2, so that this inverter 2 enters ON. In the state where the inverter 2 enters ON, the switch SW3 enters ON, the comparison period is thereby initiated.

In addition, when the inverter 1 and the inverter 2 shown in FIG. 19 and FIG. 20 are formed with the same size and layout, the inverter 2 can output the accurate voltage of the high or low level based on the threshold voltage even if the voltage outputted from the inverter 1 is directly supplied to the inverter 2. Similarly, when the inverter 12 and the inverter 2 shown in FIG. 21 and FIG. 22 are formed with the same size and layout, the inverter 2 can output the accurate voltage of the high or low level based on the threshold voltage even if the voltage outputted from the inverter 12 is directly supplied to the inverter 2.

Because each of the chopper comparators shown in FIG. 19 and FIG. 22 is made up of the NMOS transistors of relatively large driving ability connected in series, it is possible to increase the response speed. In particular, when the chopper comparators shown in FIG. 19 and FIG. 21 are formed with an optimum circuit configuration, it is possible to reduce the delay time of the input/output operation in each of the inverters 1 and 2, or 12 and 2, and to apply those chopper comparators to a higher response application.

According to the fifth embodiment, the PS signal is supplied to the inverter 1 in the input stage or the inverter 12 in the rear input stage in order to set the inverter 1 or the inverter 12 to the OFF state during the non-operation period, and the CNT signal is supplied to the inverter 2 in the output stage in order to set the inverter 2 into the OFF state during the auto-zero period. Accordingly, when it is so formed where the inverter 1 in the input stage and the inverter 2 in the output stage or the inverter 12 in the rear input stage and the inverter 2 in the output stage have the same threshold voltage, it is possible to prevent any penetrate current flowing through the inverter 2 in the output stage during the auto-zero period or to prevent any penetrate current flowing through the inverters during the non-operation period even if the voltage which is equal to the threshold voltage is supplied to the input section of the inverter 2 under the auto-zero state of the inverter 1 or the inverter 12. It is therefore possible to increase the comparison accuracy between the input voltage Vin and the reference voltage Vref of the chopper comparator under the condition where the inverters have the same threshold voltage while suppressing the current consumption.

Further, because the inverter 2 is made up of the NMOS transistors of a relatively large driving ability connected in series, the fifth embodiment has the effect that it is possible to increase the response speed of the chopper comparator.

Sixth Embodiment

FIG. 24 to FIG. 27 are diagrams showing circuit configurations of a chopper comparator according to a sixth embodiment of the present invention. In the sixth embodiment, the same components of the chopper comparators shown FIG. 6 to FIG. 9 and FIG. 21 and FIG. 22 will be referred to with the same reference numbers, and the explanation of the same components is omitted here.

In the chopper comparator of the sixth embodiment, the logic gate in the output stage is controlled using a CNT signal, and the inverter 22 is used as the logic gate in the output stage.

Figure 24:
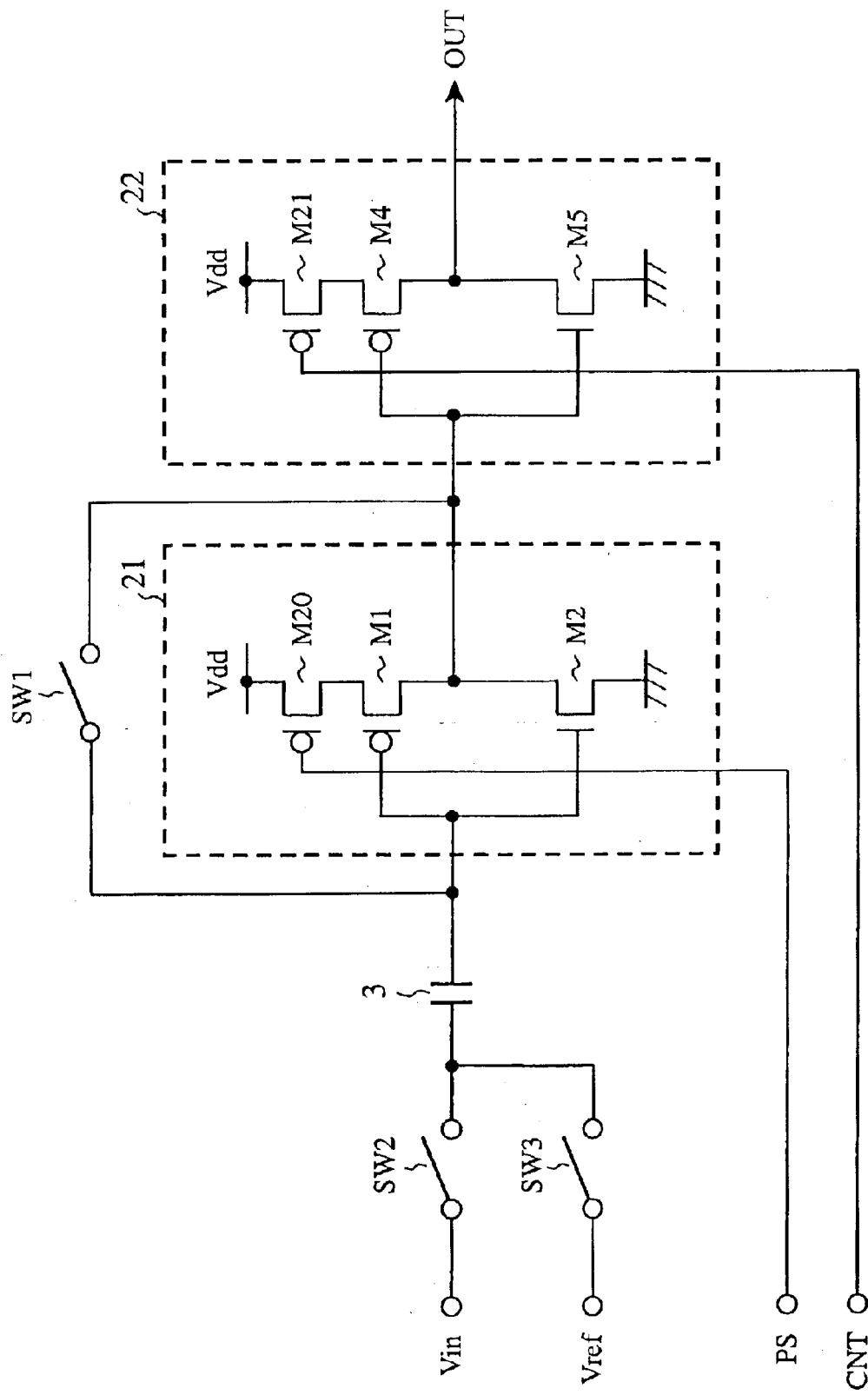
FIG. 24 is a diagram showing a circuit configuration of a chopper comparator according to a sixth embodiment of the present invention.

The inverter 22 shown in FIG. 24 uses a CNT signal which is supplied to the gate of the PMOS transistor M21 in the inverter 22 shown in FIG. 6 instead of the PS signal. The inverter 22 shown in FIG. 25 uses a CNT signal which is supplied to the gate of the PMOS transistor M21 in the inverter 22 shown in FIG. 7 instead of the PS signal. Similarly, the inverter 22 shown in FIG. 26 has the inverter 50 in the front input stage instead of the inverter 23 in the front input stage shown in FIG. 8 and uses a CNT signal which is supplied to the gate of the PMOS transistor M21 in the inverter 22 in the output stage shown in FIG. 8 instead of the PS signal. The inverter 22 shown in FIG. 27 has the inverter 50 in the front input stage instead of the inverter 23 in the front input stage shown in FIG. 9 and uses a CNT signal which is supplied to the gate of the PMOS transistor M21 in the inverter 22 in the output stage shown in FIG. 9 instead of the PS signal.

Figure 25:
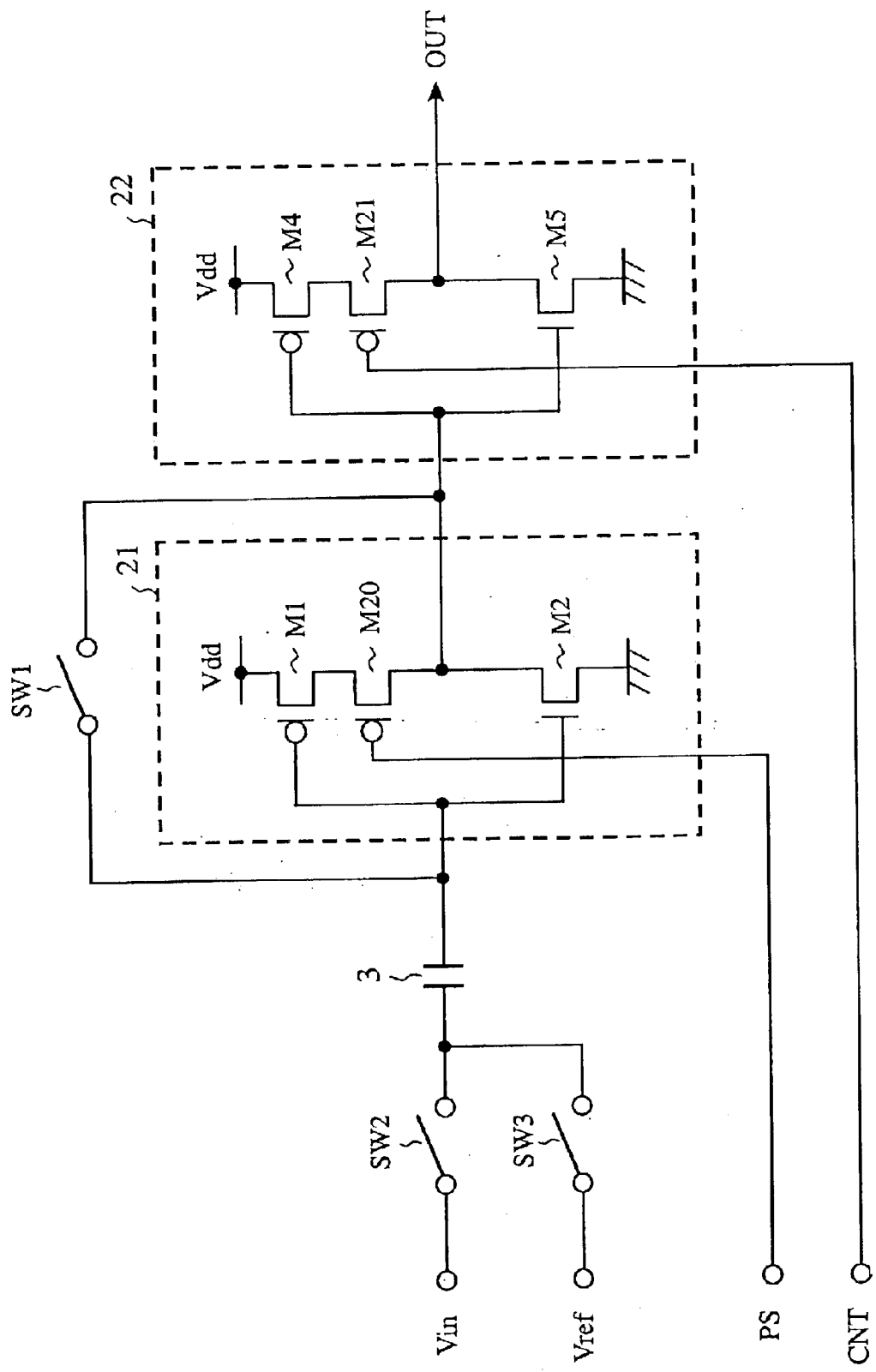
FIG. 25 is a diagram showing another circuit configuration of the chopper comparator according to the sixth embodiment of the present invention.

The inverters 21 and 22 shown in FIG. 24 and FIG. 25 in the input and output stages have the same size and layout so that the threshold voltages of those inverters 21 and 22 are set to the same value. The inverter 24 in the rear input stage and the inverter 22 in the output stage have the same size and layout so that the threshold voltages of those inverters 24 and 22 are set to the same value.

Next, a description will now be given of the operation of the chopper comparator of the sixth embodiment.

Figure 27:
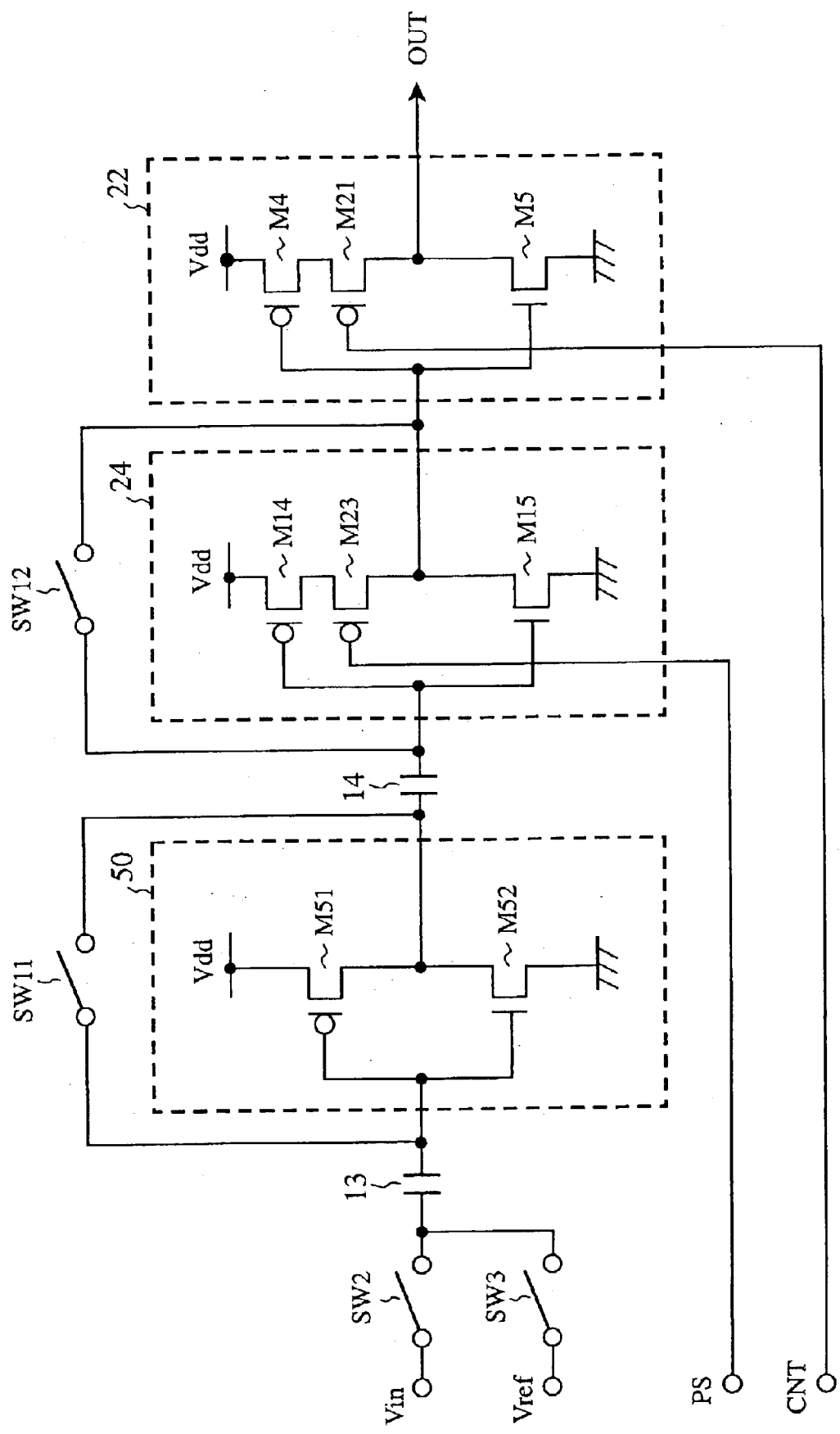
FIG. 27 is a diagram showing another circuit configuration of the chopper comparator according to the sixth embodiment of the present invention.
Figure 28:
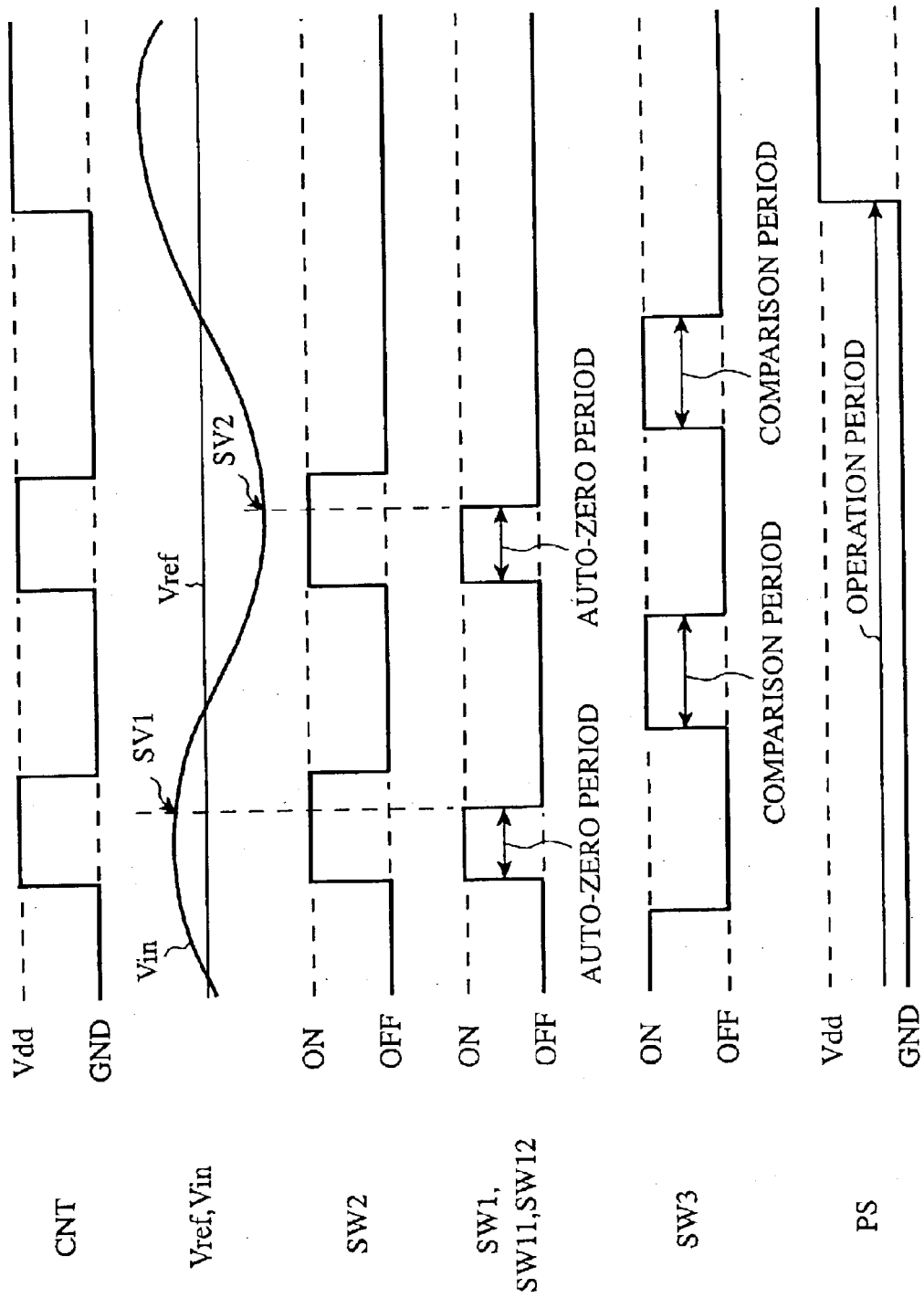
FIG. 28 is a timing chart showing the operation of the chopper comparator according to the sixth embodiment of the present invention.

FIG. 28 is a timing chart showing the operation of the chopper comparator of the sixth embodiment. The chopper comparators shown in FIG. 24 and FIG. 25 can perform the same operation of the chopper comparators shown in FIG. 6 and FIG. 7. The chopper comparators shown in FIG. 26 and FIG. 27 can perform the same operation of the chopper comparators shown in FIG. 8 and FIG. 9. That is, in the chopper comparators shown in FIG. 24 to FIG. 27, each of the switches SW1, SW11, SW12, SW2, and SW3 enters ON and OFF during the auto-zero period in the operation period and the comparison period shown in the timing chart shown in FIG. 28, like the operation of the chopper comparator of the second embodiment.

Here, the explanation for the same operation of the chopper comparators shown in FIG. 6 to FIG. 9 is omitted. In the following description, only the feature of the chopper comparators shown in FIG. 24 and FIG. 27 will be explained referring to the timing chart shown in FIG. 28.

The PS signal and the CNT signal shown in FIG. 24 to FIG. 27 enter the inverter 22 in the output stage into the OFF state during the auto-zero period, and into the ON stage during the comparison period. By supplying those PS and CNT signals into the inverter 22 in the output stage when the switch SW2 enters ON and the input voltage Vin is supplied to the capacitance 3 or 13, it is possible to prevent any penetrate current flowing through the inverter. That is, while the input voltage Vin is supplied to the capacitance 3 or 13 including the auto-zero period where the switch SW1 or the switches SW11 and SW12 enter ON, the inverter 22 can act to prevents any penetrate current flowing from the power supply of the voltage Vdd to the ground even if the voltage which is equal to the threshold voltage is supplied from the inverter 21 in the input stage or the inverter 24 in the rear input stage to the inverter 22 in the output stage.

The voltage level of the CNT signal shown in FIG. 28 is switched in the high and low levels repeatedly every predetermined time interval during the low level of the PS signal indicating the operation period. For example, the high level of the CNT signal indicates the ON state of the switch SW2 and the low level thereof indicates the OFF state of the switch SW2. During the PS signal of the high level indicating the non-operation period other than the operation period, the high level of the CNT signal is maintained, for example.

In the chopper comparator shown in FIG. 24, during the operation period where the PS signal of the low level is supplied to the gate of the PMOS transistor M20 in the inverter 21 in the input stage, the switch SW2 enters ON and the input voltage Vin is thereby supplied to the capacitance 3 and the CNT signal of the high level is supplied to the gate of the PMOS transistor M21 in the inverter 22 at the beginning of the auto-zero period by entering the switch SW1 ON so that the inverter 21 enters the auto-zero state. The PMOS transistor M21 thereby enters OFF where the path between the source and drain thereof is electrically disconnected. That is, the inverter 22 enters OFF because the supply of the power source voltage Vdd to the PMOS transistor M4 is stopped.

After the completion of the auto-zero period when the switch SW1 enters OFF, the switch SW2 also enters OFF, and the CNT signal of the low level is supplied to the gate of the PMOS transistor M21. Thereby, the PMOS transistor M21 enters ON, so that the power source voltage Vdd is supplied to the PMOS transistor M4 and the inverter 22 enters ON. The switch SW3 enters ON under the condition where the inverter 22 enters ON. The comparison period is initiated by this.

In the chopper comparator shown in FIG. 25, during the operation period where the PS signal of the low level is supplied to the gate of the PMOS transistor M20 in the inverter 21 in the input stage, the switch SW2 enters ON and the input voltage Vin is thereby supplied to the capacitance 3 and the CNT signal of the high level is supplied to the gate of the PMOS transistor M21 in the inverter 22 at the beginning of the auto-zero period by entering the switch SW1 ON so that the inverter 21 enters the auto-zero state. The PMOS transistor M21 thereby enters OFF where the path between the source and drain thereof is electrically disconnected. That is, the inverter 22 becomes OFF because the output section of the inverter 22 is electrically disconnected to the PMOS transistor M4.

After the completion of the auto-zero period when the switch SW1 enters OFF, the switch SW2 also enters OFF, and the CNT signal of the low level is supplied to the gate of the PMOS transistor M21. Thereby, the PMOS transistor M21 enters ON, so that the PMOS transistor M4 is electrically connected to the output section of the inverter 22. The inverter 22 thereby enters ON. The switch SW3 enters ON under the condition where the inverter 22 enters ON. The comparison period is initiated by this.

Figure 26:
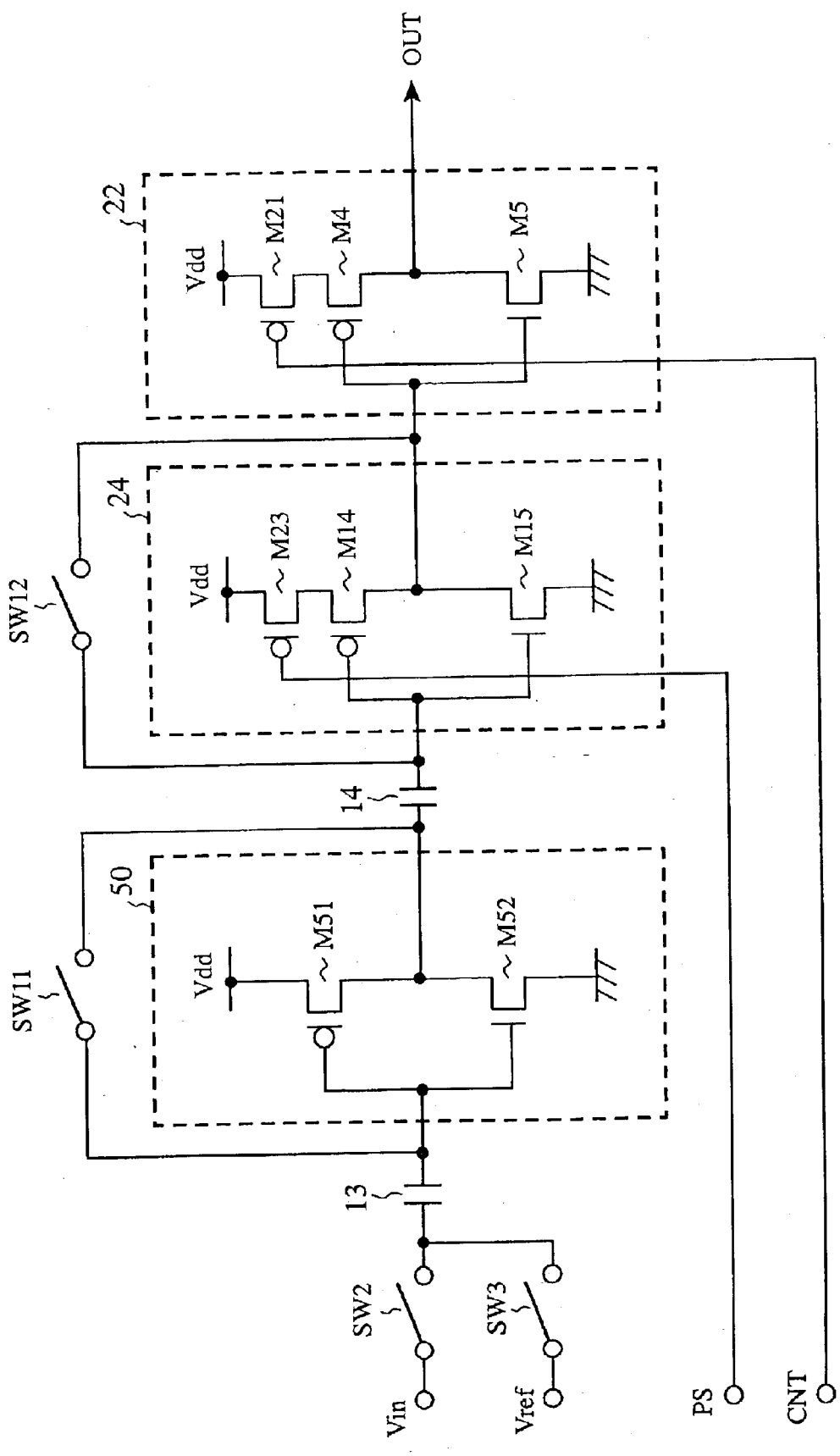
FIG. 26 is a diagram showing another circuit configuration of the chopper comparator according to the sixth embodiment of the present invention.

In the chopper comparator shown in FIG. 26, during the operation period where the PS signal of the low level is supplied to the gate of the PMOS transistor M23 in the inverter 24 in the rear input stage, the switch SW2 enters ON and the input voltage Vin is thereby supplied to the capacitance 13, and the CNT signal of the high level is supplied to the gate of the PMOS transistor M21 in the inverter 22 in the output stage at the beginning of the auto-zero period by entering the switches SW11 and SW12 ON so that the inverter 50 in the front input stage and the inverter 24 in the rear input stage enter the auto-zero state. The PMOS transistor M21 thereby enters OFF where the path between the source and drain thereof is electrically disconnected. That is, the inverter 22 becomes OFF because the supply of the power source voltage Vdd to the PMOS transistor M4 in the inverter 22 is stopped.

After the completion of the auto-zero period when the switches SW11 and SW12 enter OFF, the switch SW2 also enters OFF, and the CNT signal of the low level is supplied to the gate of the PMOS transistor M21. Thereby, the PMOS transistor M21 enters ON, so that the power source voltage Vdd is supplied to the PMOS transistor M4 in the inverter 22. The inverter 22 thereby enters ON. The switch SW3 enters ON under the condition where the inverter 22 enters ON. The comparison period is initiated by this.

In the chopper comparator shown in FIG. 27, during the operation period where the PS signal of the low level is supplied to the gate of the PMOS transistor M23 in the inverter 24 in the rear input stage, the switch SW2 enters ON and the input voltage Vin is thereby supplied to the capacitance 13 and the CNT signal of the high level is supplied to the gate of the PMOS transistor M21 in the inverter 22 at the beginning of the auto-zero period by entering the switches SW11 and SW12 ON so that the inverter 50 in the front input stage and the inverter 24 in the rear input stage enter the auto-zero state. The PMOS transistor M21 thereby enters OFF where the path between the source and drain thereof is electrically disconnected. That is, the inverter 22 becomes OFF because the output section of the inverter 22 is disconnected from the PMOS transistor M4 in the inverter 22.

After the completion of the auto-zero period when the switches SW11 and SW12 enter OFF, the switch SW2 also enters OFF, and the CNT signal of the low level is supplied to the gate of the PMOS transistor M21 in the inverter 22. Thereby, the PMOS transistor M21 enters ON, so that the PMOS transistor M4 is connected to the output section of the inverter 2. The inverter 22 thereby enters ON. The switch SW3 enters ON under the condition where the inverter 22 enters ON. The comparison period is initiated by this.

In particular, when the chopper comparators shown in FIG. 24 and FIG. 26 are formed with an optimum circuit configuration, it is possible to reduce the delay time of the input/output operation in each of the inverters 21 and 22 or in the inverters 24 and 22, and to apply those chopper comparators to a higher response application while suppressing the current consumption.

According to the sixth embodiment, the PS signal is supplied to the inverter 21 in the input stage or the inverter 24 in the rear input stage in order to set the inverter 21 or inverter 24 to the OFF state during the non-operation period, and the CNT signal is supplied to the inverter 22 in the output stage in order to set the inverter 22 into the OFF state during the auto-zero period. Accordingly, when it is so formed where the inverter 21 in the input stage and the inverter 22 in the output stage or the inverter 24 in the rear input stage and the inverter 22 in the output stage have the same threshold voltage, it is possible to prevent any penetrate current flowing through the inverter 22 in the output stage during the auto-zero period in the operation period or to prevent any penetrate current flowing through the inverters during the non-operation period even if the voltage which is equal to the threshold voltage is supplied to the input section of the inverter 22 under the auto-zero state of the inverter 21 or the inverter 24. It is therefore possible to suppress the current consumption.

The sixth embodiment has the effect that it is therefore possible to increase the comparison accuracy between the input voltage Vin and the reference voltage Vref of the chopper comparator under the condition where the inverters 21 and 22 connected in series and the inverters 24 and 22 connected in series have the same threshold voltage while suppressing the current consumption.

In addition, because the chopper comparator of the sixth embodiment is so formed where each pair of the PMOS transistors M1 and M2, the PMOS transistors M4 and M21, and the PMOS transistors M14 and M23 are directly connected, respectively so that the PMOS transistors M1, M4, and M14 forming the inverters 21, 22, and, 24, respectively is electrically connected and disconnected, it is possible to set the threshold voltage of each inverter to a small value. For example, it is thereby possible to control the ON/OFF operation of the switches SW1, SW11, and SW12 formed only with the NMOS transistor and the PMOS transistor or only with the NMOS transistor within a small voltage range, and to form the switches SW1, SW11, and SW12 with a small size and layout.

Seventh Embodiment

FIG. 29 to FIG. 32 are diagrams showing circuit configurations of a chopper comparator according to a seventh embodiment of the present invention. In the seventh embodiment, the same components of the chopper comparators shown FIG. 11 to FIG. 14 and FIG. 21 and FIG. 22 will be referred to with the same reference numbers, and the explanation of the same components is omitted here.

In the chopper comparator of the seventh embodiment, the logic gate in the output stage is controlled using a CNT signal, and a NAND gate 32 is used as the logic gate in the output stage, for example.

Figure 29:
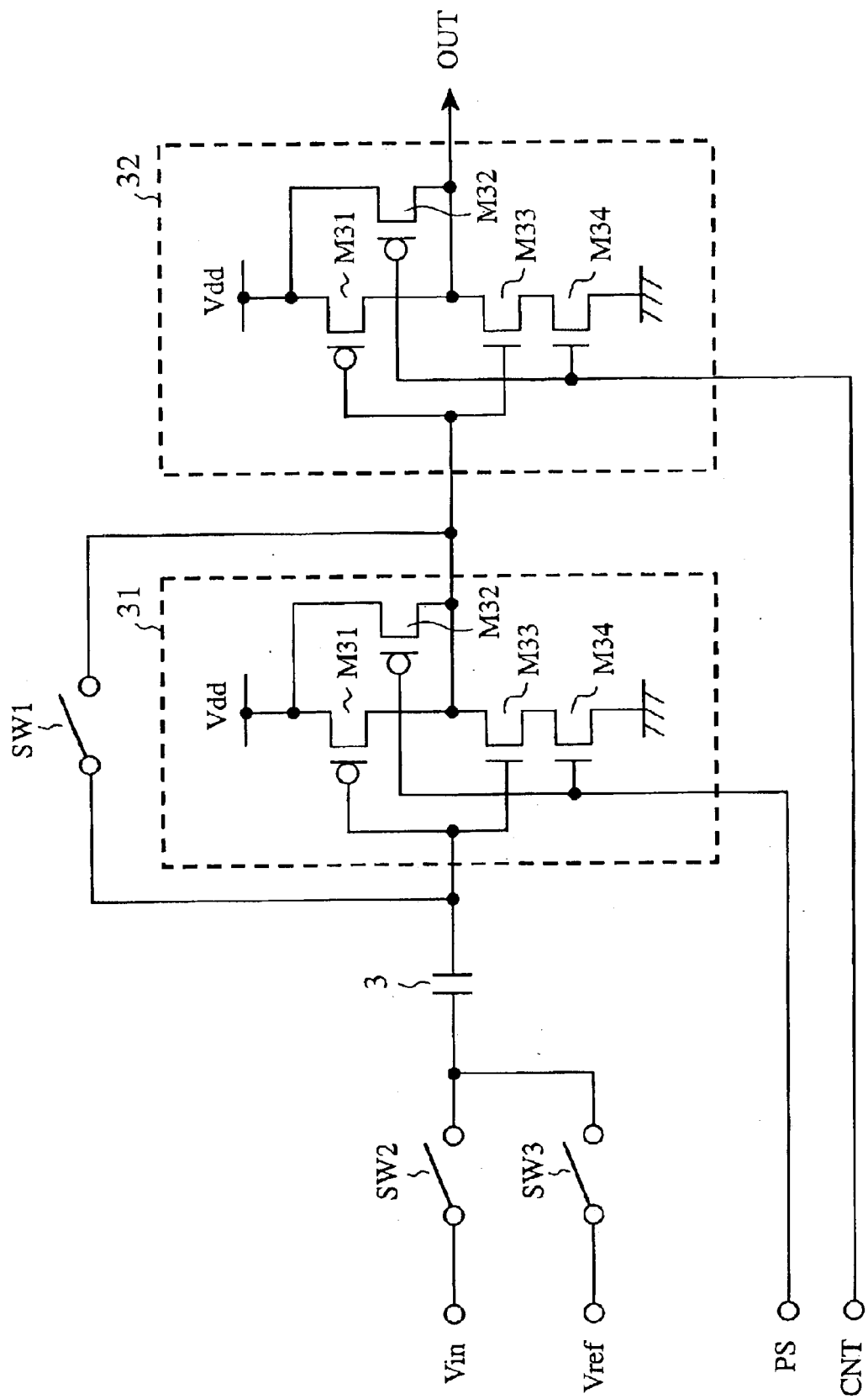
FIG. 29 is a diagram showing a circuit configuration of a chopper comparator according to a seventh embodiment of the present invention.

The NAND gate 32 shown in FIG. 29 uses a CNT signal which is supplied to the gates of the PMOS transistor M32 and the NMOS transistor M34 in the NAND gate 32 shown in FIG. 11 instead of the PS signal. The NAND gate 32 shown in FIG. 30 uses a CNT signal which is supplied to the gates of the PMOS transistor M32 and the NMOS transistor M33 in the NAND gate 32 shown in FIG. 12 instead of the PS signal.

Figure 31:
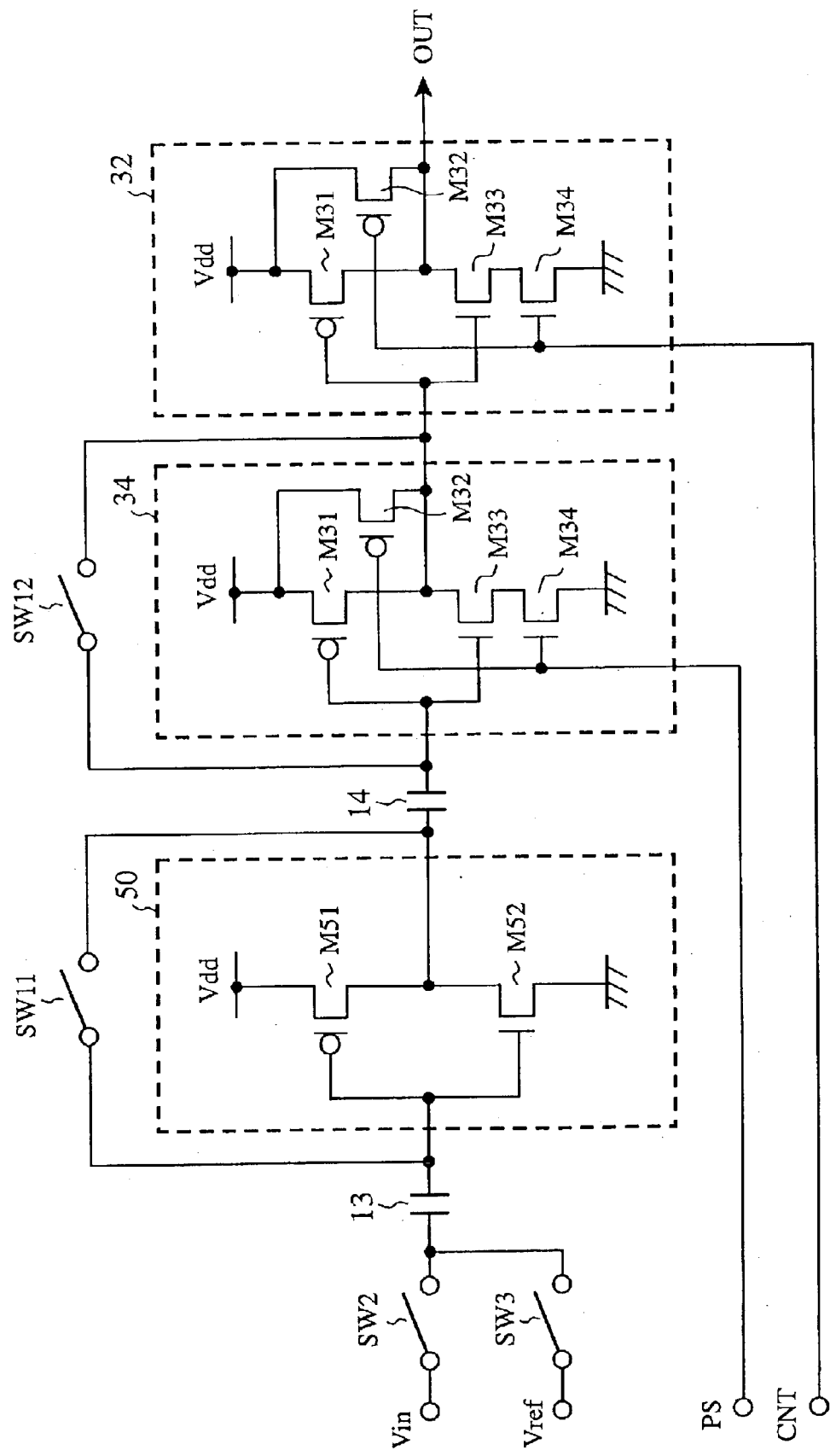
FIG. 31 is a diagram showing another circuit configuration of the chopper comparator according to the seventh embodiment of the present invention.

The input section of the NAND gate 33 shown in FIG. 31 is connected to the inverter 50 in the front input stage instead of the NAND gate 33 in the front input stage in the case shown in FIG. 13. The CNT signal is supplied to both the gate of the PMOS transistor M32 and the gate of the NMOS transistor M34 in the NAND gate 32 in the output stage instead of the PS signal in the case shown in FIG. 13.

Figure 32:
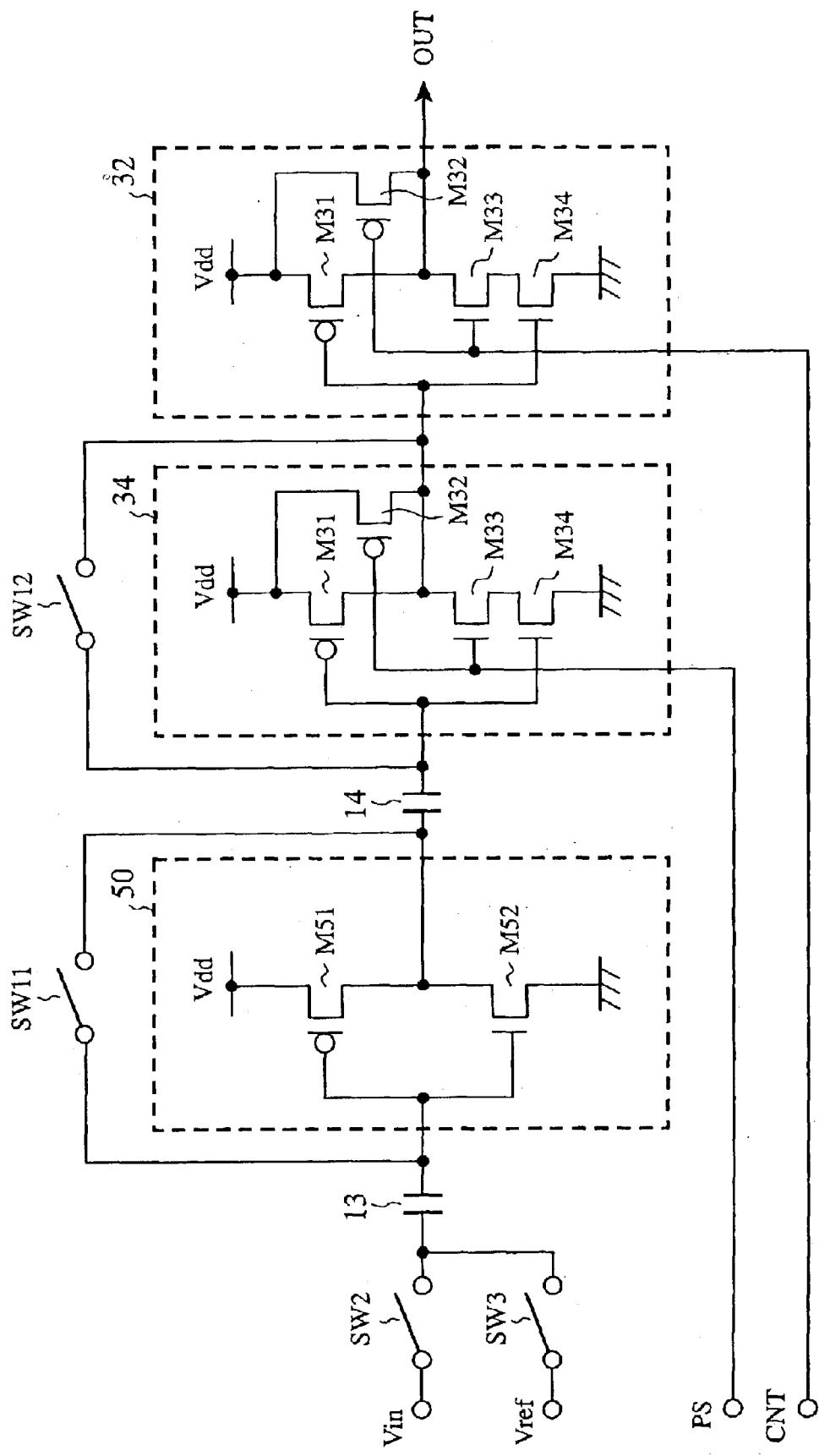
FIG. 32 is a diagram showing another circuit configuration of the chopper comparator according to the seventh embodiment of the present invention.

In addition, the input section of the NAND gate 32 shown in FIG. 32 is connected to the inverter 50 in the front input stage instead of the NAND gate 33 in the front input stage in the case shown in FIG. 14. The CNT signal is supplied to both the gate of the PMOS transistor M32 and the gate of the NMOS transistor M33 in the NAND gate 32 in the output stage instead of the PS signal in the case shown in FIG. 14.

Figure 30:
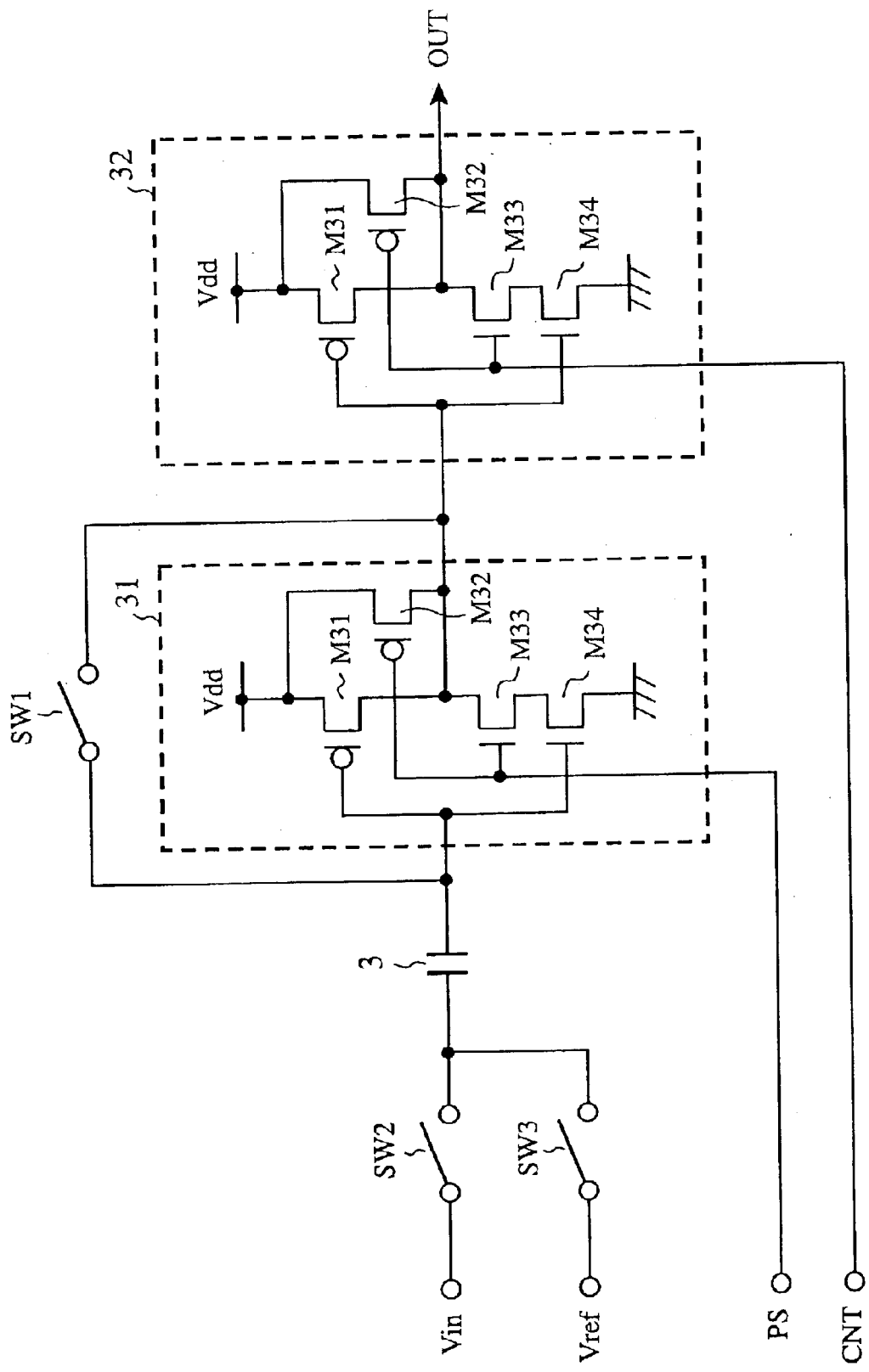
FIG. 30 is a diagram showing another circuit configuration of the chopper comparator according to the seventh embodiment of the present invention.

Further, the NAND gates 31 and 32 in the input and output stages shown in FIG. 29 and FIG. 30 have the same size and layout so that the threshold voltages of those NAND gates 31 and 32 set to the same value. The NAND gate 34 in the rear input stage and the NAND gate 32 in the output stage shown in FIG. 31 and FIG. 32 have the same size and layout so that the threshold voltages of those NAND gates 34 and 32 are set to the same value.

Next, a description will now be given of the operation of the chopper comparator of the seventh embodiment.

The chopper comparators shown in FIG. 29 and FIG. 30 can perform the same operation of the chopper comparators shown in FIG. 19 and FIG. 20. The chopper comparators shown in FIG. 31 and FIG. 32 can perform the same operation of the chopper comparators shown in FIG. 21 and FIG. 22. That is, the chopper comparators shown in FIG. 29 to FIG. 32 can perform the same operation of the chopper comparators of the fifth embodiment, where the ON/OFF operation of the switches SW1, SW11, SW12, SW2, and SW3 are controlled in the auto-zero period and comparison period shown in the timing chart shown in FIG. 23. Here, the explanation for the same operation of the chopper comparators having the configurations shown in FIG. 19 to FIG. 22 is omitted. The explanation for only the feature of the chopper comparators shown in FIG. 29 to FIG. 32 will now be explained.

The chopper comparators shown in FIG. 29 to FIG. 32 receive the PS signal and the CNT signal shown in FIG. 23, and the NAND gate 32 in the output stage enters OFF during the auto-zero period and ON during the comparison period based on this CNT signal. The NAND gate 32 in the output stage enters OFF when the switch SW2 enters ON in order to prevent any penetrate current flowing through the NAND gate 32.

In the chopper comparator shown in FIG. 29, during the operation period where the PS signal of the high level is supplied to the PMOS transistor M32 in the NAND gate 31 and the gate of the NMOS transistor M34 in the input stage, the switch SW2 enters ON and the input voltage Vin is thereby supplied to the capacitance 3. Further, when the auto-zero period is initiated by entering the switch SW1 ON so that the inverter circuit in the NAND gate 31 enters the auto-zero state, the CNT signal of the low level is supplied to the gates of the PMOS transistor M32 and the NMOS transistor M34 in the NAND gate 32, and a short circuit of the source and drain in the PMOS transistor M31 occurs, and the path between the source and drain in the NMOS transistor M34 is disconnected. That is, a short circuit of the source and drain in the PMOS transistor M31 occurs, and the NMOS transistor is disconnected from the ground. The inverter circuit in the NAND gate 32 becomes OFF under the condition where the power source voltage Vdd is supplied to the output section of the NAND gate 32 through the PMOS transistor M32.

When the auto-zero period is completed by entering the switch SW1 OFF, the switch SW2 also enters OFF, and the CNT signal of the high level is supplied to the gates of the PMOS transistor M32 and the NMSO transistor M34 in the NAND gate 32. Thereby, the PMOS transistor M32 enters OFF, so that no short circuit of the source and drain in the PMOS transistor M31 occurs and the output section of the NAND gate 32 is disconnected from the power source voltage Vdd. The NMOS transistor M34 enters ON and the NMOS transistor M33 is connected to the ground. The inverter circuit in the NAND gate 32 thereby enters ON. Thus, after the inverter circuit in the NAND gate 32 enters ON, the switch SW3 enters ON. The comparison period is initiated by this.

In the chopper comparator shown in FIG. 30, during the operation period where the PS signal of the high level is supplied to the gates of the PMOS transistor M32 and the NMOS transistor M33 in the inverter 31 in the input stage, the switch SW2 enters ON and the input voltage Vin is thereby supplied to the capacitance 3. Further, when the auto-zero period is initiated by entering the switch SW1 ON so that the inverter circuit in the NAND gate 31 enters the auto-zero state, the CNT signal of the low level is supplied to the gates of the PMOS transistor M32 and the NMOS transistor M33 in the NAND gate 32, and the path between the source and drain of the PMOS transistor M32 is electrically connected, and the path between the source and drain in the NMOS transistor M33 is electrically disconnected. That is, a short circuit of the source and drain in the PMOS transistor M31 occurs, and the NMOS transistor M34 is disconnected from the output section of the NAND gate 32. The inverter circuit in the NAND gate 32 becomes OFF under the condition where the power source voltage Vdd is supplied to the output section of the NAND gate 32 through the PMOS transistor M32.

When the auto-zero period is completed by entering the switch SW1 OFF, the switch SW2 also enters OFF, and the CNT signal of the high level is supplied to the gates of the PMOS transistor M32 and the NMOS transistor M33 in the NAND gate 32. Thereby, the PMOS transistor M32 enters OFF, so that no short circuit of the source and drain in the PMOS transistor M31 occurs and the output section of the NAND gate 32 is disconnected from the power source voltage Vdd. The NMOS transistor M33 enters ON, and the NMOS transistor M33 is connected to the output section of the NAND gate 32. The inverter circuit in the NAND gate 32 thereby enters ON. Thus, after the inverter circuit in the NAND gate 32 enters ON, the switch SW3 enters ON. The comparison period is initiated by this.

In the chopper comparator shown in FIG. 31, during the operation period where the PS signal of the high level is supplied to the PMOS transistor M32 and the gate of the NMOS transistor M34 in the NAND gate 34 in the rear input stage, the switch SW2 enters ON and the input voltage Vin is thereby supplied to the capacitance 13. Further, when the auto-zero period is started by entering the switches SW11 and SW12 ON so that the inverter circuits in the inverter 50 in the front input stage and in the NAND gate 34 in the rear input stage enter the auto-zero state, the CNT signal of the low level is supplied to the gates of the PMOS transistor M32 and the NMOS transistor M34 in the NAND gate 32 in the output stage, and the PMOS transistor M32 enters ON where the path between the source and drain thereof is electrically connected, and the path between the source and drain in the NMOS transistor M34 is disconnected. That is, a short circuit of the source and drain in the PMOS transistor M31 occurs, and the NMOS transistor M33 is disconnected from the ground. The inverter circuit in the NAND gate 32 becomes OFF under the condition where the power source voltage Vdd is supplied to the output section of the NAND gate 32 through the PMOS transistor M32.

When the auto-zero period is completed by entering the switches SW11 and SW12 OFF, the switch SW2 also enters OFF, and the CNT signal of the high level is supplied to the gates of the PMOS transistor M32 and the NMSO transistor M34. Thereby, the PMOS transistor M32 enters OFF, so that no short circuit of the source and drain in the PMOS transistor M31 occurs and the output section of the NAND gate 32 is disconnected from the power source voltage Vdd. The NMOS transistor M34 enters ON and the NMOS transistor M33 is connected to the ground. The inverter circuit in the NAND gate 32 thereby enters ON. Thus, after the inverter circuit in the NAND gate 32 enters ON, the switch SW3 enters ON. The comparison period is initiated by this.

In the chopper comparator shown in FIG. 32, during the operation period where the PS signal of the high level is supplied to the PMOS transistor M32 in the NAND gate 34 and the gate of the NMOS transistor M33 in the rear input stage, the switch SW2 enters ON and the input voltage Vin is thereby supplied to the capacitance 13. Further, when the auto-zero period is started by entering the switches SW11 and SW12 ON so that the inverter 50 in the front input stage and the inverter circuit in the NAND gate 34 in the rear input stage enter the auto-zero state, the CNT signal of the low level is supplied to the gates of the PMOS transistor M32 and the NMOS transistor M33 in the NAND gate 32, and the PMOS transistor M32 enters ON where the source is electrically connected to the drain thereof, and the path between the source and drain in the NMOS transistor M33 is electrically disconnected. That is, a short circuit of the source and drain in the PMOS transistor M31 occurs, and the output section of the NAND gate 32 is disconnected from the NMOS transistor M34. The inverter circuit in the NAND gate 32 becomes OFF under the condition where the power source voltage Vdd is supplied to the output section of the NAND gate 32 through the PMOS transistor M32.

When the auto-zero period is completed by entering the switches SW11 and SW12 OFF, the switch SW2 also enters OFF, and the CNT signal of the high level is supplied to the gates of the PMOS transistor M32 and the NMSO transistor M33. Thereby, the PMOS transistor M32 enters OFF, so that no short circuit of the source and drain in the PMOS transistor M31 occurs and the output section of the NAND gate 32 is disconnected from the power source voltage Vdd. The NMOS transistor M33 enters ON where the source is electrically connected to the drain thereof, and the NMOS transistor M34 is connected to the output section of the inverter circuit in the NAND gate 32. The inverter circuit in the NAND gate 32 thereby enters ON. Thus, after the inverter circuit in the NAND gate 32 enters ON, the switch SW3 enters ON. The comparison period is initiated by this.

In particular, when the chopper comparators shown in FIG. 29 and FIG. 31 are formed with an optimum circuit configuration, it is possible to reduce the delay time of the input/output operation in each of the inverters 31, 32, 34, and 32 and to apply those chopper comparators to a higher response application.

According to the seventh embodiment, the PS signal is supplied to the NAND gate 31 in the input stage and the NAND gate 34 in the rear input stage in order to set the inverter circuit in the NAND gate 31 or the inverter circuit in the NAND gate 34 into the OFF state during the non-operation period, and the CNT signal is supplied to the NAND gate 32 in the output stage in order to set the inverter circuit in the NAND gate 32 into the OFF state during the auto-zero period. Accordingly, when it is so formed where the inverter circuit in the NAND gate 31 in the input stage and the inverter circuit in the NAND gate 32 in the output stage, or the inverter circuit in the NAND gate 34 in the rear input stage and the inverter circuit in the NAND gate 32 in the output stage have the same threshold voltage, it is possible to prevent any penetrate current flowing through the inverter circuit in the NAND gate 32 in the output stage during the auto-zero period or to prevent any penetrate current flowing through the inverter circuit in each NAND gate during the non-operation period, because the inverter circuit in the NAND gate 34 in the input stage and the inverter circuit in the NAND gate 32 in the output stage become the auto-zero state even if the voltage which is equal to the threshold voltage is supplied to the input section of the inverter circuit in the NAND gate 32 in the output stage. It is therefore possible to suppress the current consumption.

The seventh embodiment has the effect that it is therefore possible to suppress the current consumption of the chopper comparator while increasing the comparison accuracy between the input voltage Vin and the reference voltage Vref of the chopper comparator under the condition where the inverter 21 in the NAND gate 31 in the input stage and the inverter circuit of the NAND gate 32 in the output stage have the same threshold voltage and the inverter circuit in the NAND gate 34 in the rear input stage and the inverter circuit of the NAND gate 32 in the output stage have the same threshold voltage.

Furthermore, because the NAND gate is used as the logic gate and the PMOS transistors of a relatively small driving ability connected in parallel and the NMSO transistors of a large driving ability connected in series, the seventh embodiment has the effect that it is possible to reduce the delay time between the input/output of the chopper comparator and to obtain a high response speed in input/output operation.

Eighth Embodiment

FIG. 32 to FIG. 36 are diagrams showing circuit configurations of a chopper comparator according to a eighth embodiment of the present invention. In the eighth embodiment, the same components of the chopper comparators shown FIG. 15 to FIG. 18 and FIG. 21 and FIG. 22 will be referred to with the same reference numbers, and the explanation of the same components is omitted here.

In the chopper comparator of the eighth embodiment, the logic gate in the output stage is controlled using a CNT signal, and a NOR gate 42 is used as the logic gate in the output stage, for example.

Figure 33:
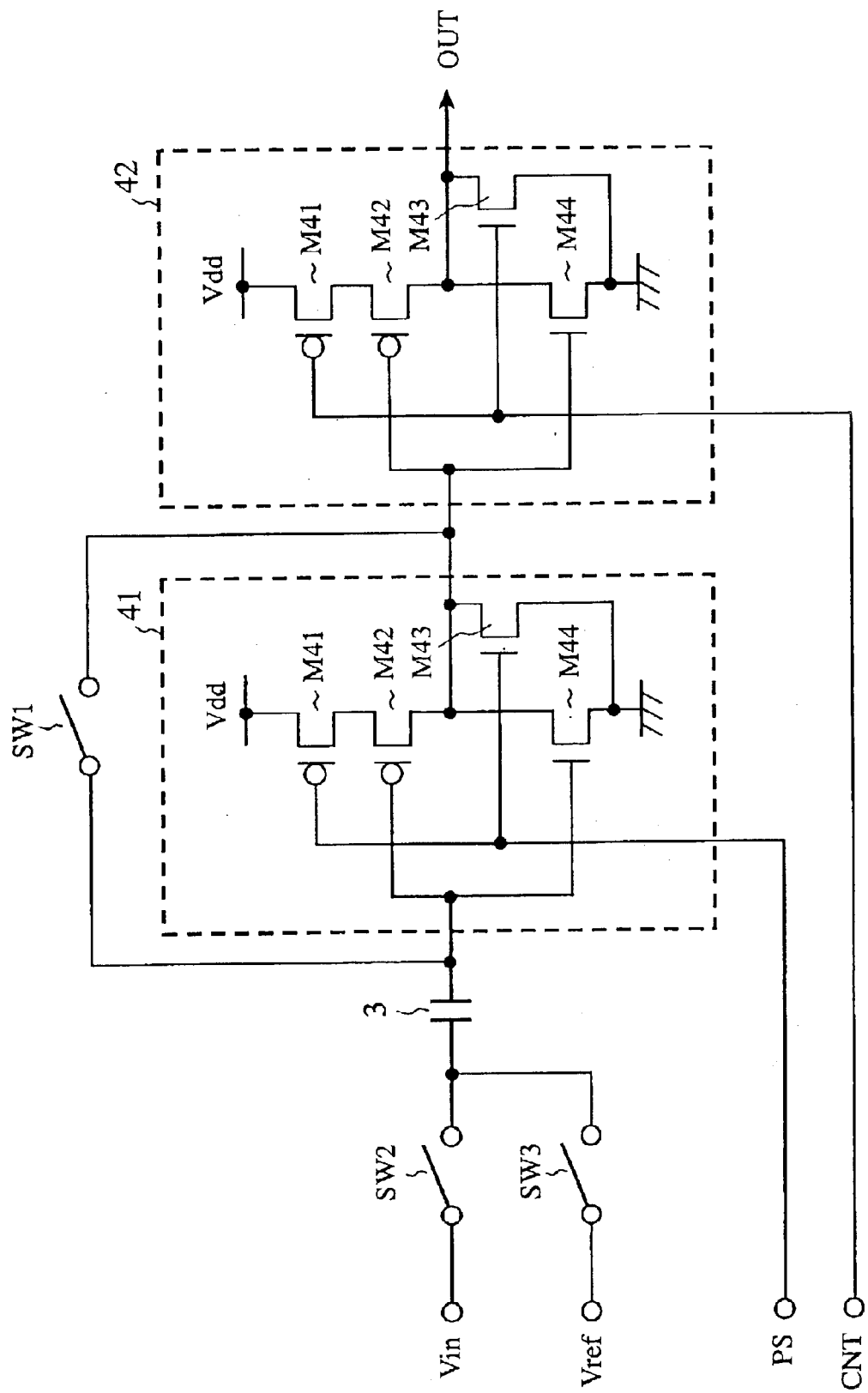
FIG. 33 is a diagram showing a circuit configuration of a chopper comparator according to an eighth embodiment of the present invention.

The NOR gate 42 shown in FIG. 33 uses a CNT signal, instead of the PS signal, which is supplied to the gates of the PMOS transistor M41 and the NMOS transistor M43 in the NOR gate 42 shown in FIG. 15 instead of the PS signal. The NOR gate 42 shown in FIG. 34 uses a CNT signal which is supplied to the gates of the PMOS transistor M42 and the NMOS transistor M43 in the NOR gate 42 shown in FIG. 16.

Figure 35:
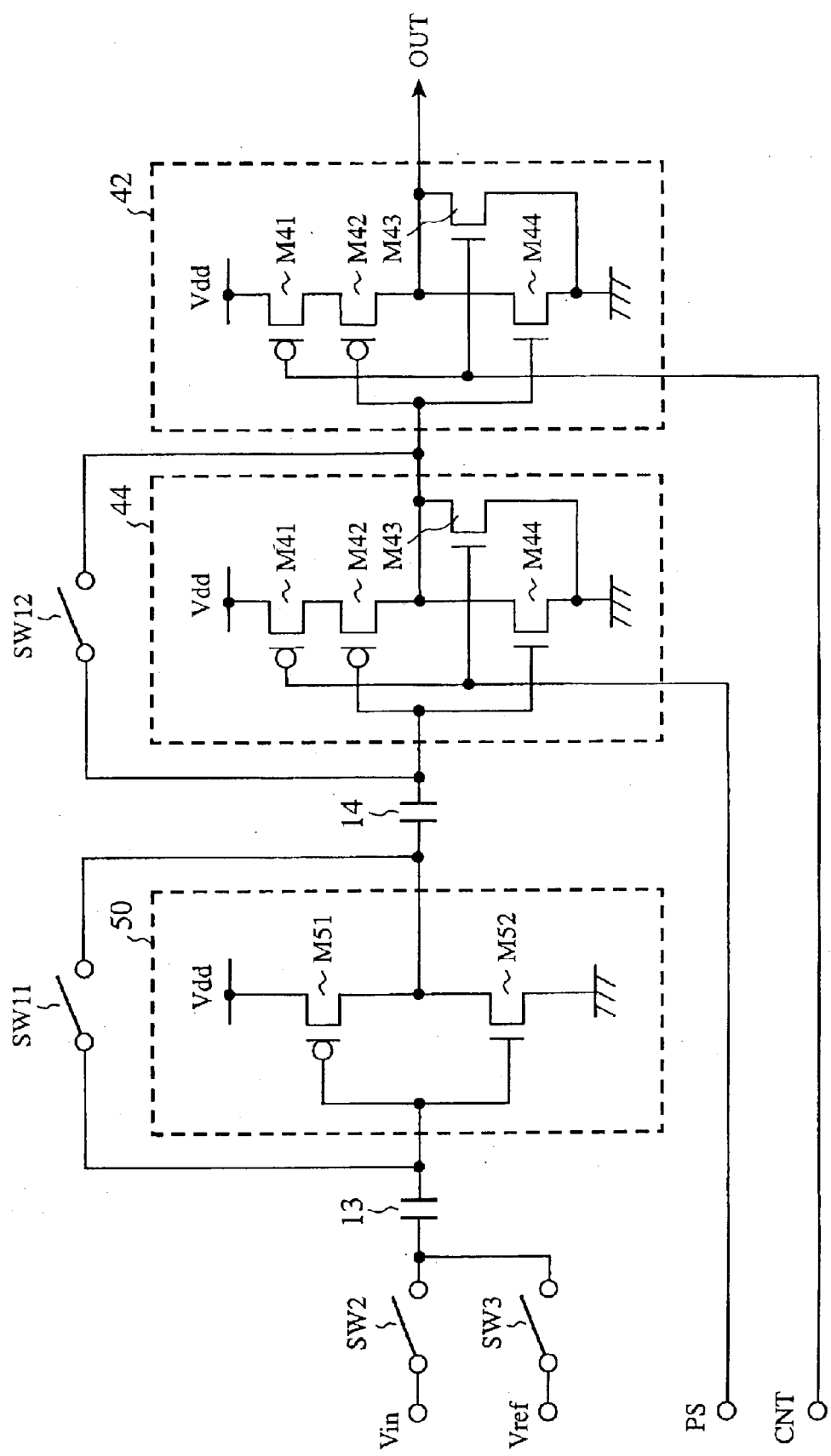
FIG. 35 is a diagram showing another circuit configuration of the chopper comparator according to the eighth embodiment of the present invention.

The input section of the NOR gate 42 shown in FIG. 35 is connected to the inverter 50 in the front input stage instead of the NAND gate 43 in the front input stage in the case shown in FIG. 17. The CNT signal is supplied to both the gate of the PMOS transistor M41 and the gate of the NMOS transistor M43 in the NOR gate 42 in the output stage instead of the PS signal in the case shown in FIG. 17.

Figure 36:
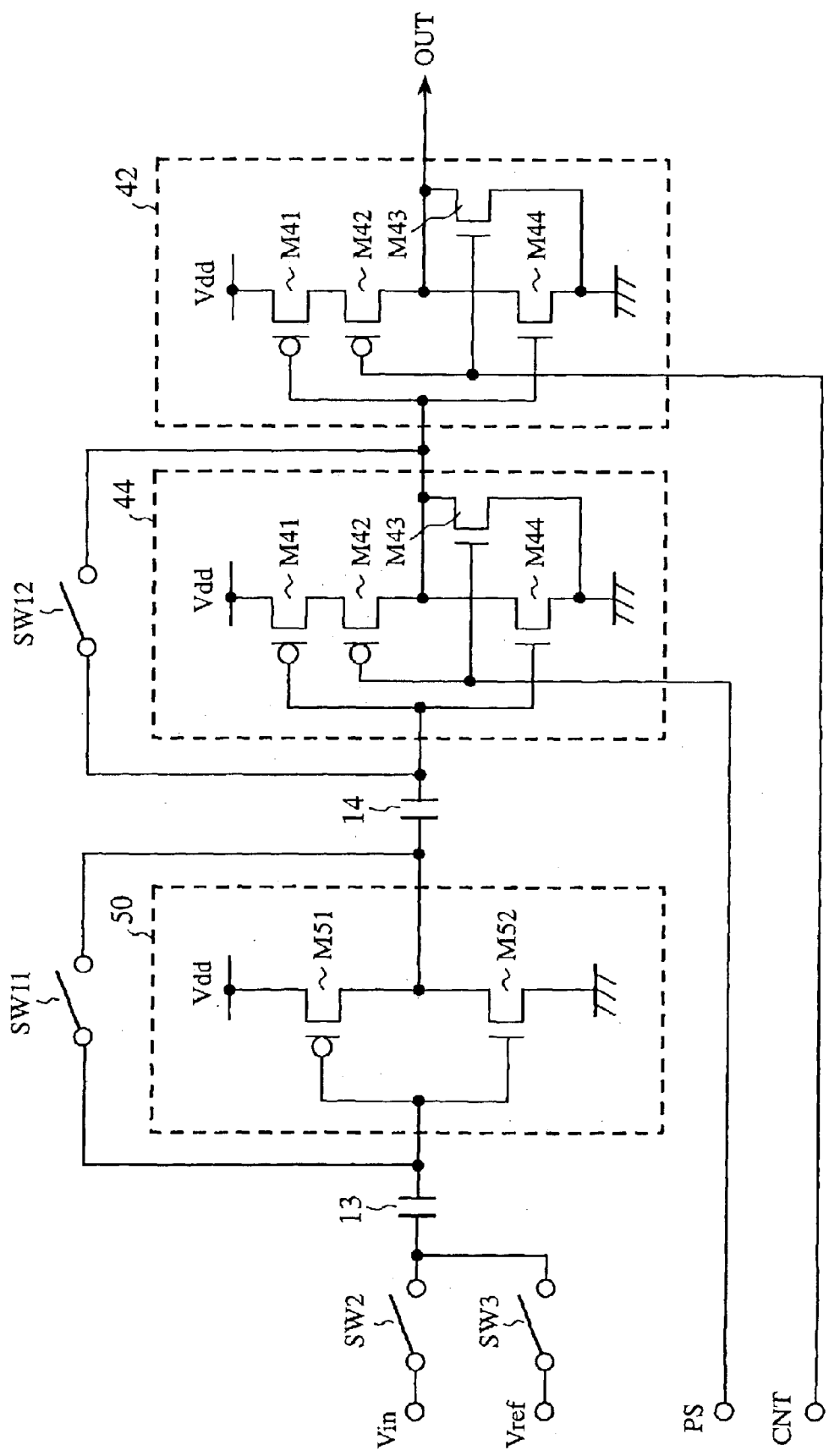
FIG. 36 is a diagram showing another circuit configuration of the chopper comparator according to the eighth embodiment of the present invention.

In addition, the input section of the NOR gate 42 shown in FIG. 36 is connected to the inverter 50 in the front input stage instead of the NOR gate 43 in the front input stage in the case shown in FIG. 18. The CNT signal is supplied to both the gate of the PMOS transistor M42 and the gate of the NMOS transistor M43 in the NOR gate 42 in the output stage, instead of the PS signal in the case shown in FIG. 18.

Figure 34:
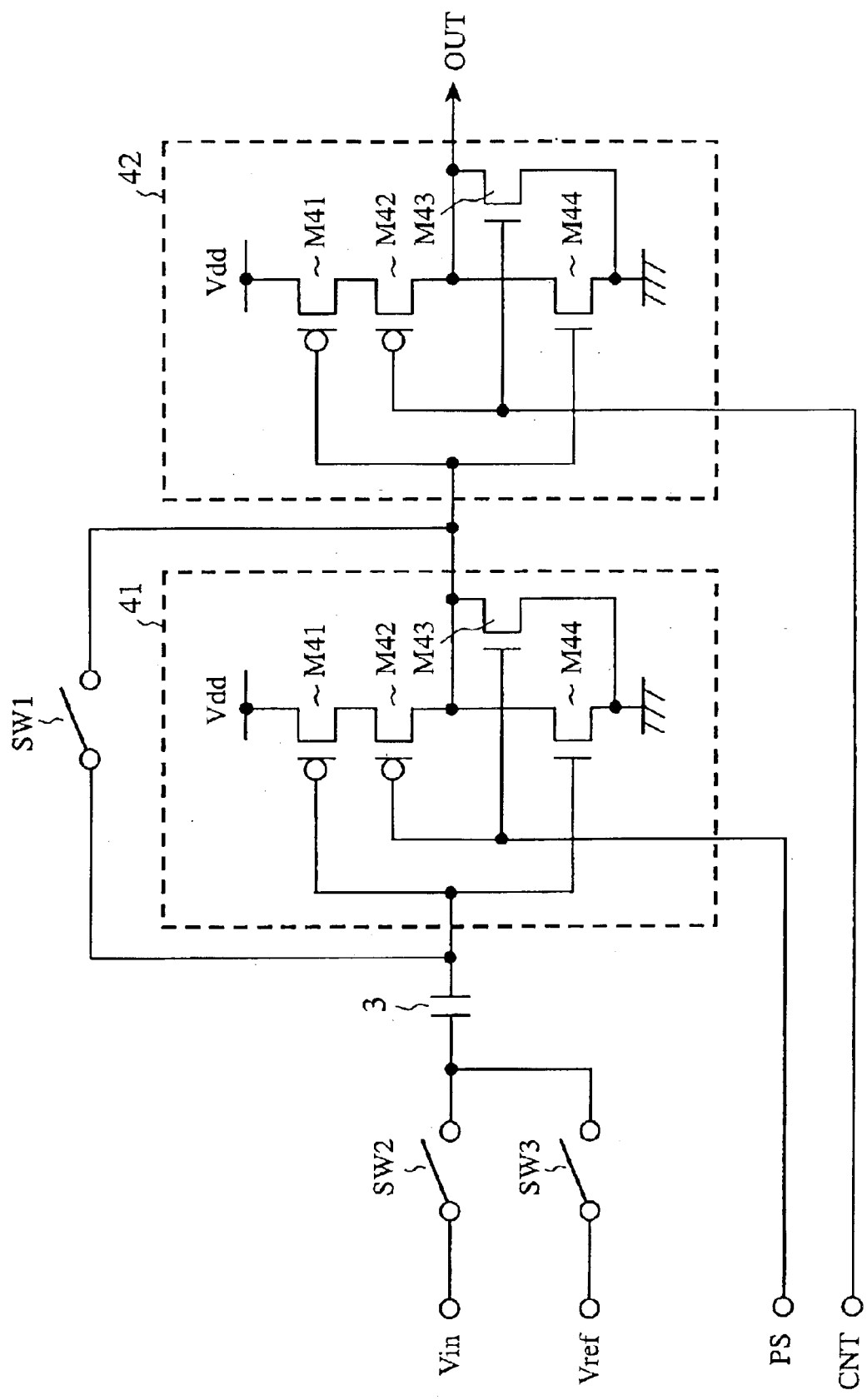
FIG. 34 is a diagram showing another circuit configuration of the chopper comparator according to the eighth embodiment of the present invention.

Further, the NOR gates 41 and 42 in the input and output stages shown in FIG. 33 and FIG. 34 have the same size and layout so that the threshold voltages of those NOR gates 41 and 42 set to the same value. Moreover, the NOR gate 44 in the rear input stage and the NOR gate 42 in the output stage have the same size and layout so that the threshold voltages of those NOR gates 44 and 42 are set to the same value.

Next, a description will now be given of the operation of the chopper comparator of the eighth embodiment.

The chopper comparators shown in FIG. 33 and FIG. 34 can perform the same operation of the chopper comparators shown in FIG. 24 and FIG. 25. The chopper comparators shown in FIG. 35 and FIG. 36 can perform the same operation of the chopper comparators shown in FIG. 26 and FIG. 27. That is, the chopper comparators shown in FIG. 33 to FIG. 36 can perform the same operation of the chopper comparators of the sixth embodiment, where the ON/OFF operation of the switches SW1, SW11, SW12, SW2, and SW3 are controlled in the auto-zero period and comparison period in the operation period shown in the timing chart shown in FIG. 28. Here, the explanation for the same operation of the chopper comparators, having the configurations shown in FIG. 24 to FIG. 27 is omitted. The explanation for only the feature of the chopper comparators shown in FIG. 33 to FIG. 36 will now be explained.

The chopper comparators shown in FIG. 33 to FIG. 36 receive the PS signal and the CNT signal shown in FIG. 28, and the NOR gate 42 in the output stage enters OFF during the auto-zero period and ON during the comparison period based on this CNT signal. The NOR gate 42 in the output stage enters OFF when the switch SW2 enters ON in order to prevent any penetrate current flowing through the NOR gate 42.

In the chopper comparator shown in FIG. 33, during the operation period where the PS signal of the low level is supplied to the gates of the PMOS transistor M41 and the NMOS transistor M43 in the NOR gate 41 in the input stage, the switch SW2 enters ON and the input voltage Vin is thereby supplied to the capacitance 3. Further, when the auto-zero period is initiated by entering the switch SW1 ON so that the inverter circuit in the NOR gate 41 enters the auto-zero state, the CNT signal of the high level is supplied to the gates of the PMOS transistor M41 and the NMOS transistor M43 in the NOR gate 42, and no short circuit of the source and drain in the PMOS transistor M41 occurs, and the path between the source and drain in the NMOS transistor M43 is electrically connected.

That is, the power source voltage Vdd is not supplied to the PMOS transistor M42 and a short circuit of the source and drain in the NMOS transistor M44 occurs. The inverter circuit in the NOR gate 42 becomes OFF under the condition where the output section of the NOR gate 42 is grounded.

When the auto-zero period is completed by entering the switch SW1 OFF, the switch SW2 also enters OFF, and the CNT signal of the low level is supplied to the gates of the PMOS transistor M41 and the NMSO transistor M43 in the NOR gate 42. Thereby, the PMOS transistor M41 enters ON, so that the power source voltage Vdd is supplied to the PMOS transistor M42 and no short circuit of the source and drain in the NMOS transistor M44 occurs and the output section of the NOR gate 42 is disconnected from the ground. The inverter circuit in the NOR gate 42 thereby enters ON. Thus, after the inverter circuit in the NOR gate 42 enters ON, the switch SW3 enters ON. The comparison period is initiated by this.

In the chopper comparator shown in FIG. 34, during the operation period where the PS signal of the low level is supplied to the gates of the PMOS transistor M42 and the NMOS transistor M43 in the inverter 41 in the input stage, the switch SW2 enters ON and the input voltage Vin is thereby supplied to the capacitance 3. Further, when the auto-zero period is initiated by entering the switch SW1 ON so that the inverter circuit in the NOR gate 41 enters the auto-zero state, the CNT signal of the high level is supplied to the gates of the PMOS transistor M42 and the NMOS transistor M43 in the NOR gate 42, and the path between the source and drain in the PMOS transistor M42 is electrically disconnected, and the NMOS transistor M43 enters ON where the path between the source and drain thereof is electrically connected. That is, the output section of the NOR gate 42 is disconnected from the PMOS transistor M41 and a short circuit of the source and drain in the NMOS transistor M44 occurs. The inverter circuit in the NOR gate 42 becomes OFF under the condition where the output section of the NOR gate 42 is grounded.

When the auto-zero period is completed by entering the switch SW1 OFF, the switch SW2 also enters OFF, and the CNT signal of the low level is supplied to the gates of the PMOS transistor M42 and the NMOS transistor M43 in the NOR gate 42. Thereby, the PMOS transistor M42 enters OFF, so that the PMOS transistor M41 is connected to the output section of the NOR gate 42. In addition, the NMOS transistor M43 enters OFF, and thereby no short circuit of the source and drain in the PMOS transistor M44 occurs and the output section of the NOR gate 42 is disconnected from the ground. The inverter circuit in the NOR gate 42 thereby enters ON. Thus, the switch SW3 enters ON under the condition where the inverter circuit in the NOR gate 42 enters ON. The comparison period is initiated by this.

In the chopper comparator shown in FIG. 35, during the operation period where the PS signal of the low level is supplied to the gates of the PMOS transistor M41 and the NMOS transistor M43 in the NOR gate 44 in the rear input stage, the switch SW2 enters ON and the input voltage Vin is thereby supplied to the capacitance 13. Further, when the auto-zero period is started by entering the switches SW11 and SW12 ON so that the inverter 50 and the inverter circuit in the NOR gate 44 in the rear input stage enter the auto-zero state, the CNT signal of the high level is supplied to the gates of the PMOS transistor M41 and the NMOS transistor M43 in the NOR gate 42 in the output stage, and the PMOS transistor M41 enters OFF where the path between the source and the drain thereof is electrically disconnected, and the path between the source and drain in the NMOS transistor M43 is electrically connected. That is, the power source voltage Vdd is not supplied to the PMOS transistor M41 in the NOR gate 42 and a short circuit of the source and drain in the NMOS transistor M44 occurs. The inverter circuit in the NOR gate 42 becomes OFF under the condition where the output section of the NOR gate 42 is grounded.

When the auto-zero period is completed by entering the switches SW11 and SW12 OFF, the switch SW2 also enters OFF, and the CNT signal of the low level is supplied to the gates of the PMOS transistor M41 and the NMOS transistor M43 in the NOR gate 42. Thereby, the PMOS transistor M41 enters ON, so that the power source voltage Vdd is supplied to the PMOS transistor M42 and the NMOS transistor M43 enters OFF, and no short circuit between the source and drain of the NMOS transistor M44 occurs and the output section of the NOR gate 42 is disconnected from the ground. The inverter circuit in the NOR gate 42 thereby enters ON. Thus, after the inverter circuit in the NOR gate 42 enters ON, the switch SW3 enters ON. The comparison period is initiated by this.

In the chopper comparator shown in FIG. 36, during the operation period where the PS signal of the low level is supplied to the gates of the PMOS transistor M42 in the NOR gate 44 and the NMOS transistor M43 in the rear input stage, the switch SW2 enters ON and the input voltage Vin is thereby supplied to the capacitance 13. Further, when the auto-zero period is started by entering the switches SW11 and SW12 ON so that the inverter 50 in the front input stage and the inverter circuit in the NOR gate 44 in the rear input stage enter the auto-zero state, the CNT signal of the high level is supplied to the gates of the PMOS transistor M42 and the NMOS transistor M43 in the NOR gate 42, and the path between the source and drain of the PMOS transistor M42 is electrically disconnected and the path between the source and drain of the NMOS transistor M43 is electrically connected. That is, the output section of the NOR gate 42 is disconnected from the PMOS transistor M41 and a short circuit of the source and drain in the NMOS transistor M44 occurs. The inverter circuit in the NOR gate 42 becomes OFF under the condition where the output section of the NOR gate 42 is grounded.

When the auto-zero period is completed by entering the switches SW11 and SW12 OFF, the switch SW2 also enters OFF, and the CNT signal of the low level is supplied to the gates of the PMOS transistor M42 and the NMSO transistor M43 in the NOR gate 42. Thereby, the PMOS transistor M42 enters ON, so that the PMOS transistor M41 is electrically connected to the output section of the NOR gate 42 and the NMOS transistor M43 enters OFF, and the no short circuit of the source and drain in the NMOS transistor M43 occurs and the output section of the NOR gate 42 is disconnected from the ground. The inverter circuit in the NOR gate 42 thereby enters ON. Thus, after the inverter circuit in the NOR gate 42 enters ON, the switch SW3 enters ON. The comparison period is initiated by this.

In particular, when the chopper comparators shown in FIG. 33 and FIG. 35 are formed with an optimum circuit configuration, it is possible to reduce the delay time of the input/output operation in each of the inverters 41 and 42, 44 and 42 and to apply those chopper comparators to a high response application.

According to the eighth embodiment, when it is so formed where the inverter circuit in the NOR gate in the input stage and the inverter circuit in the NOR gate in the output stage have the same threshold voltage, the inverter circuit in the output stage enters OFF under the auto-zero state using the CNT signal, it is thereby possible to prevent any penetrate current flowing through the inverter circuit in the NOR gate in the output stage even if the voltage which is equal to the threshold voltage to the input section of the inverter circuit in the NOR gate in the output stage. The eighth embodiment has the effect that this can suppress the current consumption in the chopper comparator.

Still further, when the NOR gate 41 in the input stage and the NOR gate 42 in the output stage shown in FIG. 33 and FIG. 34, and the NOR gate 44 in the rear input stage and the NOR gate 42 in the output stage shown in FIG. 35 and FIG. 36 are formed with a same size and layout in order to obtain a same threshold voltage, it is possible to prevent any penetrate current flowing through the inverter circuit in the NOR gate 42 directly connected to the NOR gate 41 and through the inverter circuit in the NOR gate 42 directly connected to the NOR gate 44 under the control of the PS signal during the non-operation period. The eighth embodiment has the effect that it is therefore possible to increase the comparison accuracy between the input voltage Vin supplied to the chopper comparator and the reference voltage Vref and to suppress the current consumption of the chopper comparator under the condition.

Furthermore, because the NOR gate, in which the PMOS transistor M41 is connected in series to the PMOS transistor M42, is used as the logic gate, it is possible to form that the supply of the power source voltage Vdd to the PMOS transistor M42 is controlled by the PMOS transistor M41 shown in FIG. 33 to FIG. 36, where this PMOS transistor M42 forms the inverter circuit. It is thereby possible to set the threshold voltage of the inverter circuit formed in each NOR gate to a lower value. For example, it is possible to control ON/OFF operation of the switches SW1, SW11, and SW12 made up of a NMOS transistor and a PMOS transistor or only a NMOS transistor within a small voltage range. This can reduce the size and layout of the switches SW1, SW11, and SW12.

As set forth, according to the present invention, it is possible to have the effect to reduce the current consumption by preventing the generation of any penetrate current during the non-operation period by entering the inverter circuit OFF.

Furthermore, according to the present invention, it is possible to have the effect to reduce the current consumption by preventing the generation of any penetrate current by entering the inverter circuit OFF when a short circuit between the input and output section of the logic gate in the input stage occurs during the operation period and the non-operation period.

While the above provides a full and complete disclosure of the preferred embodiments of the present invention, various modifications, alternate constructions and equivalents may be employed without departing from the scope of the invention. Therefore the above description and illustration should not be construed as limiting the scope of the invention, which is defined by the appended claims.

What is claimed is:

1. A chopper comparator having at least one logic gate in an input stage and a logic gate in an output stage, each logic gate in the input and output stages comprising:
   an inverter circuit; and
   a transistor for controlling connection and disconnection of the inverter circuit, wherein
      an operation signal is supplied to the transistors to control operation of the logic gates in the input and output stages,
      the inverter circuit becomes inactive when no operation of the chopper comparator is being performed, based on the operational signal,
      one of the logic gates comprises a NAND gate including a pair of P channel MOS transistors is connected in parallel and a pair of N channel MOS transistors connected in series,
      a first of the P channel MOS transistors and a first of the N channel MOS transistors of the NAND gate comprise the inverter circuit of the logic gate comprising a NAND gate, and
      the operation signal is supplied to a second of the N channel MOS transistors to control the connection and disconnection of the inverter circuit.

2. The chopper comparator as claimed in claim 1, wherein the operation signal is supplied to each gate of the second of the P and N channel MOS transistors in the NAND gate, and
   a power source voltage is supplied through the second P channel MOS transistor to an output of the NAND gate.

3. A chopper comparator having at least one logic gate in an input stage and a logic gate in an output stage, each logic gate in the input and output stages comprising:
   an inverter circuit; and
   a transistor for controlling connection and disconnection of the inverter circuit, wherein
      an operation signal is supplied to the transistors to control operation of the logic gates in the input and output stages,
      the inverter circuit becomes inactive when no operation of the chopper comparator is being performed, based on the operation signal,
      one of the logic gates comprises a NOR gate including a pair of P channel MOS transistors connected in series and a pair of N channel MOS transistors connected in parallel,
      a first of the P channel MOS transistors and a first of the N channel MOS transistors of the NOR gate comprise the inverter circuit of the logic gate comprising a NOR gate, and
      the operation signal is supplied to a second of the P channel MOS transistors to control the connection and disconnection of the inverter circuit.

4. The chopper comparator as claimed in claim 3, wherein the operation signal is supplied to each gate of the second P and N channel MOS transistors in the NOR gate, and
   the second of N channel MOS transistor connects an output section of the NOR gate to a ground when the P channel MOS transistor disconnects the inverter circuit, based on the operation signal.

5. A chopper comparator comprising at least one logic gate in an input stage including a switch closing and opening a short circuit of an input and an output of the input stage, and a logic gate in an output stage, the logic gates in each of the input and output stages comprising:
   an inverter circuit; and
   a transistor for controlling connection and disconnection of the inverter circuit, wherein
      an operation signal is supplied to the transistor in the input stage, and a control signal is supplied to the transistor in the output stage, the inverter circuit in the input stage becomes inactive, based on the control signal, during a non-operation period of the chopper comparator, and when the switch is closed to short circuit the input and output of the input stage, the inverter circuit in the logic gate in the output stage becomes inactive, based on the control signal.

6. The chopper comparator as claimed in claim 5, wherein the inverter of one of the logic gates comprises a P channel MOS transistor and a N channel MOS transistor connected in series, and the transistor for controlling the connection and disconnection of the inverter is connected in series with one of the P and N channel MOS transistors of the inverter circuit.

7. The chopper comparator as claimed in claim 5, wherein one of the logic gates comprises a NAND gate including a pair of P channel MOS transistors connected in parallel and a pair of N channel MOS transistors connected in series, and a first of the P channel MOS transistors and a first of the N channel MOS transistors of the NAND gate comprise the inverter circuit of the logic gate comprising a NAND gate, wherein the operation signal is supplied to a second of the N channel MOS transistors to control the connection and disconnection of the inverter circuit in the NAND gate in the input stage, and the control signal is supplied to a second of the P channel MOS transistors to control the connection and disconnection of the inverter circuit in the NAND gate in the output stage.

8. The chopper comparator as claimed in claim 7, wherein the operation signal is supplied to each gate of the second P and N channel MOS transistors in the NAND gates in the input stage, a power source voltage is supplied to an output of the NAND gates in the input stage through the second P channel MOS transistor when the second N channel MOS transistor disconnects the inverter circuit in the NAND gate, based on the operation signal, and the control signal is supplied to each gate of the second P and N channel MOS transistors in the NAND gate in the output stage, the power source voltage is supplied to an output of the NAND gate in the output stage through the second P channel MOS transistor when the second N channel MOS transistor disconnects the inverter circuit in the NAND gate in the output stage, based on the control signal.

9. The chopper comparator as claimed in claim 5, wherein one of the logic gates comprises a NOR gate including a pair of P channel MOS transistors connected in series and a pair of N channel MOS transistors connected in parallel, and a first of the P channel MOS transistors and a first of the N channel MOS transistors of the NOR gate comprise the inverter circuit of the logic gate comprising a NOR gate, wherein the operation signal is supplied to the second of the P channel MOS transistors in the logic gate in the input stage to control connection and disconnection of the inverter circuit in the NOR gate in the input stage, and the control signal is supplied to the second P and N channel MOS transistors in the NOR gate in the output stage to control the connection and disconnection of the inverter circuit in the NOR gate in the output stage.

10. The chopper comparator as claimed in claim 9, wherein the inverter circuit in each NOR gate in the input and output stages is connected and disconnected by the second P channel MOS transistor of the NOR gates and the output of NOR gate is grounded by the second N channel MOS transistor of the NOR gate, the operation signal is supplied to each gate of the second P and N channel MOS transistors in the NOR gates in the input stage, and the second N channel MOS transistor connects an output of the NOR gate in the input stage to a ground when second P channel MOS transistor disconnects the inverter circuit in the NOR gate in the input stage, based on the operation signal, and the control signal is supplied to each gate of the second P and N channel MOS transistors in the NOR gates in the output stage, and the second N channel MOS transistor connects an output of the NOR gate in the output stage to the ground when the second P channel MOS transistor disconnects the inverter circuit in the NOR gate in the output stage, based on the control signal.

* * * * *